US012638508B2

(12) United States Patent
Kitagawa et al.

(10) Patent No.: US 12,638,508 B2
(45) **Date of Patent: *May 26, 2026**

(54) BATTERY MEASUREMENT APPARATUS

(71) Applicant: DENSO CORPORATION, Kariya-city (JP)

(72) Inventors: Masaaki Kitagawa, Kariya-city (JP); Kazuo Matsukawa, Kariya-city (JP); Yuji Yamagami, Kariya-city (JP); Masaki Uchiyama, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 634 days.

This patent is subject to a terminal disclaimer.

(21) Appl. No.: 17/869,193

(22) Filed: Jul. 20, 2022

(65) Prior Publication Data

US 2022/0373602 A1 Nov. 24, 2022

Related U.S. Application Data

(63) Continuation-in-part of application No. PCT/JP2021/002069, filed on Jan. 21, 2021.

(30) Foreign Application Priority Data

Jan. 24, 2020 (JP) ................................. 2020-010159
Dec. 25, 2020 (JP) ................................. 2020-217139

(51) Int. Cl.
| | |
|---|---|
| *G01R 31/36* | (2020.01) |
| *G01R 31/389* | (2019.01) |
| *H01M 10/42* | (2006.01) |
| *H01M 10/48* | (2006.01) |
| *H01M 50/103* | (2021.01) |
| *H01M 50/107* | (2021.01) |
| *H01M 50/317* | (2021.01) |

(Continued)

(52) U.S. Cl.
CPC ....... *G01R 31/3648* (2013.01); *G01R 31/389* (2019.01); *H01M 10/425* (2013.01);

(Continued)

(58) Field of Classification Search
CPC ................................................. G01R 31/3648
See application file for complete search history.

(56) References Cited

U.S. PATENT DOCUMENTS

2010/0185405 A1 7/2010 Aoshima et al.
2012/0004851 A1 1/2012 Potyrailo et al.
(Continued)

FOREIGN PATENT DOCUMENTS

| CN | 105467821 A | 4/2016 |
|---|---|---|
| JP | H05-172875 A | 7/1993 |

(Continued)

OTHER PUBLICATIONS

Du, Xiuping. "Improved accuracy of low-level voltage measurement", Foreign Electronic Measurement Technology, Issue 1, pp. 23-26, 1999.

*Primary Examiner* — Hyun D Park
(74) *Attorney, Agent, or Firm* — Oliff PLC

(57) ABSTRACT

In a battery measurement apparatus, a signal control unit, provided on a first electrical path connecting electrodes of a storage battery, causes the storage battery to output a predetermined alternating-current signal or inputs a predetermined alternating-current signal to the storage battery. A response signal input unit, provided on a second electrical path connecting the electrodes, inputs a response signal of the storage battery in response to the alternating-current signal through the second electrical path. Based on the response signal, a calculating unit calculates information related to a complex impedance of the storage battery. A magnetic flux passage area, surrounded by the storage battery and the second electrical path, is formed. A size of the magnetic flux passage area is set such that an error between an actual complex impedance of the storage battery and a complex impedance calculated by the calculating unit is within a range of ±1 mΩ.

16 Claims, 34 Drawing Sheets

(51) Int. Cl.

| | |
|---|---|
| *H01M 50/548* | (2021.01) |
| *H01M 50/55* | (2021.01) |
| *H01M 50/557* | (2021.01) |
| *H01M 50/559* | (2021.01) |
| *H01M 50/569* | (2021.01) |

(52) U.S. Cl.
CPC ......... *H01M 10/48* (2013.01); *H01M 50/103* (2021.01); *H01M 50/107* (2021.01); *H01M 50/317* (2021.01); *H01M 50/548* (2021.01); *H01M 50/55* (2021.01); *H01M 50/557* (2021.01); *H01M 50/559* (2021.01); *H01M 50/569* (2021.01); *H01M 2010/4271* (2013.01); *H01M 2200/20* (2013.01)

(56) References Cited

U.S. PATENT DOCUMENTS

2013/0154652 A1 * 6/2013 Rice ...................... H01M 10/48
324/426

| | | | |
|---|---|---|---|
| 2014/0266183 A1 | 9/2014 | Nishida et al. | |
| 2014/0292345 A1 | 10/2014 | Matumoto et al. | |
| 2016/0195577 A1 | 7/2016 | Osaka et al. | |
| 2016/0322156 A1 | 11/2016 | Yeh et al. | |
| 2016/0322849 A1 | 11/2016 | Yeh et al. | |
| 2016/0322850 A1 | 11/2016 | Yeh et al. | |
| 2016/0322851 A1 | 11/2016 | Yeh et al. | |
| 2016/0322852 A1 | 11/2016 | Yeh et al. | |
| 2018/0196107 A1 | 7/2018 | Fleischer et al. | |
| 2020/0153264 A1 | 5/2020 | Osada et al. | |
| 2021/0155113 A1 | 5/2021 | Shiraishi | |

FOREIGN PATENT DOCUMENTS

| | | | |
|---|---|---|---|
| JP | 2006-322857 A | 11/2006 | |
| JP | 2010-002199 A | 1/2010 | |
| JP | 2012-074198 A | 4/2012 | |
| JP | 2014-157778 A | 8/2014 | |
| JP | 2017-220293 A | 12/2017 | |
| JP | 2018-041581 A | 3/2018 | |
| JP | 2018-190502 A | 11/2018 | |

* cited by examiner

FIG.3

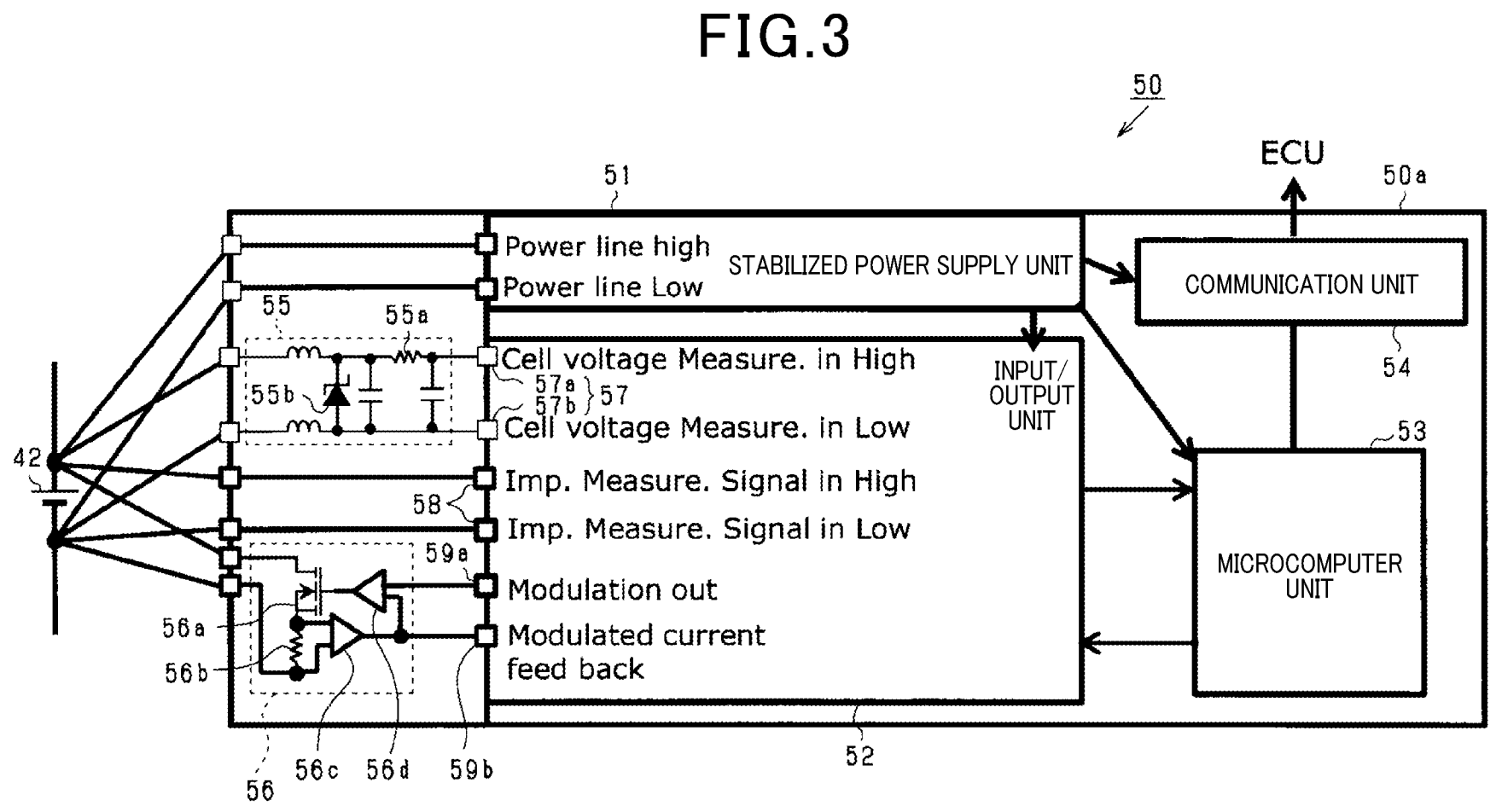

ECU

50

ECU

50a

COMMUNICATION UNIT

54

MICROCOMPUTER UNIT

53

STABILIZED POWER SUPPLY UNIT

INPUT/OUTPUT UNIT

52

51

Power line high

Power line Low

Cell voltage Measure. in High 57a
57b } 57

Cell voltage Measure. in Low

Imp. Measure. Signal in High

Imp. Measure. Signal in Low

Modulation out

Modulated current feed back

55a

55

55b

58

59a

59b

56a

56b 56c  56d

56

42

IMPEDANCE CALCULATION PROCESS

S101

SET MEASUREMENT FREQUENCY

S102

MAKE BATTERY CELL OUTPUT SINE-WAVE SIGNAL

S103

INPUT RESPONSE SIGNAL

S104

ACQUIRE CURRENT SIGNAL

S105

CALCULATE IMPEDANCE

S106

OUTPUT CALCULATION RESULT

END

CURRENT ELEMENT

CURRENT SOURCE
(BATTERY CELL 42)

RELATIVE POSITION x

INTEGRAL PATH L
(SECOND ELECTRICAL PATH 82)

50 a

ASIC UNIT

ARBITRARY
POINT ON S

82

CURRENT PATH
(FIRST ELECTRICAL PATH 81)

CLOSED SURFACE
(MAGNETIC FLUX PASSAGE AREA S10)

FIG.11

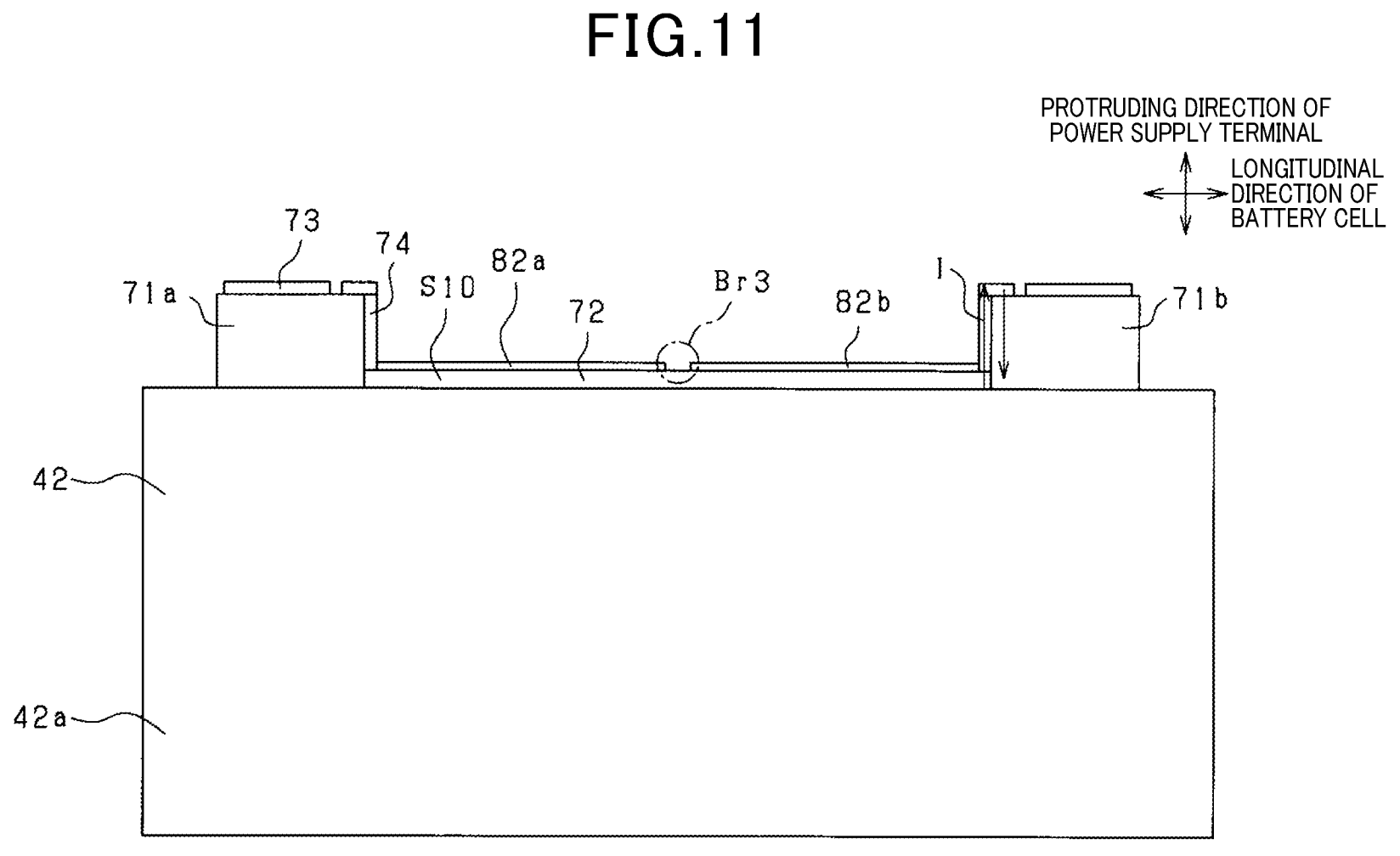

PROTRUDING DIRECTION OF
POWER SUPPLY TERMINAL

LONGITUDINAL
DIRECTION OF
BATTERY CELL

PROTRUDING DIRECTION OF
POWER SUPPLY TERMINAL

LONGITUDINAL
DIRECTION OF
BATTERY CELL

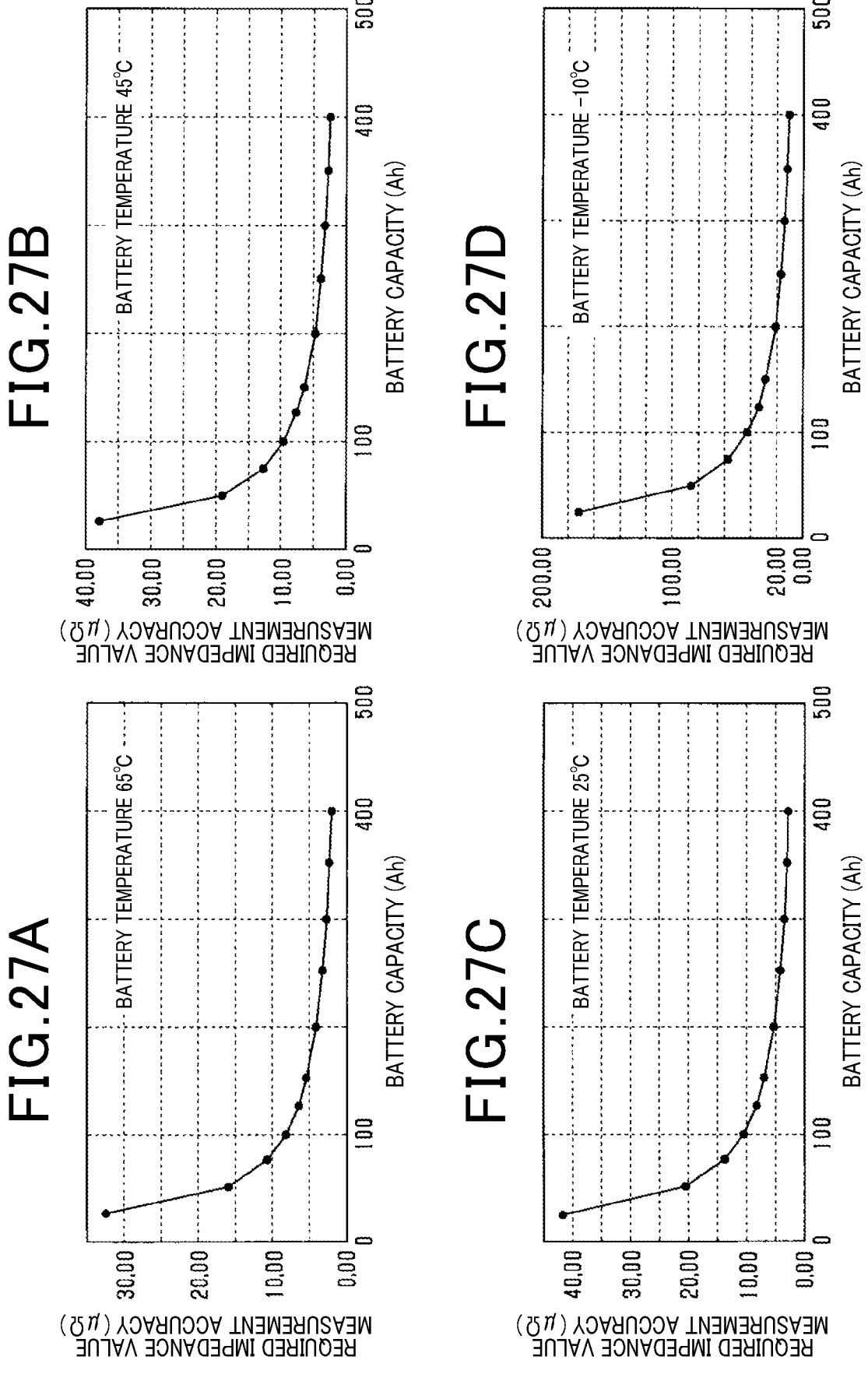

FIG.34A
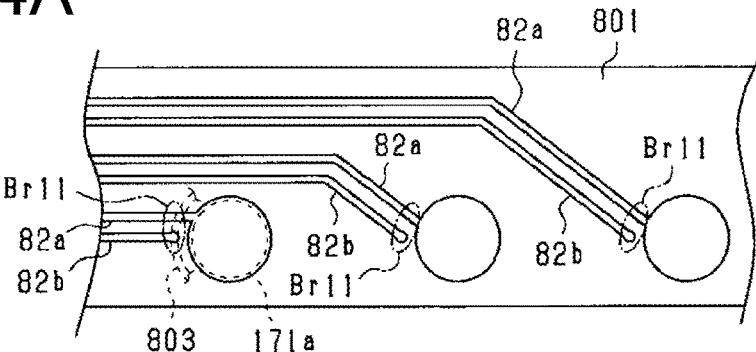
FIG.34B
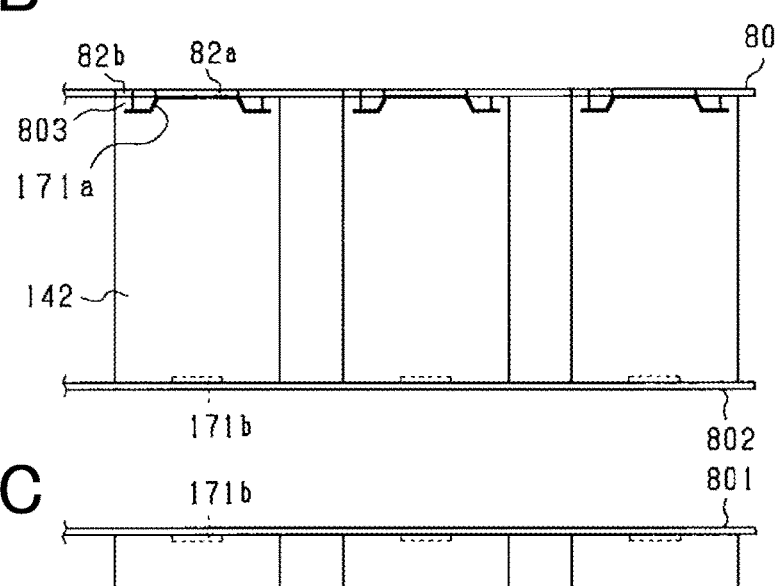
FIG.34C
FIG.34D
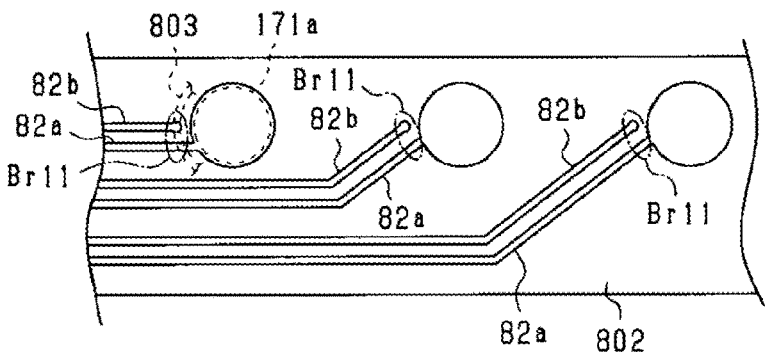

BATTERY MEASUREMENT APPARATUS

CROSS-REFERENCE TO RELATED APPLICATION

The present application is a continuation application of International Application No. PCT/JP2021/002069, filed on Jan. 21, 2021, which claims priority to Japanese Patent Application No. 2020-010159, filed on Jan. 24, 2020, and Japanese Patent Application No. 2020-217139, filed on Dec. 25, 2020. The contents of these applications are incorporated herein by reference in their entirety.

BACKGROUND

Technical Field

The present disclosure relates to a battery measurement apparatus.

Related Art

Measurement of a complex impedance of a storage battery has been performed to measure a state of the storage battery. For example, a rectangular-wave signal is applied to a storage battery by a power controller, and a complex impedance characteristic is calculated based on a response signal thereof. Then, a degradation state or the like of the storage battery is determined based on the complex impedance characteristic.

SUMMARY

One aspect of the present disclosure provides a battery measurement apparatus that measures a state of a storage battery that includes an electrolyte, a plurality of electrodes, and a housing case that houses the electrolyte and the plurality of electrodes. The battery measurement apparatus includes a signal control unit, a response signal input unit, and a calculating unit. The signal control unit is provided on a first electrical path that connects a positive electrode and a negative electrode of the storage battery, and causes the storage battery to output a predetermined alternating-current signal or inputs a predetermined alternating-current signal to the storage battery. The response signal input unit is provided on a second electrical path that connects the positive electrode and the negative electrode, and inputs a response signal of the storage battery in response to the alternating-current signal through the second electrical path. The calculating unit calculates information related to a complex impedance of the storage battery based on the response signal. A magnetic flux passage area that is an area surrounded by the storage battery and the second electrical path and through which a magnetic flux that is based on the alternating-current signal that flows to the first electrical path passes is formed. A size of the magnetic flux passage area is set such that an error between an actual complex impedance of the storage battery and a complex impedance that is calculated by the calculating unit is within a range of ±1 mΩ.

BRIEF DESCRIPTION OF THE DRAWINGS

In the accompanying drawings:

FIG. 3 is a configuration diagram illustrating a battery measurement apparatus;

FIG. 11 is a side view schematically illustrating a connection mode of the battery measurement apparatus according to the fourth embodiment;

FIG. 13 is a side view of a battery measurement apparatus according to a sixth embodiment;

FIG. 25 is a configuration diagram illustrating the battery measurement apparatus in another example;

FIG. 27A to FIG. 27D are explanatory diagrams illustrating a relationship between impedance measurement accuracy and battery capacity;

FIG. 34A is a plan view of a portion of the circuit board in the third modification, FIG. 34B is a side view of the battery cells in a first row and circuit boards, FIG. 34C is a side view of the battery cells in a second tow and the circuit boards, and FIG. 34D is a plan view of a portion of the circuit board in the third modification;

DESCRIPTION OF THE EMBODIMENTS

Figure 1:
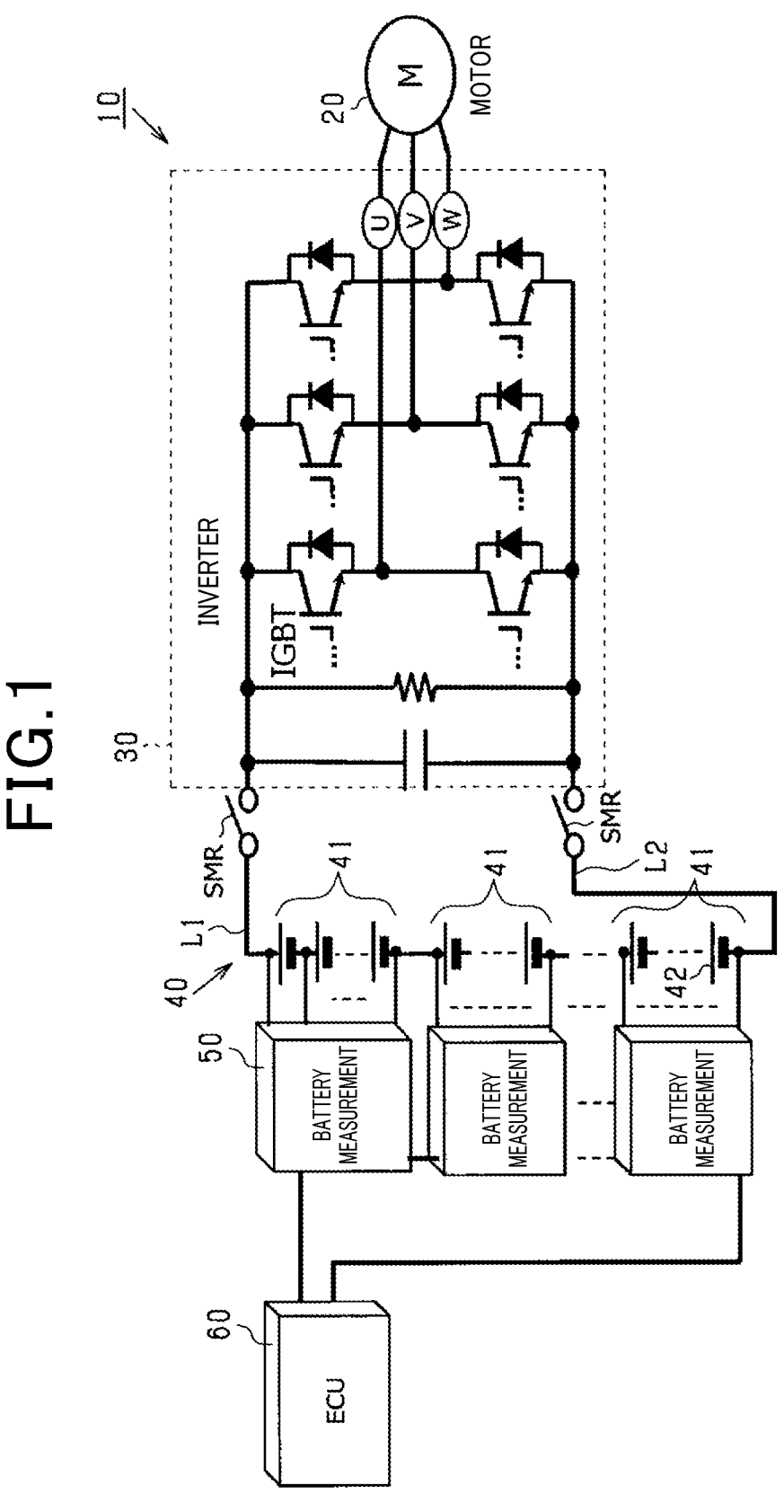
FIG. 1 is an overall configuration diagram illustrating a power supply system.

Since the past, measurement of a complex impedance of a storage battery has been performed to measure a state of the storage battery (for example, Japanese Patent Publication No. 6226261). In a disclosure described in Japanese Patent Publication No. 6226261, a rectangular-wave signal is applied to a storage battery by a power controller, and a complex impedance characteristic is calculated based on a response signal thereof. Then, a degradation state or the like of the storage battery is determined based on the complex impedance characteristic.

In addition, in JP-A-2018-190502, a sine-wave current is sent to a storage battery from an oscillator, and a response signal (voltage variation) thereof is detected by a lock-in amplifier. The complex impedance characteristic is calculated based on a detection result thereof. In addition, a degradation state or the like of the storage battery is determined based on the complex impedance characteristic.

Here, storage batteries that are used in electric automobiles and the like tend to have increasingly larger capacities. In a case of a large-capacity storage battery, the impedance decreases and the response signal tends to become a weak signal. In addition, when the response signal is a weak signal, a problem arises in that external influence is easily received. For example, when an alternating-current signal such as a rectangular-wave signal is sent to the storage battery, as a result of changes in a magnetic flux caused by the alternating-current signal, induced electromotive force may be generated in an electrical path to and from which the response signal is inputted and outputted. The response signal is a very weak signal. Therefore, the response signal is also affected by the induced electromotive force and a problem arises in that a measurement error occurs.

It is thus desired to provide a battery measurement apparatus that is capable of improving measurement accuracy regarding a response signal.

A first exemplary embodiment provides a battery measurement apparatus that measures a state of a storage battery that includes an electrolyte, a plurality of electrodes, and a housing case that houses the electrolyte and the plurality of electrodes. The battery measurement apparatus includes: a signal control unit that is provided on a first electrical path that connects a positive electrode and a negative electrode of the storage battery, and causes the storage battery to output a predetermined alternating-current signal or inputs a predetermined alternating-current signal to the storage battery; a response signal input unit that is provided on a second electrical path that connects the positive electrode and the negative electrode, and inputs a response signal of the storage battery in response to the alternating-current signal through the second electrical path; and a calculating unit that calculates information related to a complex impedance of the storage battery based on the response signal. A magnetic flux passage area that is an area surrounded by the storage battery and the second electrical path and through which a magnetic flux that is based on the alternating-current signal that flows to the first electrical path passes is formed. A size of the magnetic flux passage area is set such that an error between an actual complex impedance of the storage battery and a complex impedance that is calculated by the calculating unit is within a range of ±1 mΩ.

The magnetic flux passage area that is surrounded by the storage battery and the second electrical path is set such that the error between the actual complex impedance of the storage battery and the complex impedance that is calculated by the calculating unit is within a range of ±1 mΩ. Consequently, errors in the response signal based on induced electromotive force can be suppressed and errors in the impedance can be suppressed.

A second exemplary embodiment provides a battery measurement apparatus that measures a state of a storage battery that includes an electrolyte, a plurality of electrodes, and a housing case that houses the electrolyte and the plurality of electrodes. The battery measurement apparatus includes: a signal control unit that is provided on a first electrical path that connects a positive-electrode-side power supply terminal and a negative-electrode-side power supply terminal of the storage battery, and causes the storage battery to output a predetermined alternating-current signal or inputs a predetermined alternating-current signal to the storage battery; a response signal input unit that is provided on a second electrical path that connects between the positive-electrode-side power supply terminal and the negative-electrode-side power supply terminal, and inputs a response signal of the storage battery in response to the alternating-current signal through the second electrical path; and a calculating unit that calculates information related to a complex impedance of the storage battery based on the response signal. A magnetic flux passage area that is an area surrounded by the housing case, the second electrical path, the positive-electrode-side power supply terminal, and the negative-electrode-side power supply terminal and through which a magnetic flux that is based on the alternating-current signal that flows to the first electrical path passes is formed. A size of the magnetic flux passage area is set such that induced electromotive force that is generated in the second electrical path based on the alternating-current signal that flows to the first electrical path is within an electromotive-force allowable value range that includes zero.

A magnitude and a polarity of the induced electromotive force that is based on the alternating-current signal can be changed by the magnetic flux passage area that is surrounded by the housing case, the second electrical path, the positive-electrode-side power supply terminal, and the negative-electrode-side power supply terminal. Therefore, as a result of the size of the magnetic flux passage area being appropriately set, the induced electromotive force is set to be within the electromotive-force allowable value range that includes zero. In addition, induced electromotive force that is based on an external signal such as noise attributed to an inverter can also be reduced in a similar manner. Consequently, errors in the response signal based on the induced electromotive force can be suppressed.

The above-described exemplary embodiments of the present disclosure will be further clarified through the detailed description below, with reference to the accompanying drawings.

First Embodiment

A first embodiment in which a battery measurement apparatus is applied to a power supply system of a vehicle (such as a hybrid car or an electric automobile) will hereinafter be described with reference to the drawings.

As shown in FIG. 1, a power supply system 10 includes a motor 20 that serves as a rotating electric machine, an inverter 30 that serves as a power converter that supplies a three-phase current to the motor 20, an assembled battery 40 that is capable of being charged and discharged, a battery measurement apparatus 50 that measures a state of the assembled battery 40, and an electronic control unit (ECU) 60 that controls the motor 20 and the like.

The motor 20 is a main on-board motor and is capable of transmitting power to a drive wheel (not shown). According to the present embodiment, a three-phase permanent-magnet synchronous motor is used as the motor 20.

The inverter 30 is configured by a full-bridge circuit that has same numbers of upper and lower arms as a number of phase windings. An energization current is adjusted in each phase winding by switching on/off of a switch (semiconductor switching element) that is provided in each arm.

The inverter 30 is provided with an inverter control apparatus (not shown). The inverter control apparatus performs energization control by switching on/off of the switches in the inverter 30, based on various types of detection information of the motor 20, and requests for power-running drive and power generation. As a result, the inverter control apparatus supplies electric power to the motor 20 from the assembled battery 40 through the inverter 30 and drives the motor 20 by power-running drive. In addition, the inverter control apparatus causes the motor 20 to generate electric power based on power from the drive wheel. The generated power is converted and supplied to the assembled battery 40 through the inverter 30. The assembled battery 40 is thereby charged.

The assembled battery 40 is electrically connected to the motor 20 with the inverter 30 therebetween. The assembled battery 40 has an inter-terminal voltage that is, for example, equal to or greater than 100 V. The assembled battery 40 is configured by a plurality of battery modules 41 being connected in series. The battery module 41 is configured by a plurality of battery cells 42 being connected in series. For example, as the battery cell 42, a lithium-ion storage battery or a nickel-hydrogen storage battery can be used. Each battery cell 42 is a storage battery that has an electrolyte and a plurality of electrodes.

Figure 2A:
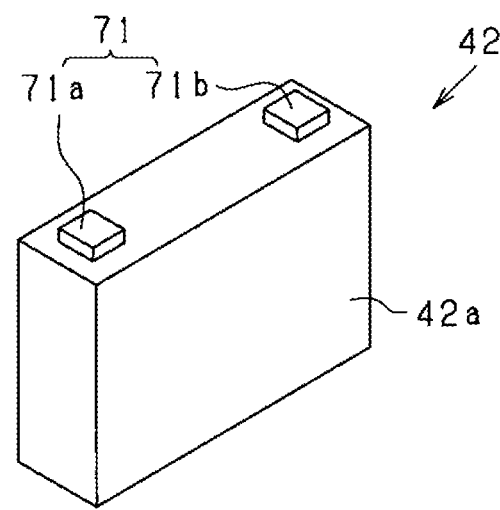
FIG. 2A is a perspective view of a battery cell and FIG. 2B is a plan view of an assembled battery.
Figure 2B:
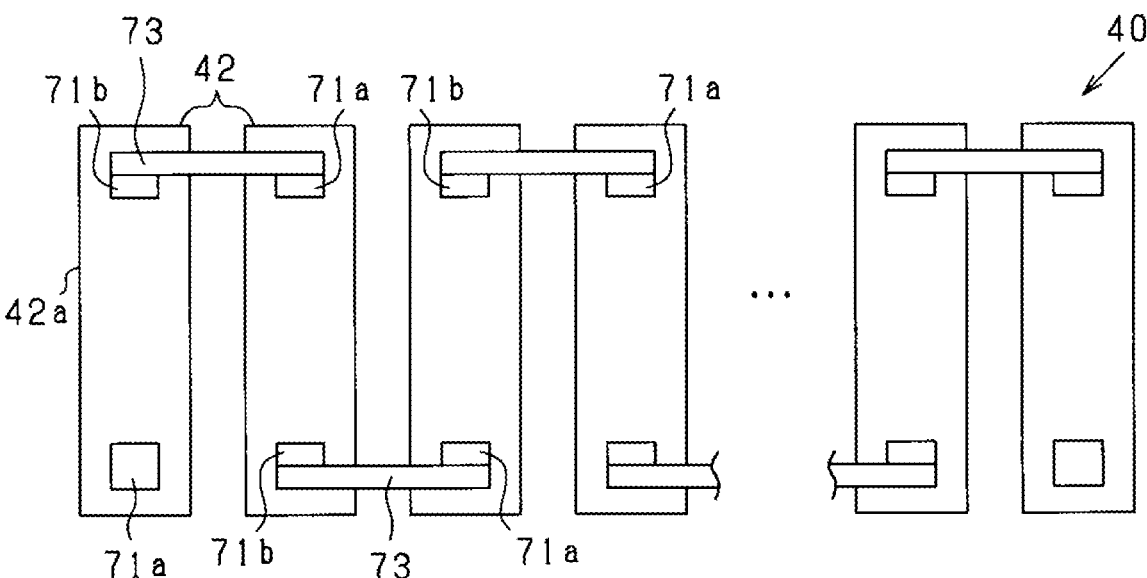

As shown in FIG. 2A, the battery cell 42, and more specifically a housing case 42a thereof, is formed into a flattened, rectangular parallelepiped shape. On an upper surface of the battery cell 42, power supply terminals 71 (a positive-electrode-side power supply terminal 71a and a negative-electrode-side power supply terminal 71b) are provided on both ends in a longitudinal direction. The positive-electrode-side power supply terminal 71a and the negativeelectrode-side power supply terminal 71b protrude to the same extent in the same direction from the housing case 42a. In addition, as shown in FIG. 2B, the housing cases 42a of the battery cells 42 are laminated in a lateral direction such that side surfaces overlap. At this time, adjacent battery cells 42 are arranged such that the positive-electrode-side power supply terminals 71a and the negative-electrode-side power supply terminals 71b alternate.

Furthermore, the positive-electrode-side power supply terminal 71a of the battery cell 42 is connected to the negative-electrode-side power supply terminal 71B of the adjacent battery cell 42 on one side with a bus bar 73 therebetween, such that the battery cells 42 are connected in series. In addition, the negative-electrode-side power supply terminal 71b of the battery cell 42 is connected to the positive-electrode-side power supply terminal 71a of the adjacent battery cell 42 on the other side with the bus bar 73 therebetween.

The bus bar 73 is composed of a conductive material and is formed into a thin plate shape that has a length that is sufficient to reach the adjacent power supply terminal 71, such as about twice or slightly less than three times a thickness dimension of the battery cell 42 in the lateral direction. The bus bar 73 is connected (such as by welding) to each power supply terminal 71 so as to cover an end portion on an outer side (outer half) of the power supply terminal 71 in the longitudinal direction of the battery cell 42.

As shown in FIG. 1, a positive-electrode-side terminal of an electrical load such as the inverter 30a is connected to a positive-electrode-side power supply path L1 that is connected to a positive-electrode-side power supply terminal of the assembled battery 40. In a similar manner, a negative-electrode-side terminal of the electrical load such as the inverter 30 is connected to a negative-electrode-side power supply path L2 of the assembled battery 40. Here, the positive-electrode-side power supply path L1 and the negative-electrode-side power supply path L2 are each provided with a relay switch SMR (system main relay switch), and configured such that switching between energization and interruption of energization can be performed by the relay switches SMR.

The battery measurement apparatus 50 is an apparatus that measures a charging state (state-of-charge [SOC]), a degradation state (state-of-health [SOH]), and the like of each battery cell 42. According to the first embodiment, the battery measurement apparatus 50 is provided for each battery module 41. The battery measurement apparatus 50 is connected to the ECU 60 and outputs the state of each battery cell 42 and the like. A configuration of the battery measurement apparatus 50 will be described hereafter.

The ECU 60 issues requests for power-running drive and power generation to the inverter control apparatus based on various types of information. For example, the various types of information may include operation information regarding an accelerator and a brake, a vehicle speed, a state of the assembled battery 40, and the like.

Next, the battery measurement apparatus 50 will be described in detail. As shown in FIG. 3, according to the first embodiment, the battery measurement apparatus 50 is provided for each battery cell 42.

The battery measurement apparatus 50 includes an application-specific integrated circuit (ASIC) unit 50a, a filter unit 55, and a current modulation circuit 56. The ASIC unit 50a includes a stabilized power-supply supplying unit 51, an input/output unit 52, a microcomputer unit 53 that serves as a calculating unit, and a communication unit 54.

The stabilized power-supply supplying unit 51 is connected to a power supply line of the battery cell 42 and supplies the input/output unit 52, the microcomputer unit 53, and the communication unit 54 with electric power that is supplied from the battery cell 42. The input/output unit 52, the microcomputer unit 53, and the communication unit 54 are driven based on this electric power.

The input/output unit 52 is connected to the battery cell 42 to be measured. Specifically, the input/output unit 52 has a direct-current voltage input terminal 57 to which a direct-current voltage can be inputted (measured) from the battery cell 42. The filter unit 55 is provided between the battery cell 42 and the direct-current voltage input terminal 57. That is, a resistor-capacitor (RC) filter 55a that serves as a filter circuit, a Zener diode 55b that serves as a protective element, and the like are provided between a positive-electrode-side terminal 57a and a negative-electrode-side terminal 57b of the direct-current voltage input terminal 57. That is, the RC filter 55a, the Zener diode 55b, and the like are connected in parallel to the battery cell 42.

In addition, the input/output unit 52 has a response signal input terminal 58 for inputting a response signal (voltage variation) that reflects internal complex impedance information of the battery cell 42, between the terminals of the battery cell 42. Therefore, the input/output unit 52 functions as a response signal input unit.

Here, the positive-electrode-side power supply terminal 71a and the negative-electrode-side power supply terminal 71b of the battery cell 42 are each connected to an electrode (a positive electrode or a negative electrode). In addition, the response signal input terminal 58 is preferably connected to a portion that is closest to the electrode among portions of the positive-electrode-side power supply terminal 71a and the negative-electrode-side power supply terminal 71b to which connection is possible. Furthermore, a connection portion of the direct-current voltage input terminal 57 is also similarly preferably a portion that is the closest to the electrode or closest second to the connection portion of the response signal input terminal 58. As a result, effects of voltage decrease as a result of a main current or an equalizing current can be minimized.

In addition, the input/output unit 52 is connected to the current modulation circuit 56 that serves as a signal control unit, and has an instruction signal output terminal 59a that outputs an instruction signal to the current modulation circuit 56, the instruction signal indicating a sine-wave signal (alternating-current signal) to be outputted from the battery cell 42. In addition, the input/output unit 52 has a feedback signal input terminal 59b. The feedback signal input terminal 59b inputs a current signal that is actually outputted (sent) from the battery cell 42 as a feedback signal, through the current modulation circuit 56.

Furthermore, the input/output unit 52 is connected to the microcomputer unit 53 and configured to output, to the microcomputer unit 53, the direct-current voltage that is inputted by the direct-current voltage input terminal 57, the response signal that is inputted by the response signal input terminal 58, the feedback signal that is inputted by the feedback signal input terminal 59b, and the like. Here, the input/output unit 52 has an analog-to-digital (AD) converter therein, and is configured to convert an inputted analog signal to a digital signal and output the digital signal to the microcomputer unit 53.

In addition, the input/output unit 52 is configured to input an instruction signal from the microcomputer unit 53 and is configured to output an instruction signal from the instruction signal output terminal 59a to the current modulation circuit 56. Here, the input/output unit 52 has a digital-to-analog (DA) converter therein, and is configured to convert the digital signal that is inputted from the microcomputer unit 53 to an analog signal and output the instruction signal to the current modulation circuit 56. Furthermore, a direct-current bias is applied to the sine-wave signal that is indicated to the current modulation circuit 56 by the instruction signal, and the sine-wave signal is prevented from becoming a negative current (a reverse flow in relation to the battery cell 42).

The current modulation circuit 56 is a circuit that outputs a predetermined alternating-current signal (sine-wave signal) with the battery cell 42 to be measured as a power supply. Specifically, the current modulation circuit 56 has a semiconductor switch element 56a (such as a metal-oxide-semiconductor field-effect transistor [MOSFET]) that serves as a switch unit and a resistor 56b that is connected in series to the semiconductor switch element 56a. A drain terminal of the semiconductor switch element 56a is connected to the positive-electrode-side power supply terminal 71a of the battery cell 42. A source terminal of the semiconductor switch element 56a is connected in series to one end of the resistor 56b. In addition, the other end of the resistor 56b is connected to the negative-electrode-side power supply terminal 71b of the battery cell 42. The semiconductor switch element 56a is configured to be capable of adjusting an energization amount between the drain terminal and the source terminal. Furthermore, for adjustment of a voltage that is applied to the semiconductor switch element 56a based on an operation range of the semiconductor switch element 56a, a resistor may be inserted in series inside the current modulation circuit.

In addition, the current modulation circuit 56 is provided with a current detection amplifier 56c that serves as a current detecting unit that is connected to both ends of the resistor 56b. The current detection amplifier 56c is configured to detect a signal (current signal) that flows to the resistor 56b and output a detection signal as a feedback signal to the feedback signal input terminal 59b of the input/output unit 52.

Furthermore, the current modulation circuit 56 is provided with a feedback circuit 56d. The feedback circuit 56d is configured to input an instruction signal from the instruction signal output terminal 59a of the input/output unit 52 and input a feedback signal from the current detection amplifier 56c. In addition, the feedback circuit 56d is configured to compare the instruction signal and the feedback signal, and output a result of the comparison to a gate terminal of the semiconductor switch element 56a.

The semiconductor switch element 56a adjusts a voltage that is applied across a gate and a source such that a sine-wave signal (predetermined alternating-current signal) that is indicated by the instruction signal is outputted from the battery cell 42, based on the signal from the feedback circuit 56d, and adjusts an amount of current between the drain and the source. Here, when an error occurs between a waveform that is indicated by the instruction signal and a waveform that actually flows to the resistor 56d, the semiconductor switch element 56a adjusts the amount of current such that the error is corrected based on the signal from the feedback circuit 56d. As a result, the sine-wave signal that flows to the resistor 56b is stabilized.

Figure 4:
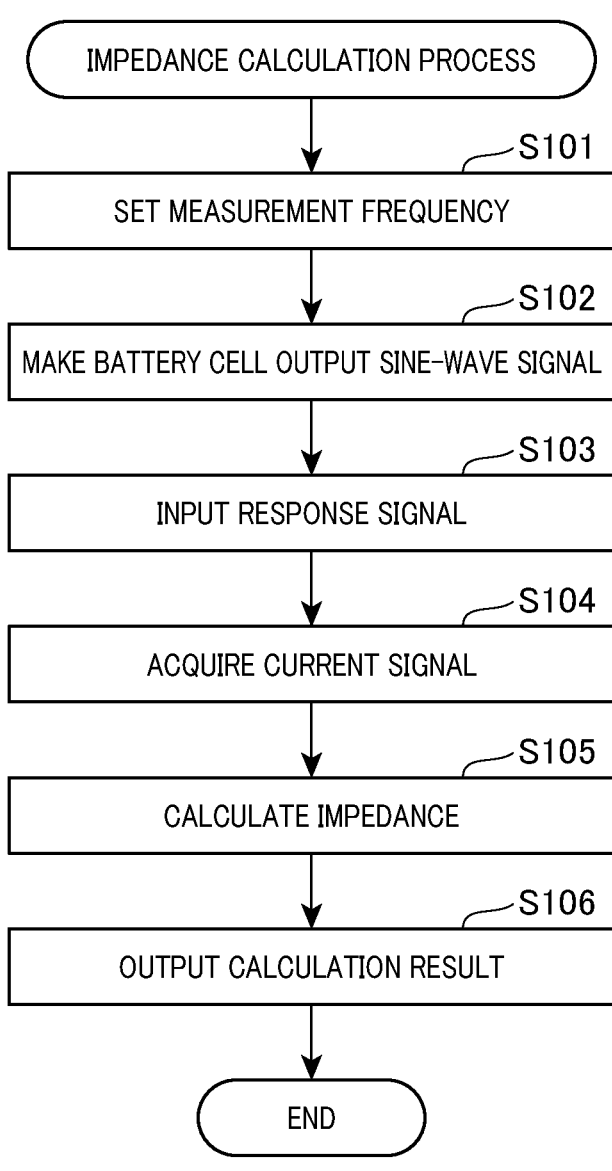
FIG. 4 is a flowchart illustrating an impedance calculation process.

Next, a method for calculating the complex impedance of the battery cell 42 will be described. The battery measurement apparatus 50 performs an impedance calculation process shown in FIG. 4 at every predetermined cycle.

In the impedance calculation process, first, the microcomputer unit 53 sets a measurement frequency of the complex impedance (step S101). The measurement frequency is set among frequencies that are within a measurement range that is determined in advance.

Next, the microcomputer unit 53 determines a frequency of the sine-wave signal (predetermined alternating-current signal) based on the measurement frequency, and outputs the instruction signal that instructs output of the sine-wave signal to the input/output unit 52 (step S102).

When the instruction signal is inputted, the input/output unit 52 converts the instruction signal to an analog signal by the DA converter and outputs the analog signal to the current modulation circuit 56. The current modulation circuit 56 causes the battery cell 42 to output the sine-wave signal as a power supply based on the instruction signal. Specifically, the semiconductor switch element 56a adjusts the amount of current to cause the battery cell 42 to output the sine-wave signal that is indicated by the instruction signal, based on the signal inputted through the feedback circuit 56d. As a result, the battery cell 42 outputs the sine-wave signal.

When the battery cell 42 is made to output the sine-wave signal, that is, when a disturbance is applied to the battery cell 42, a voltage variation that reflects the internal complex impedance information of the battery cell 42 is generated between the terminals of the battery cell 42. The input/output unit 52 inputs the voltage variation through the response signal input terminal 58 and outputs the voltage variation as the response signal to the microcomputer unit 53. At this time, the AD converter converts the voltage variation to a digital signal and outputs the digital signal.

After execution of step S102, the microcomputer unit 53 inputs the response signal from the input/output unit 52 (step S103). In addition, the microcomputer unit 53 acquires a signal that flows to the resistor 56b of the current modulation circuit 56 (that is, an alternating-current signal that is outputted from the battery cell 42) as a current signal (step S104). Specifically, the microcomputer unit 53 inputs a feedback signal (detection signal) that is outputted from the current detection amplifier 56c as the current signal, through the input/output unit 52. Here, instead of the feedback signal, a value that is proportional to the instruction signal given to the current modulation circuit 56 may be set as the current signal.

Next, the microcomputer unit 53 calculates the information related to the complex impedance of the battery cell 42 based on the response signal and the current signal (step S105). That is, the microcomputer unit 53 calculates both or either of an absolute value and a phase of the complex impedance based on a real part of the response signal, an imaginary part of the response signal, a real part of the current signal, an imaginary part of the current signal, and the like. The microcomputer unit 53 outputs calculation results to the ECU 60 through the communication unit 54 (step S106). Then, the calculation process is ended.

This calculation process is repeatedly performed until the complex impedances at a plurality of frequencies within the measurement range are calculated. For example, based on the calculation results, the ECU 60 may generate a complex impedance plane plot (Cole-Cole plot) and ascertain characteristics of the electrodes, the electrolyte, and the like. For example, the ECU 60 may ascertain the charging state (SOC) and the degradation state (SOH).

Here, the overall Cole-Cole plot is not necessarily required to be generated, and focus may be placed on only a section thereof. For example, the complex impedance at a certain frequency may be measured at a fixed time interval during traveling, and changes in the SOC, the SOH, a battery temperature, and the like during traveling may be ascertained based on changes over time in the complex impedance at the certain frequency. Alternatively, the complex impedance at a certain frequency may be measured at a time interval such as every day, every week, or every year, and the changes in the SOH and the like may be ascertained based on the changes over time in the complex impedance at the certain frequency.

Here, when the current modulation circuit 56 causes the battery cell 42 to output the alternating-current signal (sine-wave signal or the like) through a first electrical path 81, induced electromotive force that is based on the alternating-current signal is generated in a second electrical path 82. The response signal is a very weak signal. Therefore, when the induced electromotive force that is based on the alternating-current signal is generated in the second electrical path 82, measurement error occurs. Therefore, the battery measurement apparatus 50 is configured to reduce the induced electromotive force.

Figure 5:
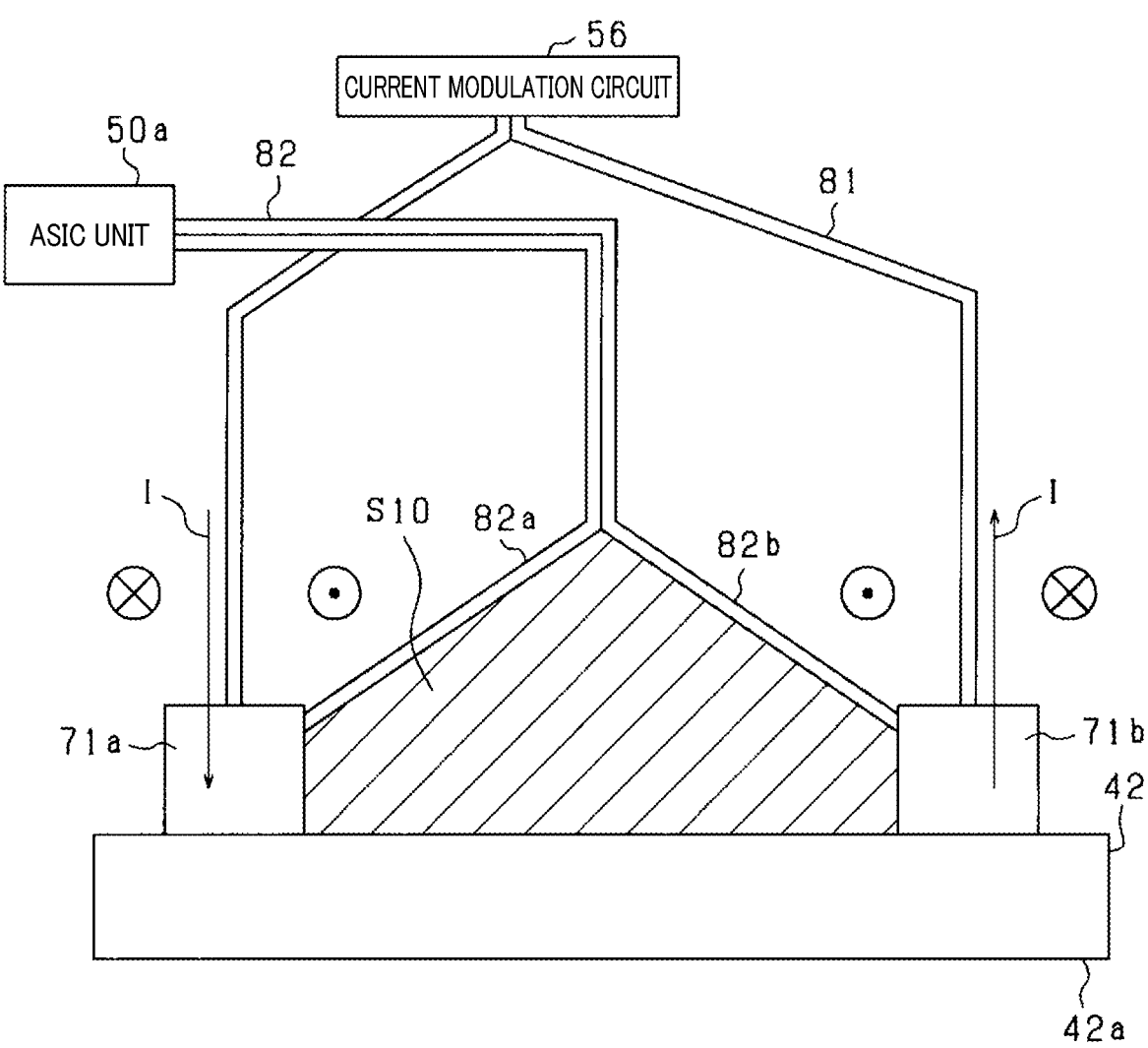
FIG. 5 is a side view of a connection mode of the battery measurement apparatus in a comparison example.
Figure 6:
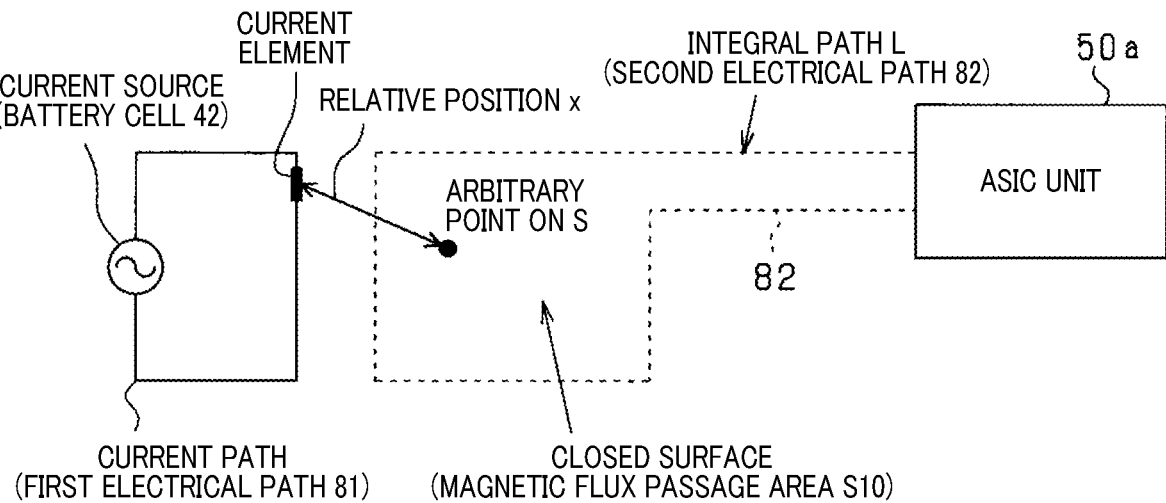
FIG. 6 is a circuit diagram illustrating the battery measurement apparatus.

Here, before the configuration for reducing the induced electromotive force is described, a principle by which the induced electromotive force is generated and a principle for suppressing the induced electromotive force will be described. FIG. 5 is a diagram of a typical model of the first electrical path 81, the second electrical path 82, and an electrical path (current path) within the battery cell 42. FIG. 6 is a circuit diagram schematically showing a circuit configuration of the battery measurement apparatus 50.

Numeric expression (1) shows Faraday's law. Here, "E(x, t)" indicates an electric field vector and "L" indicates a path of a line integral. "B(x,t)" indicates a magnetic flux density vector. "S" indicates an area that is closed by a portion that is surrounded by the path of the line integral on a left side. "n" indicates a normal vector of a point in "S". "x" is a vector that indicates a position from a current element. "t" indicates time. That is, the electric field vector "E(x,t)" and the magnetic flux density vector "B(x,t)" are values that are dependent on location and time. "Vi(t)" indicates induced electromotive force.

According to the first embodiment, "E(x,t)" indicates an electric field vector of the second electrical path 82. "L" indicates a path of the second electrical path 82. "B(x,t)" indicates a magnetic flux density vector that passes through an area (magnetic flux passage area S10) that is surrounded by the second electrical path 82, the power supply terminals 71, and the housing case 42a. "S" indicates a plane of the magnetic flux passage area S10. "x" is a vector that indicates a position from a current element that is set in the first electrical path 81. "Vi(t)" indicates induced electromotive force that is generated in the second electrical path 82.

$$Vi(t) = \oint_L E(x, t) \cdot dL = -\int_S \frac{\partial}{\partial t} B(x, t) \cdot n dS \quad (1)$$

Based on Faraday's law, the induced electromotive force can clearly be reduced by the magnetic flux passage area S10 that is surrounded by the second electrical path 82 and the like being made smaller. In addition, the induced electromotive force can clearly be reduced by a distance from the first electrical path 81 being made farther.

However, as shown in FIG. 5, the battery cell 42 is structurally required to have the positive-electrode-side power supply terminal 71a and the negative-electrode-side power supply terminal 71b be provided so as to be separated from each other. Therefore, of the second electrical path 82, a second-A electrical path 82a that serves as a positive-electrode-side detection line (lead) that connects from the ASIC unit 50a to the positive-electrode-side power supply terminal 71a, and a second-B electrical path 82b that serves as a negative-electrode-side detection line (lead) that connects from the ASIC unit 50a to the negative-electrode-side power supply terminal 71b are required to be branched midway.

Therefore, when the second electrical path 82 is arranged as shown in FIG. 5, an area that is surrounded by the housing case 42a, the second electrical path 82, the positive-electrode-side power supply terminal 71a, and the negative-electrode-side power supply terminal 71b is formed so as to be large. This area is the magnetic flux passage area S10 through which a magnetic flux that is based on an alternating-current signal I that flows to the first electrical path 81 passes. In addition, in terms of the first electrical path 81 being connected to the positive-electrode-side power supply terminal 71a and the negative-electrode-side power supply terminal 71b in a manner similar to the second electrical path 82, the distance between the first electrical path 81 and the second electrical path 82 being made farther has limitations.

Figure 7:
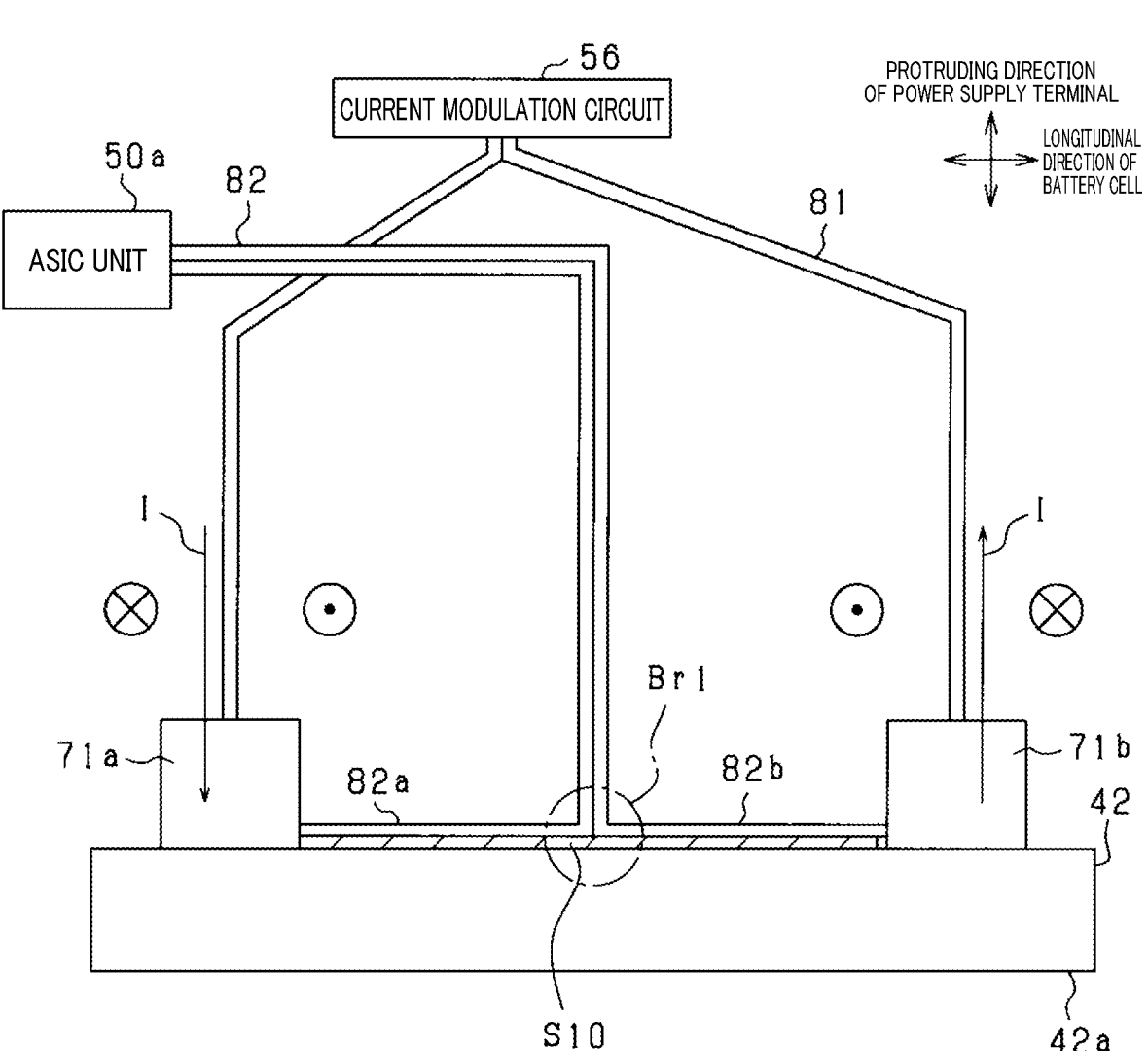
FIG. 7 is a side view schematically illustrating a connection mode of a battery measurement apparatus according to a first embodiment.

Therefore, a configuration such as a following is used to minimize a size of the magnetic flux passage area S10. FIG. 7 is a side view schematically showing a connection mode of the battery measurement apparatus 50 to the battery cell 42 according to the present embodiment. As shown in FIG. 7, the second-A electrical path 82a that is connected to the ASIC unit 50a is wired along the second-B electrical path 82b up to a branch point Br1 that is determined in advance. That is, the second-A electrical path 82a and the second-B electrical path 82b are wired in parallel so as to have as little a gap as possible. In FIG. 7, the second electrical path 82 from the ASIC unit 50a to the branch point Br1 is wired along a protruding direction of the power supply terminals 71. However, as long as the second-A electrical path 82a and the second-B electrical path 82b are wired to follow each other, any manner of wiring is possible. For example, the second-A electrical path 82a and the second-B electrical path 82b may be wired along the lateral direction of the battery cell 42 (a vertical direction on a paper surface). In addition, when the second-A electrical path 82a and the second-B electrical path 82b are wired to follow each other, the wiring is not required to be linear. As long as the second-A electrical path 82a and the second-B electrical path 82b curve in a similar manner, the second-A electrical path 82a and the second-B electrical path 82b may be arbitrarily curved. Here, the second-A electrical path 82a and the second-B electrical path 82b are each covered by an insulating film. Alternatively, a gap that is sufficient to ensure insulation may be provided at minimum between the second-A electrical path 82a and the second-B electrical path 82b.

In addition, while the second-A electrical path 82a is wired from the branch point Br1 towards the positive-electrode-side power supply terminal 71a, the second-B electrical path 82b is wired from the branch point Br1 towards the negative-electrode-side power supply terminal 71b. For example, from the branch point Br1 towards the power supply terminals 71 refers to a state in which an inner product of each vector that is a vector that indicates a direction in which a current flows immediately after the branch point and a vector from the branch point to an arbitrary point of an electrode that are projected on a plane that includes an electrode upper surface is a positive value.

Furthermore, a position of the branch point Br1 is arranged between tip end positions of the positive-electrode-side power supply terminal 71a and the negative-electrode-side power supply terminal 71b, and the housing case 42a, in the protruding direction of the positive-electrode-side power supply terminal 71a and the negative-electrode-side power supply terminal 71b. More specifically, the branch point Br1 is provided in a position that comes into contact with the housing case 42a. In addition, the position of the branch point Br1 is arranged between the positive-electrode-side power supply terminal 71a and the negative-electrode-side power supply terminal 71b in the lateral direction of the battery cell 42.

Here, in FIG. 7, the position of the branch point Br1 is arranged in a center between the positive-electrode-side power supply terminal 71a and the negative-electrode-side power supply terminal 71b in the longitudinal direction of the battery cell 42. However, the position of the branch point Br1 may be arbitrarily changed as long as the position is between the positive-electrode-side power supply terminal 71a and the negative-electrode-side power supply terminal 71b. In addition, when the branch point Br1 is arranged in the positive-electrode-side power supply terminal 71a, only the second-B electrical path 82b is wired from the branch point Br1 towards the negative-electrode-side power supply terminal 71b. In a similar manner, when the branch point Br1 is arranged in the negative-electrode-side power supply terminal 71b, only the second-A electrical path 82a is wired from the branch point Br1 towards the positive-electrode-side power supply terminal 71a.

Moreover, the second-A electrical path 82a is linearly wired along an outer circumferential surface of the housing case 42a from the branch point Br1 towards the positive-electrode-side power supply terminal 71a. Meanwhile, the second-B electrical path 82b is linearly wired along the outer circumferential surface of the housing case 42a from the branch point Br1 towards the negative-electrode-side power supply terminal 71b. Here, the second-A electrical path 82a and the second-B electrical path 82b are in contact with an insulating member (not shown) interposed therebetween, such that insulation from the housing case 42a is ensured. The insulating member may be an insulating film that covers the second-A electrical path 82a and the second-B electrical path 82b, or may be a circuit board or the like. Alternatively, a gap that is sufficient to ensure insulation may be provided at minimum between the second electrical path 82 and the housing case 42a.

According to the first embodiment, following effects are achieved.

An area that is surrounded by the housing case 42a, the second electrical path 82, the positive-electrode-side power supply terminal 71a, and the negative-electrode-side power supply terminal 71b is the magnetic flux passage area S10 through which the magnetic flux that is based on the alternating-current signal I that flows through the first electrical path 81 passes. In addition, the magnetic flux passage area S10 is also an area through which a magnetic flux that is based on an external signal, such as noise from the inverter 30, passes. A magnitude of the induced electromotive force that is generated in the second electrical path 82 corresponds to a magnitude of the magnetic flux (more precisely, a magnitude of an amount of change over time in the magnetic flux) in the magnetic flux passage area S10. Therefore, the size of the magnetic flux passage area S10 is set such that the induced electromotive force that is generated in the second electrical path 82 is within an electromotive-force allowable value range that includes zero.

Specifically, while the second-A electrical path 82*a* is wired from the branch point Br1 towards the positive-electrode-side power supply terminal 71*a*, the second-B electrical path 82*b* is wired from the branch point Br1 towards the negative-electrode-side power supply terminal 71*b*. In addition, the position of the branch point Br1 is arranged between the tip end positions of the positive-electrode-side power supply terminal 71*a* and the negative-electrode-side power supply terminal 71*b*, and the housing case 42*a*.

More specifically, the branch point Br1 is provided in a position that comes into contact with the housing case 42*a*. In addition, the second-A electrical path 82*a* is wired along the outer circumferential surface of the housing case 42*a* from the branch point Br1 towards the positive-electrode-side power supply terminal 71*a*. Furthermore, the second-B electrical path 82*b* is wired along the outer circumferential surface of the housing case 42*a* from the branch point Br1 towards the negative-electrode-side power supply terminal 71*b*.

Consequently, the size of the magnetic flux passage area S10 can be suppressed as much as possible and errors in the response signal based on the induced electromotive force can be suppressed. In addition, the battery cell 42 can be reduced in height. Furthermore, as a result of the first electrical path 81 being connected to the tip ends of the power supply terminals 71, the magnetic flux passage area S10 can be set away from the first electrical path 81 that is connected to the tip ends of the power supply terminals 71, and errors in the response signal based on the induced electromotive force can be suppressed. Here, relative positions of the first electrical path 81 and the second electrical path 82 are preferably fixed.

Second Embodiment

Next, the battery measurement apparatus 50 according to a second embodiment will be described. Hereafter, sections among the embodiments that are identical or equivalent are given the same reference numbers. Descriptions of sections having the same reference numbers are applicable therebetween. In addition, according to the second embodiment, as a basic configuration, a basic configuration according to the first embodiment will be described as an example.

Figure 8:
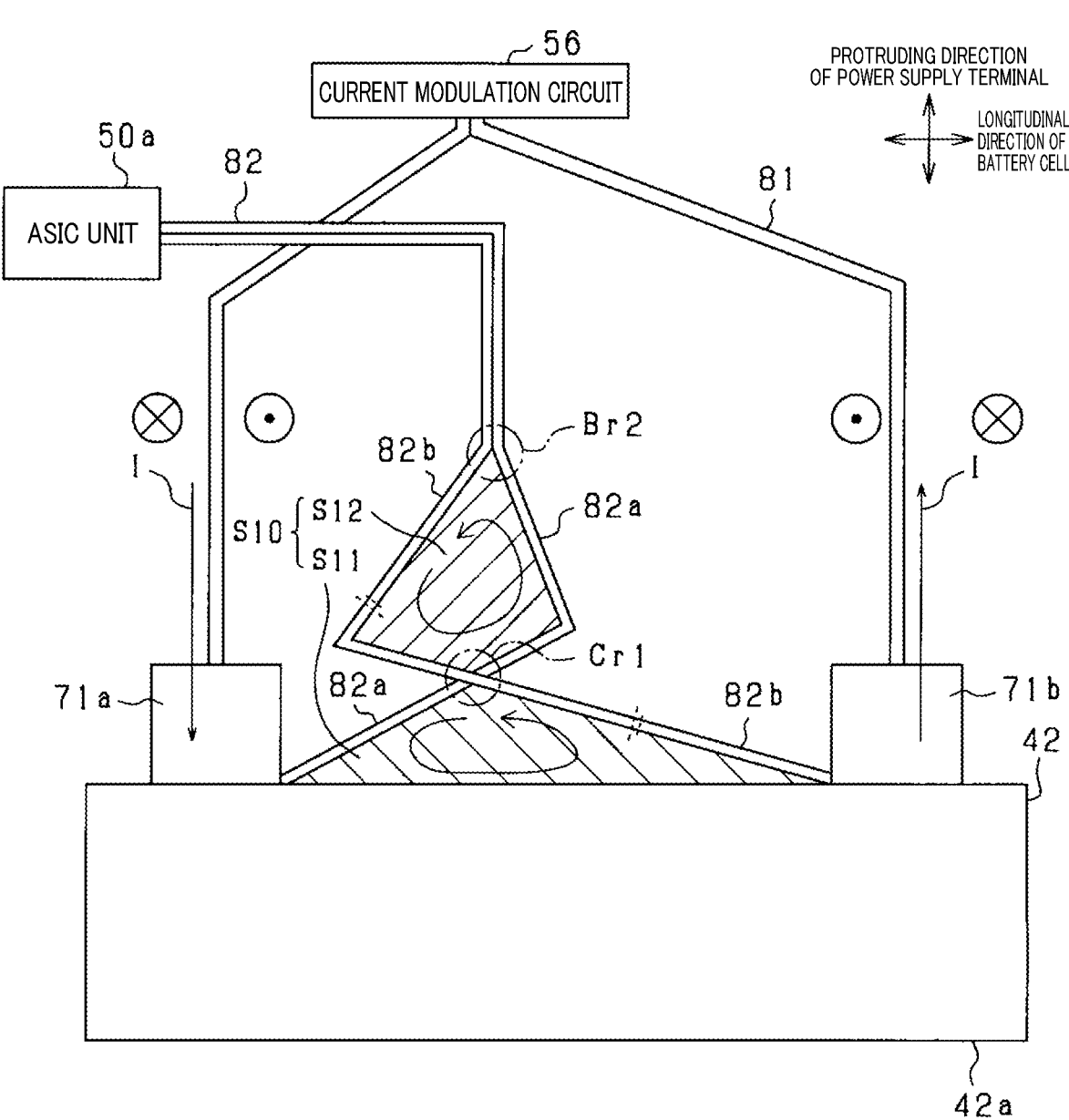
FIG. 8 is a side view schematically illustrating a connection mode of a battery measurement apparatus according to a second embodiment.

According to the second embodiment, in a manner similar to that according to the first embodiment, as shown in FIG. 8, the second-A electrical path 82*a* that is connected to the ASIC unit 50*a* is wired along the second-B electrical path 82*b* until a branch point Br2 that is determined in advance. In addition, the second-A electrical path 82*a* is wired so as to branch from the second-B electrical path 82*b* at the branch point Br2.

The branch point Br2 according to the second embodiment is not arranged between the tip end positions of the positive-electrode-side power supply terminal 71*a* and the negative-electrode-side power supply terminal 71*b*, and the housing case 42*a*, in the protruding direction of the positive-electrode-side power supply terminal 71*a* and the negative-electrode-side power supply terminal 71*b*. That is, the branch point Br2 is arranged on a side opposite the housing case 42*a* from the tip end positions of the positive-electrode-side power supply terminal 71*a* and the negative-electrode-side power supply terminal 71*b*, in the protruding direction of the power supply terminals 71. In FIG. 8, a position of the branch point Br2 is set between the positive-electrode-side power supply terminal 71*a* and the negative-electrode-side power supply terminal 71*b* in the lateral direction of the battery cell 42 (the vertical direction on the paper surface). However, the position of the branch point Br2 can be arbitrarily changed. In the longitudinal direction of the battery cell 42, the position of the branch point Br2 is set between the positive-electrode-side power supply terminal 71*a* and the negative-electrode-side power supply terminal 71*b*.

Furthermore, the second-A electrical path 82*a* is wired so as to intersect the second-B electrical path 82*b* once from the branch point Br2 to the positive-electrode-side power supply terminal 71*a*. That is, the second-A electrical path 82*a* and the second-B electrical path 82*b* become closer and intersect after temporarily separating, and are subsequently connected to the power supply terminals 71.

More specifically with reference to FIG. 8, the second-A electrical path 82*a* is wired towards the positive-electrode-side power supply terminal 71*a* after temporarily running towards the negative-electrode-side power supply terminal 71*b* from the branch point Br2. In a similar manner, the second-B electrical path 82*b* is wired towards the negative-electrode-side power supply terminal 71*b* after temporarily running towards the positive-electrode-side power supply terminal 71*a* from the branch point Br2. The second-A electrical path 82*a* intersects the second-B electrical path 82*b* midway towards the positive-electrode-side power supply terminal 71*a*.

As a result, the magnetic flux passage area S10 is divided into a first magnetic flux passage area S11 that serves as a first area and a second magnetic flux passage area S12 that serves as a second area. The first magnetic flux passage area S11 is an area that is surrounded by the second-A electrical path 82*a* that is arranged further towards the side of the positive-electrode-side power supply terminal 71*a* than the second-B electrical path 82*b* is, and the second-B electrical path 82*b* that is arranged further towards the side of the negative-electrode-side power supply terminal 71*b* than the second-A electrical path 82*a* is. The first magnetic flux passage area S11 according to the second embodiment can also be said to be an area that is surrounded by the second-A electrical path 82*a* from the positive-electrode-side power supply terminal 71*a* to a cross point Cr1, the second-B electrical path 82*b* from the negative-electrode-side power supply terminal 71*b* to the cross point Cr1, and the housing case 42*a*.

The second magnetic flux passage area S12 is an area that is surrounded by the second-A electrical path 82*a* that is arranged further towards the side of the negative-electrode-side power supply terminal 71*b* than the second-B electrical path 82*b* is, and the second-B electrical path 82*b* that is arranged further towards the side of the positive-electrode-side power supply terminal 71*a* than the second-A electrical path 82*a* is. The second magnetic flux passage area S12 according to the second embodiment can also be said to be an area that is surrounded by the second-A electrical path 82*a* from the cross point Cr1 to the branch point Br2 and the second-B electrical path 82*b* from the cross point Cr1 to the branch point Br1.

In addition, in the first electrical path 81, when the alternating-current signal I flows as shown in FIG. 8, an orientation of a magnetic flux between the power supply terminals 71 is from a rear side to a front side on the paper surface. At this time, a direction in which the current flows through the first electrical path 81 as a result of the induced electromotive force is counter-clockwise as shown in FIG. 8. In addition, because a positional relationship between the second-A electrical path 82*a* and the second-B electrical path 82*b* reverses at the cross point Cr1, phases of the induced electromotive force that is based on the magnetic flux that penetrates the first magnetic flux passage area S11 and the induced electromotive force that is based on the magnetic flux that penetrates the second magnetic flux passage area S12 are shifted by 180 degrees. That is, the induced electromotive forces are generated so as to be canceled out. This similarly applies to when the direction in which the alternating-current signal I flows is reversed.

In addition, the magnitude of the induced electromotive force is dependent on the magnitude of the magnetic flux (more precisely, the magnitude of the amount of change over time in the magnetic flux) that passes through each of the first magnetic flux passage area S11 and the second magnetic flux passage area S12. Therefore, the size of the second magnetic flux passage area S12 is set based on the size of the first magnetic flux passage area S11 such that a difference between a first magnetic flux that is based on the alternating-current signal I and passes through the first magnetic flux passage area S11 and a second magnetic flux that is based on the alternating-current signal I and passes through the second magnetic flux passage area S12 is within a magnetic-flux allowable value range that includes zero. That is, the size of the second magnetic flux passage area S12 is set based on the size of the first magnetic flux passage area S11 such that a sum of the induced electromotive force that is based on the magnetic flux that penetrates the first magnetic flux passage area S11 and the induced electromotive force that is based on the magnetic flux that penetrates the second magnetic flux passage area S12 is within the electromotive-force allowable value range.

For example, if the first magnetic flux passage area S11 and the second magnetic flux passage area S12 may be on the same plane, and the distances to the first electrical path 81 be about the same, the induced electromotive force can be set within the electromotive-force allowable value range by the first magnetic flux passage area S11 and the second magnetic flux passage area S12 being set to about the same size.

Here, the magnetic-flux allowable value range may be arbitrarily set taking into consideration calculation accuracy required for measurement, magnitudes of the response signal and a noise signal, and the like. In addition, the electromotive-force allowable value range may be arbitrarily set taking into consideration the calculation accuracy required for measurement, the magnitudes of the response signal and the noise signal, and the like. According to the present embodiment a range of 200 V with zero at a center is set as the electromotive-force allowable value range.

As a result of the forgoing, the sum of the induced electromotive force that is based on the magnetic flux that penetrates the first magnetic flux passage area S11 and the induced electromotive force that is based on the magnetic flux that penetrates the second magnetic flux passage area S12 is within the electromotive-force allowable value range, and errors in the response signal based on the induced electromotive force can be suppressed.

Third Embodiment

Next, the battery measurement apparatus 50 according to a third embodiment will be described. Hereafter, sections among the embodiments that are identical or equivalent are given the same reference numbers. Descriptions of sections having the same reference numbers are applicable therebetween. In addition, according to the third embodiment, as a basic configuration, the basic configuration according to the first embodiment will be described as an example.

Figure 9:
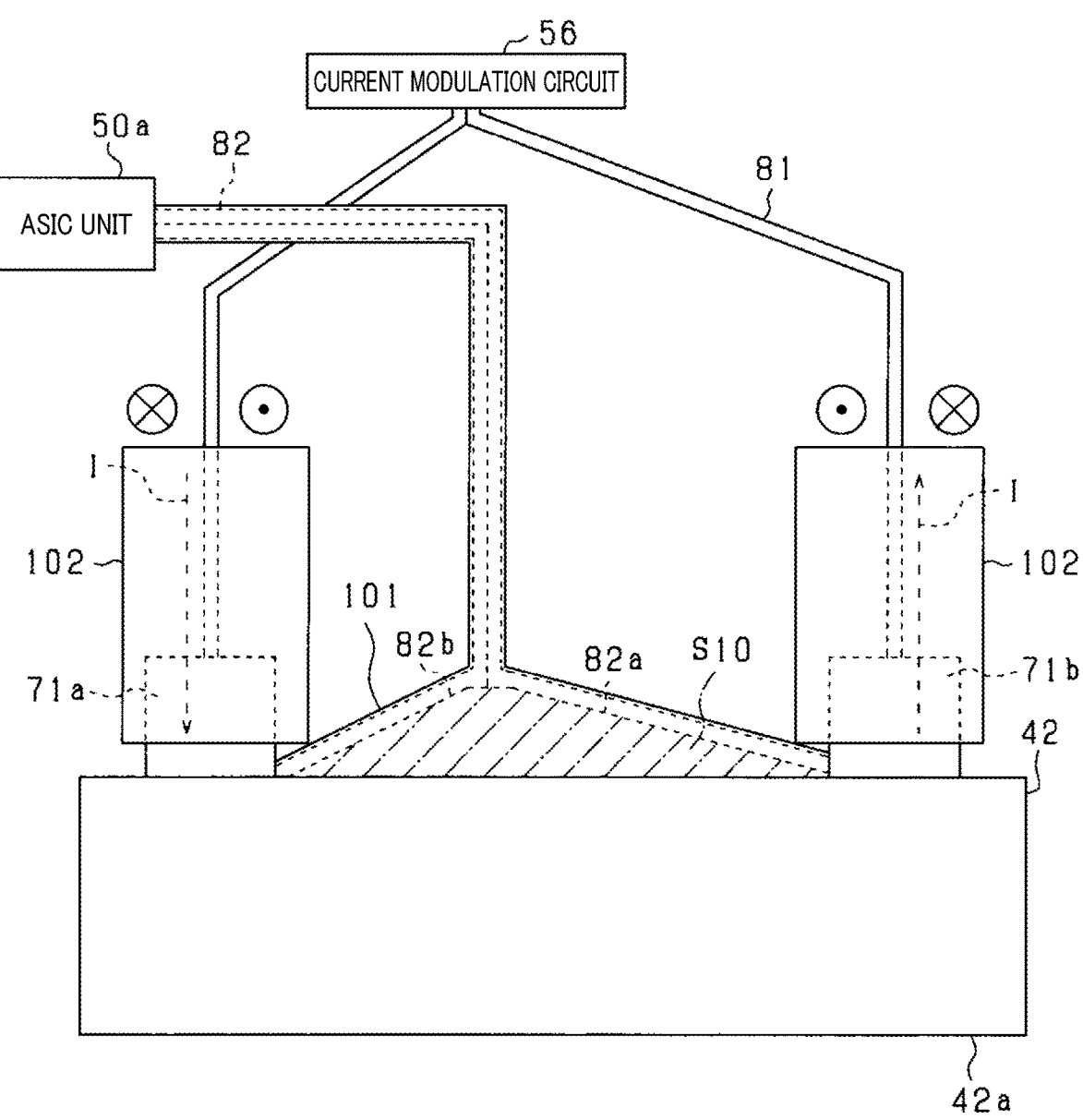
FIG. 9 is a side view schematically illustrating a connection mode of a battery measurement apparatus according to a third embodiment.

According to the third embodiment, as shown in FIG. 9, the magnetic flux passage area S10 is covered by a first magnetic shield 101. In addition, at least a portion of the first electrical path 81 is covered by a second magnetic shield 102. The second magnetic shield 102 is provided on the side of each power supply terminal 71 and covers at least a portion of the power supply terminal 71.

As a result of the first magnetic shield 101, the magnetic flux that is based on the alternating-current signal and the magnetic flux that is based on external noise do not easily pass through the magnetic flux passage area S10, and the generation of induced electromotive force can be suppressed. In addition, as a result of the second magnetic shield 102, the magnetic flux that is based on the alternating-current signal I can be suppressed from passing through the magnetic flux passage area S10, and the induced electromotive force can be suppressed.

Here, according to the third embodiment, the first magnetic shield 101 and the second magnetic shield 102 are both provided. However, only either may be provided.

Fourth Embodiment

Next, the battery measurement apparatus 50 according to a fourth embodiment will be described. Hereafter, sections among the embodiments that are identical or equivalent are given the same reference numbers. Descriptions of sections having the same reference numbers are applicable therebetween. In addition, according to the fourth embodiment, as a basic configuration, the basic configuration according to the first embodiment will be described as an example.

The battery measurement apparatus 50 may be arranged on a circuit board, and wiring of the first electrical path 81, the second electrical path 82, and the like may be fixed. Hereafter, wiring of the electrical paths 81 and 82, connection modes of the battery cell 42 and the battery measurement apparatus 50, and the like will be described.

Figure 10:
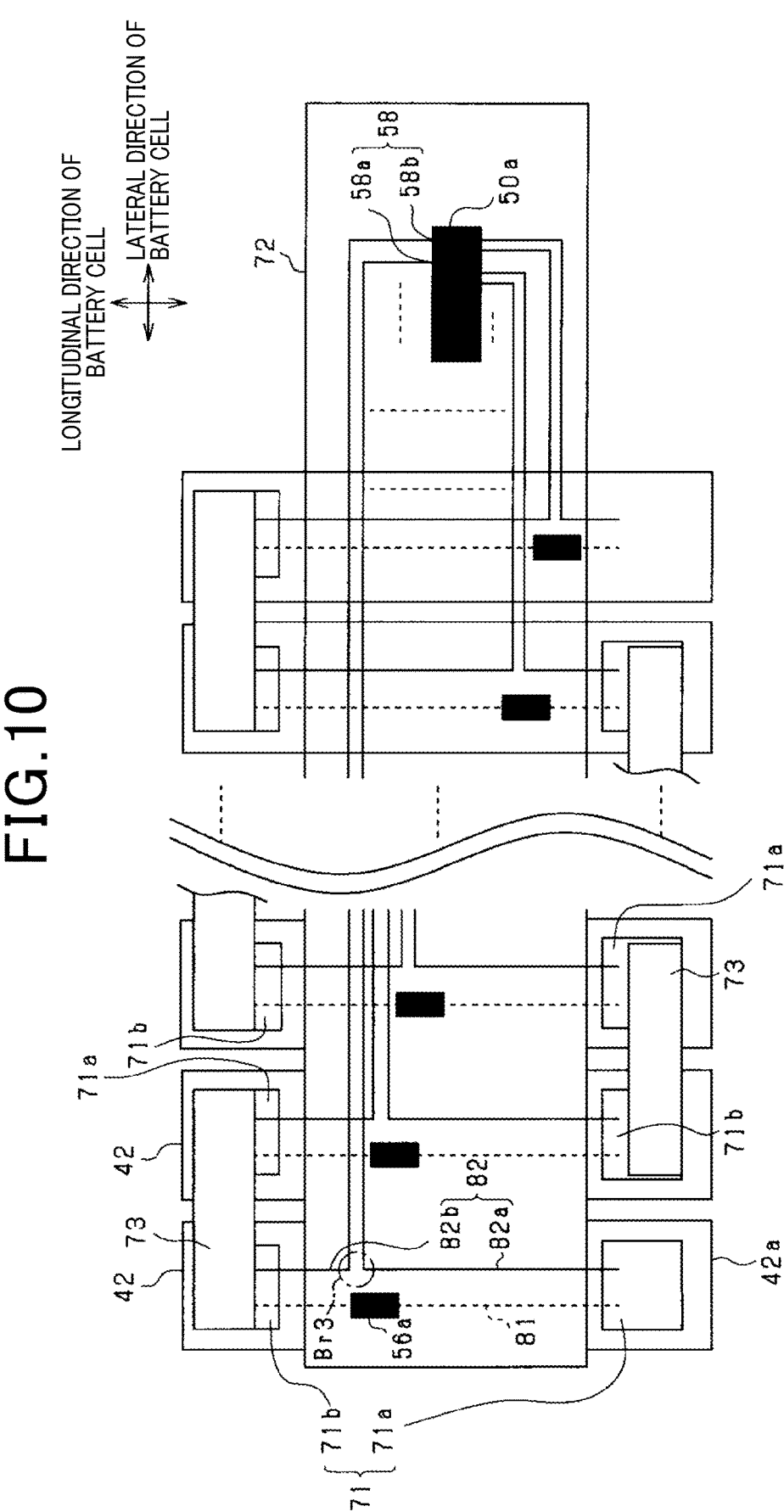
FIG. 10 is a plan view of a battery measurement apparatus according to a fourth embodiment.

FIG. 10 is a schematic diagram of a connection mode of the battery cell 42 and the battery measurement apparatus 50. FIG. 10 shows a plan view of a plurality of battery cells 42 viewed from an upper surface (a set-up surface of the power supply terminals 71).

As shown in FIG. 10, a planar circuit board 72 is provided between the positive-electrode-side power supply terminal 71a and the negative-electrode-side power supply terminal 71b. The circuit board 72 is a printed circuit board (PCB) or a flexible printed circuit board (FPC). Electrical paths composed of conductive metal are laid around circuit elements that are arranged on the circuit board 72. As a result, positions of the electrical paths and the circuit elements are fixed. Therefore, according to the fourth embodiment, the circuit board 72 corresponds to a fixing member.

At this time, signal wiring (electrical path) is basically laid such that two lines form a pair. For example, wiring that is connected to the gate terminal of the semiconductor switch element 56a to send a signal to the gate terminal in FIG. 3 and wiring that serves as a so-called return path of the signal may be laid in a pair. However, a single line, a ground plane, a power plane, or the like may be shared as return lines of two certain types of signals.

For example, the ASIC unit 50a, the filter unit 55, the current modulation circuit 56, and the like may be arranged (fixed) on the circuit board 72 as the circuit elements. Here, in FIG. 10, for convenience of illustration, only the ASIC unit 50a and the semiconductor switch element 56a of the current modulation circuit 56 are shown.

As shown in FIG. 10, the circuit board 72 is formed so as to extend in the lateral direction (left/right direction in FIG. 10) of the battery cell 42 so as to span the overall plurality of battery cells 42 that are laminated. At this time, the circuit board 72 is configured to be arranged between the power supply terminals 71 of the battery cells 42. In addition, the circuit board 72 is arranged so as to oppose the set-up surface of the power supply terminals 71.

The semiconductor switch element 56a is arranged between the power supply terminals 71 of each battery cell 42. Meanwhile, the ASIC unit 50a is arranged in a position that is at one end in the longitudinal direction of the circuit board 72 (the lateral direction of the battery cell 42) (right end in FIG. 10) and does not overlap the battery cell 42.

In addition, as indicated by a broken line in FIG. 10, the first electrical path 81 is provided so as to connect between the positive-electrode-side power supply terminal 71a and the negative-electrode-side power supply terminal 71b with a straight line. The semiconductor switch element 56a is arranged on the first electrical path 81. The semiconductor switch element 56a, that is, the current modulation circuit 56 is configured to cause the battery cell 42 to output the alternating-current signal through the first electrical path 81.

Furthermore, as indicated by a solid line in FIG. 10, the second electrical path 82 that connects the power supply terminals 71 of each battery cell 42 and the response signal input terminal 58 of the ASIC unit 50a is provided on the circuit board 72. Specifically, of the second electrical path 82, the second-A electrical path 82a that serves as the positive-electrode-side detection line that is connected to the positive-electrode-side power supply terminal 71a is configured to linearly extend from the positive-electrode-side power supply terminal 71a towards the negative-electrode-side power supply terminal 71b and bend at a 90-degree right angle midway. Subsequently, the second-A electrical path 82a extends along the longitudinal direction of the circuit board 72 towards the ASIC unit 50a side, and bends towards the ASIC unit 50a side in the end portion of the circuit board 72. However, the 90-degree bend according to the present embodiment is an example and does not mean that the wiring does not have a bending radius (R). The bending R is provided as required. In addition, a wiring pattern of the bent portion is not necessarily required to be 90 degrees and may be circular arc or a shape that has a rounded corner, as required.

In a similar manner, of the second electrical path 82, the second-B electrical path 82b that serves as the negative-electrode-side detection line that is connected to the negative-electrode-side power supply terminal 71b is configured to linearly extend from the negative-electrode-side power supply terminal 71b towards the positive-electrode-side power supply terminal 71a, and bend at a 90-degree right angle midway. At this time, the second-B electrical path 82b is bent in a position that does not come into contact with the second-A electrical path 82a. Subsequently, the second-B electrical path 82b is formed so as to extend along the longitudinal direction of the circuit board 72 towards the ASIC unit 50a side, so as to be parallel to the second-A electrical path 82a, and is bent towards the ASIC unit 50a side in the end portion of the circuit board 72. Here, the second electrical path 82 is formed on a differing layer in at least an intersecting portion so as not to directly intersect the first electrical path 81.

As a result, as shown in FIG. 10, the second-A electrical path 82a that is connected to the ASIC unit 50a is wired along the second-B electrical path 82b up to a branch point Br3 that is determined in advance. That is, the second-A electrical path 82a and the second-B electrical path 82b are wired to be parallel so as to have as little a gap as possible.

In addition, while the second-A electrical path 82a is linearly wired from the branch point Br3 towards the positive-electrode-side power supply terminal 71a, the second-B electrical path 82b is wired from the branch point Br3 towards the negative-electrode-side power supply terminal 71b. The branch point Br3 is arranged between the positive-electrode-side power supply terminal 71a and the negative-electrode-side power supply terminal 71b in the longitudinal direction and the lateral direction of the battery cell 42.

Here, in the case of the first electrical path 81 and the second electrical path 82 that are connected to the same battery cell 42, when the first electrical path 81 and the second electrical path 82 are provided on differing layers, stray capacitance may increase between the lines as a result of a dielectric that is the layer being sandwiched therebetween. Therefore, the first electrical path 81 and the second electrical path 82 are preferably formed on the same layer as much as possible. In addition, when the first electrical path 81 and the second electrical path 82 that are connected to the same battery cell 42 are intersected, the first electrical path 81 and the second electrical path 82 are preferably wired on differing layers only in the intersecting portion. Furthermore, the second electrical path 82 is preferably orthogonal when intersecting the first electrical path 81 such that an intersecting area is minimized.

Here, when the second electrical path 82 intersects the first electrical path 81 that is connected to another battery cell 42 when running towards the ASIC unit 50a, the second electrical path 82 intersects the first electrical path 81 by passing through another layer. At this time, an area that is on the other layer made as small as possible. In this case, because the electrical path is connected to another battery cell 42, effects of stray capacitance are small.

In addition, the first electrical path 81 and the second electrical path 82 are similarly formed in each battery cell 42 as well. However, the second electrical path 82 is provided with as little overlap as possible with the semiconductor switch element 56a, and the first electrical paths 81 and the second electrical paths 82 that are connected to the other battery cells 42. Specifically, the semiconductor switch element 56a is arranged such that the position thereof is shifted in the lateral direction of the circuit board 72 (longitudinal direction of the battery cell 42) for each battery cell 42. Furthermore, when the second electrical path 82 extends in the longitudinal direction of the circuit board 72 (lateral direction of the battery cell 42), to prevent overlap with another second electrical path 82 that is connected to another battery cell 42, the second electrical path 82 is provided in parallel with the other second electrical path 82. At this time, the second electrical paths 82 are provided such that respective positions are shifted in the lateral direction of the circuit board 72.

In addition, as shown in FIG. 11, the circuit board 72 is arranged further towards the side of the housing case 42a than the tip ends of the power supply terminals 71 in the protruding direction of the power supply terminals 71 is. As a result, the position of the branch point Br3 is arranged between the tip end positions of the positive-electrode-side power supply terminal 71a and the negative-electrode-side power supply terminal 71b, and the housing case 42a in the protruding direction of the positive-electrode-side power supply terminal 71a and the negative-electrode-side power supply terminal 71b. More specifically, the branch point Br3 is provided in a position that comes into contact with the housing case 42a with the circuit board 72 therebetween. In addition, the second-A electrical path 82*a* is linearly wired along the outer circumferential surface of the housing case 42*a*, from the branch point Br3 towards the positive-electrode-side power supply terminal 71*a*. Meanwhile, the second-B electrical path 82*b* is linearly wired along the outer circumferential surface of the housing case 42*a*, from the branch point Br3 towards the negative-electrode-side power supply terminal 71*b*.

Here, as shown in FIG. 11, the electrical paths 81 and 82 are connected to the tip ends of the power supply terminals 71 by L-shaped welding plates 74. While the alternating-current signal I can make a round trip up and down through the welding plates 74, the magnetic flux from this portion is canceled out by the round trip.

As a result of a configuration such as that above, according to the third embodiment, the size of the magnetic flux passage area S10 can be suppressed and errors in the response signal based on the induced electromotive force can be suppressed. In addition, the battery cell 42 can be reduced in height. Furthermore, the magnetic flux passage area S10 can be set away from the bus bar 73, induced electromotive force that is based on noise (external signal) that flows to the bus bar 73 can be suppressed from being generated in the second electrical path 82, and errors in the response signal can be suppressed. For example, the noise that flows to the bus bar 73 may be noise that is based on operation of the inverter 30.

Fifth Embodiment

Next, the battery measurement apparatus 50 according to a fifth embodiment will be described. Hereafter, sections among the embodiments that are identical or equivalent are given the same reference numbers. Descriptions of sections having the same reference numbers are applicable therebetween. In addition, according to the fifth embodiment, as a basic configuration, the basic configuration according to the fourth embodiment will be described as an example.

Figure 12:
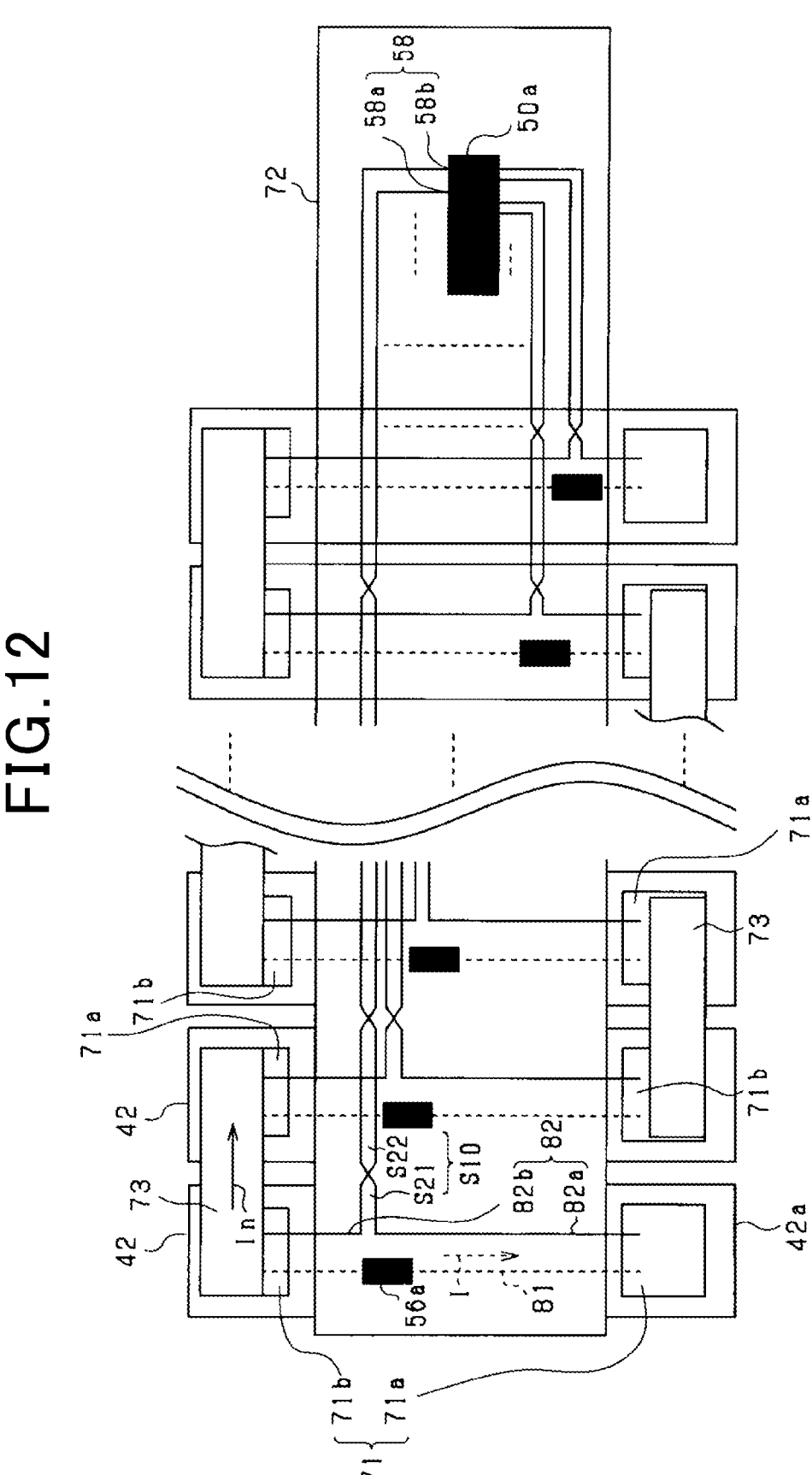
FIG. 12 is a plan view schematically illustrating a connection mode of a battery measurement apparatus according to a fifth embodiment.

As shown in FIG. 12, according to the fifth embodiment, when the second-A electrical path 82*a* extends along the longitudinal direction of the circuit board 72 towards the ASIC unit 50*a* side, the second-A electrical path 82*a* is wired so as to intersect the second-B electrical path 82*b* with which a pair is formed at a predetermined interval. That is, according to the fifth embodiment, because the alternating-current signal I flows in the lateral direction of the circuit board 72, an area that is formed between the second-A electrical path 82*a* and the second-B electrical path 82*b* that extend along the longitudinal direction of the circuit board 72 is the magnetic flux passage area S10. In addition, noise In that is an external signal arising from the inverter 30 flows through the bus bar 73 along the longitudinal direction thereof (longitudinal direction of the circuit board 72) as well, and the magnetic flux based on this noise passes through the magnetic flux passage area S10.

Therefore, as a result of the second-A electrical path 82*a* and the second-B electrical path 82*b* being made to intersect at a predetermined interval in a manner similar to that according to the second embodiment, the magnetic flux passage area S10 is divided into a first magnetic flux passage area S21 and a second magnetic flux passage area S22. The first magnetic flux passage area S21 is a first area that is surrounded by the second-A electrical path 82*a* that is arranged further towards the positive-electrode-side power supply terminal 71*a* side than the second-B electrical path 82*b* is, and the second-B electrical path 82*b* that is arranged further towards the negative-electrode-side power supply terminal 71*b* side than the second-A electrical path 82*a* is. The second magnetic flux passage area S22 is a second area that is surrounded by the second-A electrical path 82*a* that is arranged further towards the negative-electrode-side power supply terminal 71*b* side than the second-B electrical path 82*b* is, and the second-B electrical path 82*b* that is arranged further towards the positive-electrode-side power supply terminal 71*a* side than the second-A electrical path 82*a* is.

In addition, based on reasoning similar to that according to the second embodiment, phases of the induced electromotive force that is based on the magnetic flux that passes through the first magnetic flux passage area S21 and the induced electromotive force that is based on the magnetic flux that passes through the second magnetic flux passage area S22 are shifted by 180 degrees. That is, the induced electromotive forces are generated so as to be canceled out.

Furthermore, the magnitude of the induced electromotive force is dependent on the magnitude of the magnetic flux (more precisely, the magnitude of the amount of change over time in the magnetic flux) that passes through each of the first magnetic flux passage area S21 and the second magnetic flux passage area S22. Therefore, the size of each second magnetic flux passage area S22 is set based on the size of each first magnetic flux passage area S21 such that the difference between the first magnetic flux that passes through the first magnetic flux passage area S21 and the second magnetic flux that passes through the second magnetic flux passage area S22 is within the magnetic-flux allowable value range that includes zero. That is, the size of the second magnetic flux passage area S22 is set based on the size of the first magnetic flux passage area S21 such that the sum of the induced electromotive force that is based on the magnetic flux that passes through the first magnetic flux passage area S21 and the induced electromotive force that is based on the magnetic flux that passes through the second magnetic flux passage area S22 is within the electromotive-force allowable value range.

For example, as a result of a quantity and the size of the first magnetic flux passage area S21 being about the same as those of the second magnetic flux passage area S22, and the first magnetic flux passage area S21 and the second magnetic flux passage area S22 being arranged at even intervals, the induced electromotive force is more easily set within the electromotive-force allowable value range. In addition, the relative positions of the first electrical path 81 and the first magnetic flux passage area S21, and the relative positions of the first electrical path 81 and the second magnetic flux passage area S22 are also set such that the induced electromotive force is more easily set within the electromotive-force allowable value range. At this time, the quantity and the size of the first magnetic flux passage area S21, the quantity and the size of the second magnetic flux passage area S22, the relative positions of the first electrical path 81 and the first magnetic flux passage area S21, and the relative positions of the first electrical path 81 and the second magnetic flux passage area S22 are preferably fixed. As a result, the setting being changed and the induced electromotive force varying can be suppressed.

Here, the circuit board 72 is arranged so as to be come into contact with the set-up surface of the power supply terminals 71 in a manner similar to that according to the fourth embodiment. The magnetic flux passage area S10 is very small in the protruding direction of the power supply terminals 71. Therefore, as a result of the above-described configurations being used in combination, the generation of induced electromotive force can be further suppressed.

Sixth Embodiment

Next, the battery measurement apparatus 50 according to the fourth embodiment or the fifth embodiment may be modified in a following manner. Hereafter, sections among the embodiments that are identical or equivalent are given the same reference numbers. Descriptions of sections having the same reference numbers are applicable therebetween. In addition, according to a sixth embodiment, as a basic configuration, the basic configuration according to the fourth embodiment will be described as an example.

Figure 13:
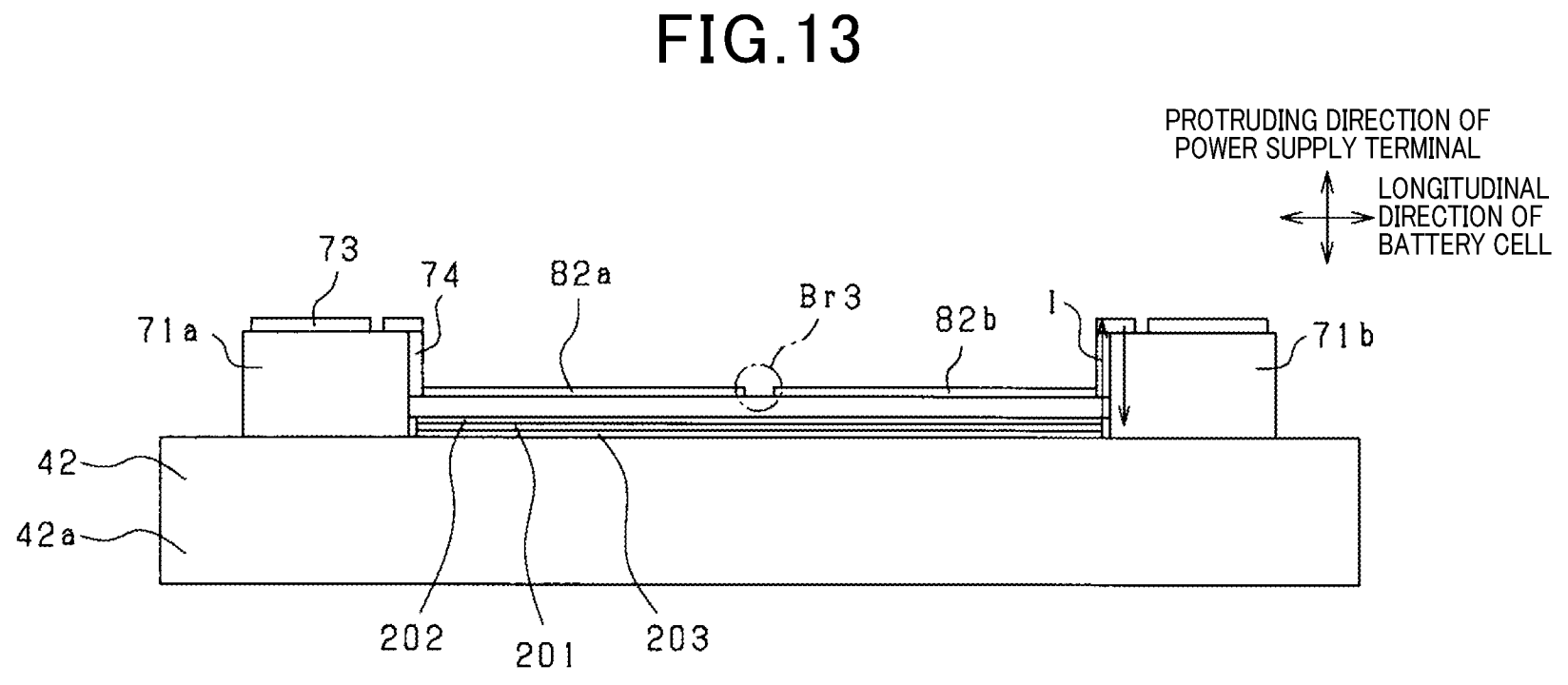

As shown in FIG. 13, a thin plate-shaped magnetic shield 201 is arranged between the circuit board 72 and the housing case 42*a*. The magnetic shield 201 is provided with insulating films 202 and 203 on both front and rear surfaces, and insulation is ensured between the circuit board 72 and the magnetic shield 201, and between the housing case 42*a* and the magnetic shield 201. In addition, the circuit board 72 is in contact with the magnetic shield 201 with the insulating film 202 therebetween. Furthermore, the magnetic shield 201 is in contact with the housing case 42*a* with the insulating film 203 therebetween. Moreover, the circuit board 72 is arranged between the tip ends of the power supply terminals 71 and the housing case 42*a* in the protruding direction of the power supply terminals 71.

The magnetic shield 201 is perforated metal in which a plurality of through holes are formed. Here, the magnetic shield 201 may be formed into a mesh shape or a lattice shape by metal wires. In addition, through holes may be provide along the electrical paths 81 and 82. Combinations of the foregoing are also possible.

As a result, the magnetic flux that passes through the magnetic flux passage area S10 that extends along the longitudinal direction of the circuit board 72 can be suppressed. The induced electromotive force can be suppressed and the response signal can be accurately detected. In addition, because the circuit board 72 is in contact with the magnetic shield 201 with the insulating film 202 therebetween, heat can be released through the magnetic shield 201.

In addition, the magnetic shield 201 is perforated metal that is provided with a plurality of through holes. Therefore, increase in electrostatic capacitance between the first electrical path 81 and the magnetic shield 201, and between the second electrical path 82 and the magnetic shield 201 can be suppressed.

Seventh Embodiment

Next, the battery measurement apparatus 50 according to any of the fourth embodiment to sixth embodiment may be modified in a following manner. Hereafter, sections among the embodiments that are identical or equivalent are given the same reference numbers. Descriptions of sections having the same reference numbers are applicable therebetween. In addition, according to a seventh embodiment, as a basic configuration, the basic configuration according to the fourth embodiment will be described as an example.

In general, the battery cell 42 is provided with an explosion-proof valve that opens and releases internal pressure when the internal pressure of the battery cell 42 becomes equal to or greater than a predetermined amount. Space for the explosion-proof valve to open is required, and the explosion-proof valve being covered by the circuit board 72 so as not to be capable of opening is not appropriate. Therefore, the configuration is as follows.

Figure 14:
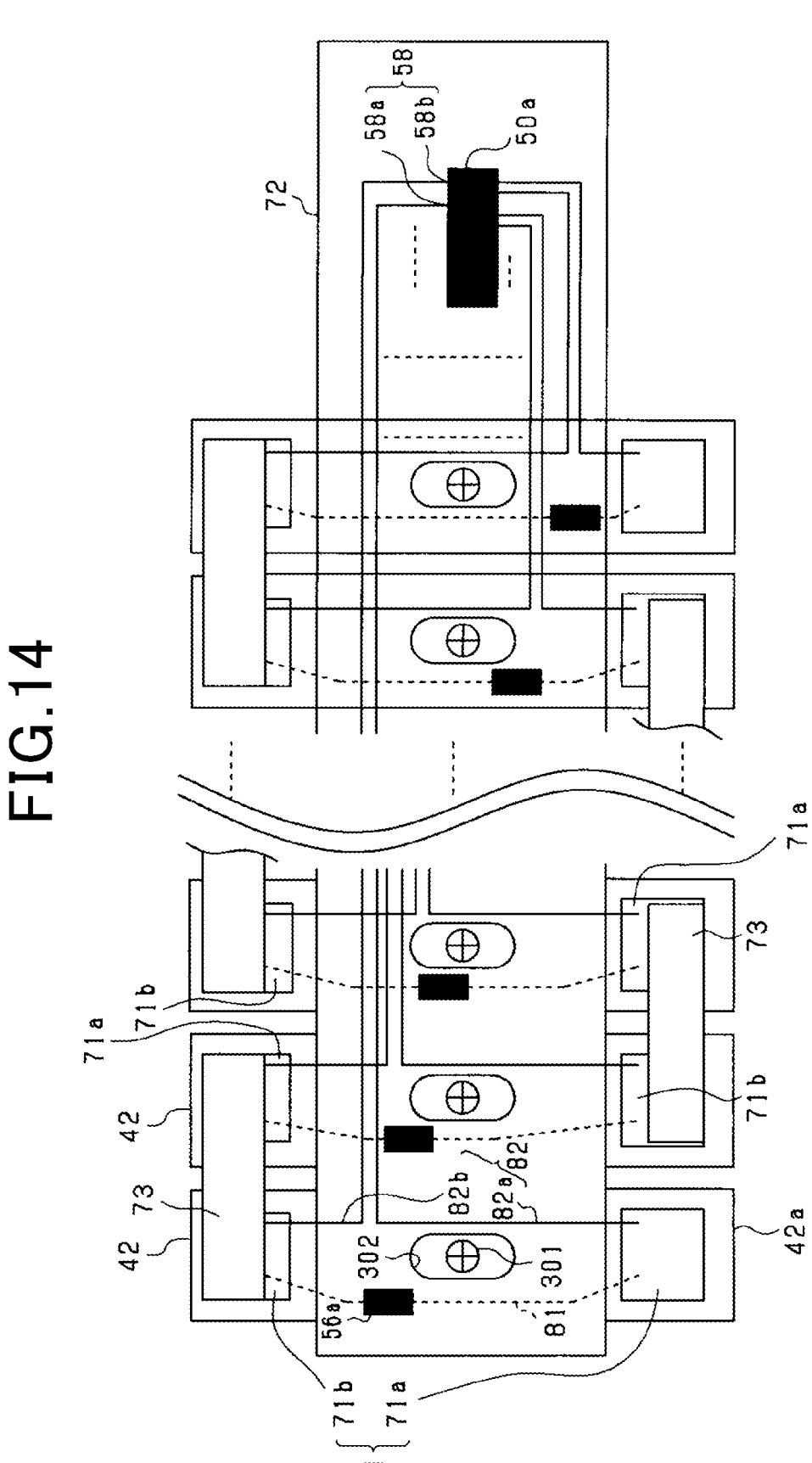
FIG. 14 is a side view of a battery measurement apparatus according to a seventh embodiment.

As shown in FIG. 14, in each battery cell 42, an explosion-proof valve 301 is provided on the set-up surface of the power supply terminals 71 between the positive-electrode-side power supply terminal 71*a* and the negative-electrode-side power supply terminal 71*b* in the longitudinal direction of the battery cell 42. In addition, a through hole 302 is provided in the circuit board 72 so as to avoid the explosion-proof valve 301. That is, the through hole 302 is provided in the circuit board 72 to ensure space for the explosion-proof valve 301 to open.

Here, the elements and the electrical paths that are arranged on the circuit board 72 are arranged so as to avoid the through hole 302. In addition, when the magnetic shield 201 is arranged according to the sixth embodiment, a through hole is also required to be similarly provided in the magnetic shield 201 so as to avoid the explosion-proof valve 301.

The ASIC unit 50*a* that has a large arrangement space is arranged in a longitudinal direction end portion of the circuit board 72 and is not arranged directly above the battery cell 42. Therefore, provision of the through hole 302 for avoiding the explosion-proof valve 301 is facilitated.

Eighth Embodiment

Next, the battery measurement apparatus 50 according to any of the fourth embodiment to sixth embodiment may be modified in a following manner. Hereafter, sections among the embodiments that are identical or equivalent are given the same reference numbers. Descriptions of sections having the same reference numbers are applicable therebetween. In addition, according to an eighth embodiment, as a basic configuration, the basic configuration according to the fourth embodiment will be described as an example.

In general, because the battery cell 42 is provided with an explosion-proof valve, space for the explosion-proof valve to open is required. Therefore, the configuration is as follows.

Figure 15:
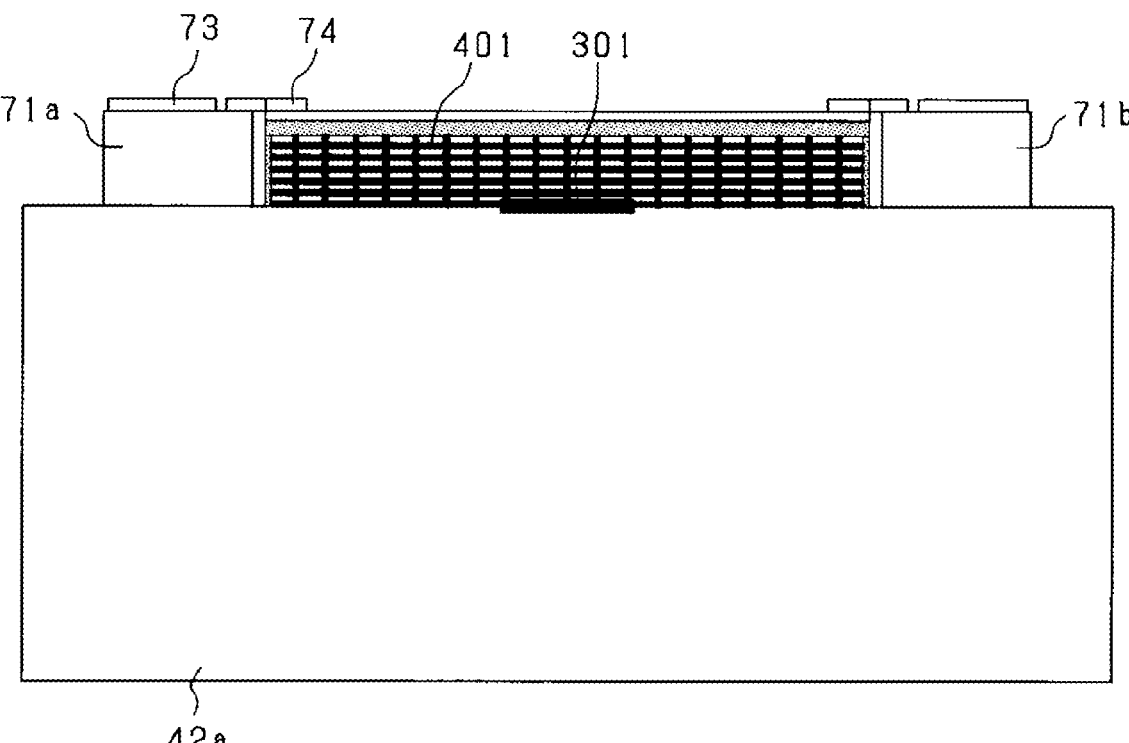
FIG. 15 is a side view of a battery measurement apparatus according to an eighth embodiment.

As shown in FIG. 15, in each battery cell 42, the explosion-proof valve 301 is provided on the set-up surface of the power supply terminals 71 between the positive-electrode-side power supply terminal 71*a* and the negative-electrode-side power supply terminal 71*b* in the longitudinal direction of the battery cell 42. In addition, the circuit board 72 is arranged so as to be separated by a predetermined distance from the set-up surface of the power supply terminals 71 in the housing case 42*a*, that is, the explosion-proof valve 301. The predetermined distance is a distance that is sufficient to ensure space for the explosion-proof valve 301 to open. Here, the predetermined distance is preferably a distance that is sufficient to at least ensure the space for the explosion-proof valve 301 to open. As a result, the explosion-proof valve 301 can be opened.

In a configuration such as this, the distance between the second electrical path 82 and the housing case 42*a* becomes farther in the protruding direction of the power supply terminals 71, and the magnetic flux passage area S10 becomes larger. As a result, the induced electromotive force may increase.

Figure 16:
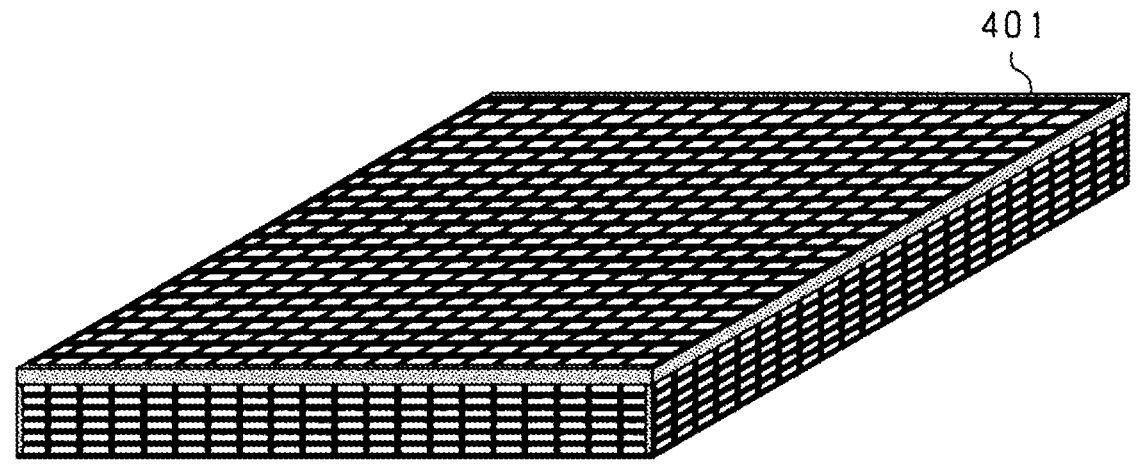
FIG. 16 is a perspective view of a shield member.

Therefore, a shield member 401 that covers the magnetic flux passage area S10 from the housing case 42*a* side is provided between the circuit board 72 and the housing case 42*a*. As shown in FIG. 16, the shield member 401 is formed into a rectangular cage shape in which strip-like metal wires are woven.

A bottom surface of the shield member 401 is formed into a rectangular shape along the longitudinal direction of the circuit board 72. That is, the bottom surface of the shield member 401 is formed so as to extend in the lateral direction of the battery cell 42 over the plurality of battery cells 42. A wall portion is erected on an outer edge of the bottom surface of the shield member 401 so as to extend in the protruding direction of the power supply terminal 71. The shield member 401 is arranged between the power supply terminals 71 such that an opening portion side of the shield member 401 opposes the housing case 42a. Here, the shield member 401 is not required to be cage-shaped and is merely required to have a plurality of through holes in the bottom portion and the wall portion.

The shield member 401 is arranged between the power supply terminals 71 in the longitudinal direction of the battery cells 42. The circuit board 72 is arranged from the outer side on the bottom surface of the shield member 401.

As a result of a configuration such as that above, the magnetic flux passage area S10 that extends in the planar shape of the circuit board 72 is covered by the bottom surface of the shield member 401. The magnetic flux passage area S10 that extends in the planar shape of the circuit board 72 refers to an area that is formed between the second-A electrical path 82a and the second-B electrical path 82b that form a pair and extend along the longitudinal direction of the circuit board 72.

In addition, in the magnetic flux passage area S10 that extends in the vertical direction of the circuit board 72, passage of the magnetic flux is suppressed by the bottom portion and the wall portion of the shield member 401. For example, the magnetic flux passage area S10 that extends in the vertical direction of the circuit board 72 refers to an area that is surrounded by the second electrical path 82 that extends along the lateral direction of the circuit board 72, the housing case 42a and the power supply terminals 71.

As a result, the induced electromotive force being generated in the second electrical path 82 can be suppressed and detection accuracy regarding the response signal can be improved.

Furthermore, because the circuit board 72 comes into contact with the shield member 401, heat can be released through the shield member 401. In addition, the shield member 401 is formed into a cage shape, and the opening portion thereof is arranged on the housing case 42a side. Therefore, the shield member 401 does not obstruct the opening of the explosion-proof valve 301. Moreover, because the plurality of through holes are provided on the wall portion of the shield member 401, gas that is discharged through the explosion-proof valve 301 can be released from the wall portion of the shield member 401.

In addition, because the plurality of through holes are provided in the bottom surface of the shield member 401, increase in electrostatic capacitance between the first electrical path 81 and the shield member 401, and between the second electrical path 82 and the shield member 401 can be suppressed.

Ninth Embodiment

Next, the battery measurement apparatus 50 according to any of the fourth embodiment to eighth embodiment may be modified in a following manner. Hereafter, sections among the embodiments that are identical or equivalent are given the same reference numbers. Descriptions of sections having the same reference numbers are applicable therebetween. In addition, according to a ninth embodiment, as a basic configuration, the basic configuration according to the fourth embodiment will be described as an example.

Figure 17A:
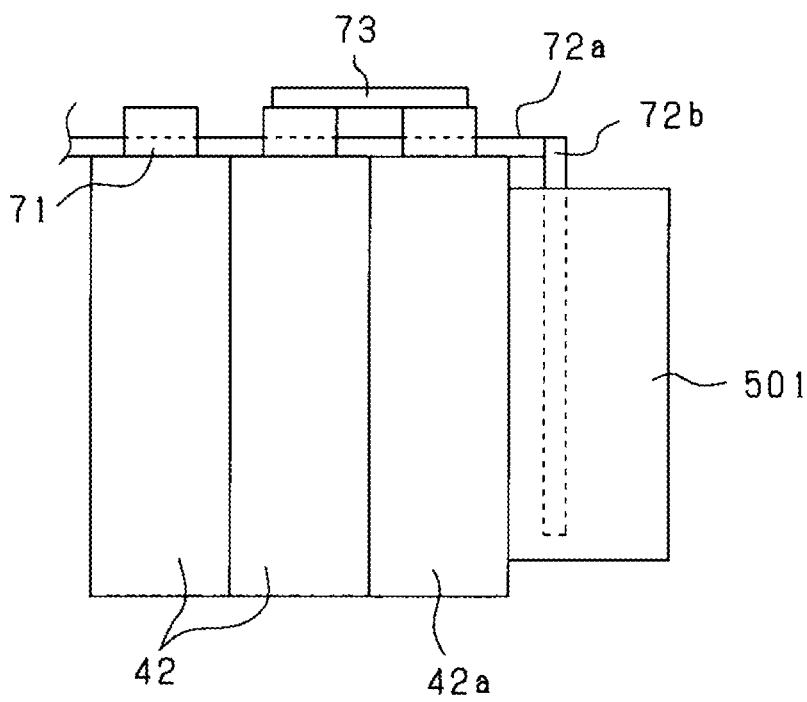
FIG. 17A is a side view of a circuit board and a battery cell according to a ninth embodiment.

As shown in FIG. 17, the circuit board 72 according to the fourth embodiment is formed such that the end portion is bent in the longitudinal direction (the lateral direction of the battery cell 42). According to the fourth embodiment, of the circuit board 72, a portion that opposes an upper surface of the battery cell 42 and is arranged between the power supply terminals 71 of the battery cell 42 is a first board 72a and the end portion that is bent is a second board 72b. However, the 90-degree bend according to the present embodiment is an example and the circuit board 72 may be bent at an arbitrary angle.

Here, according to the present embodiment, the circuit board 72 may be configured to be composed of an FPC and formed so as to be bent, or the first board 72a and the second board 72b may each be provided, and an electrical path may be connected by a connector, an FPC, or the like. Here, when the FPC is formed so as to be bent, the first board 72a and the second board 72b are not separate boards that are physically divided, but rather, the same board. However, for convenience of description, the FPC that is formed so as to be bent is referred to as the first board 72a and the second board 72b.

The second board 72b that is bent is perpendicular to a plane of the first board 72a and is arranged so as to oppose a side surface of the battery cell 42. Therefore, the second electrical path 82 and the ASIC unit 50a that are arranged in the end portion of the circuit board 72 are not on the same plane as the first electrical path 81, the current modulation circuit 56, and the like. In addition, when the ASIC unit 50a is not on the same plane as the first electrical path 81 and the like, the electrical path and the ASIC unit 50a on the second board 72b are affected by a magnetic flux density vector that is based on the alternating-current signal in a manner that differs from that when the first electrical path 81 and the second electrical path 82 are on the same plane.

Therefore, a cylindrical portion 501 that serves as a shield member is provided so as to surround a periphery of the second board 72b. Specifically, the cylindrical portion 501 is provided in a square cylindrical shape by a conductor that is composed of metal, resin, carbon, or the like, and the second board 72b is housed inside the cylindrical portion 501. As a result, effects of the magnetic flux density vector that is based on the alternating-current signal can be suppressed. Effects of an external magnetic field and the like on the ASIC unit 50a can also be suppressed. Calculation accuracy regarding the complex impedance can be improved.

In addition, as a result of the second board 72b being bent so as to be perpendicular to the plane of the first board 72a, compared to when the second board 72b is provided on the same plane, a distance in the longitudinal direction can be shortened. Furthermore, as a result of the second board 72b being arranged so as to oppose the side surface of the battery cell 42, size reduction can be achieved.

Figure 17B:
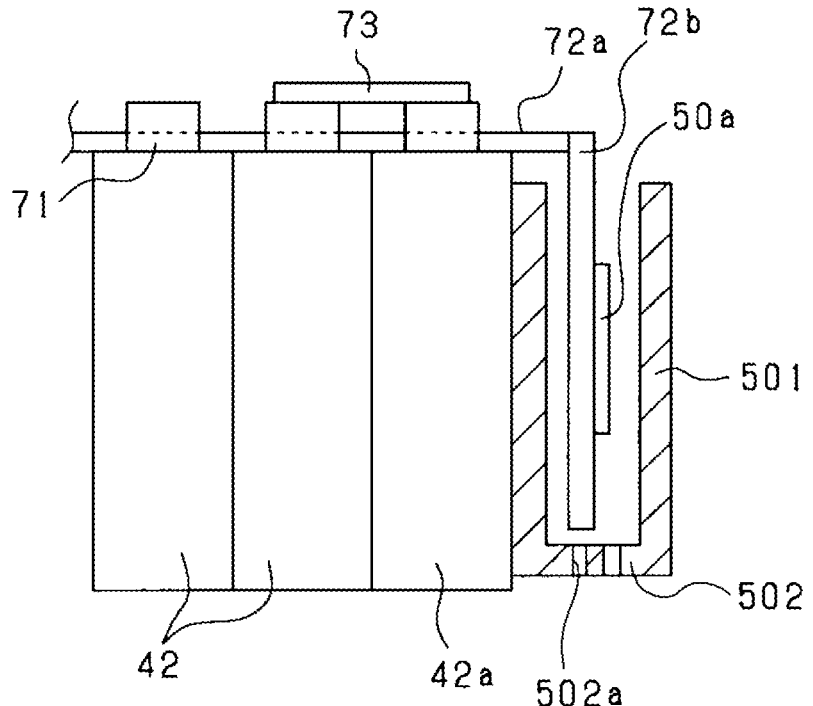
FIG. 17B is a cross-sectional view of a cylindrical portion.

Here, as shown in FIG. 17B, while an upper portion (the power supply terminal 71 side) of the cylindrical portion 501 is an open end, a bottom portion 502 is formed in a lower portion (a bottom surface side of the battery cell 42). The bottom portion 502 is provided with a through hole 502a that passes through in the up/down direction. The cylindrical portion 501 is configured such that air flows in the up/down direction. Consequently, heat discharge of the second board 72b can be favorably performed.

Moreover, according to this embodiment, the cylindrical portion 501 and the housing case 42a of the battery cell 42 are configured as separate bodies. However, a portion thereof may be shared. For example, a surface on the housing case 42a side of the cylindrical portion 501 may be shared as a surface on the cylindrical portion 501 side of the housing case 42a. In addition to the housing case 42a of the battery cell 42, a portion of a housing case (power supply case) of the assembled battery 40 may be shared with a portion of the cylindrical portion 501. Consequently, size reduction can be achieved.

Tenth Embodiment

Next, the battery measurement apparatus 50 according to any of the first embodiment to ninth embodiment may be modified in a following manner. Hereafter, sections among the embodiments that are identical or equivalent are given the same reference numbers. Descriptions of sections having the same reference numbers are applicable therebetween. In addition, according to a tenth embodiment, as a basic configuration, the basic configuration according to the first embodiment will be described as an example. The battery measurement apparatus 50 according to the tenth embodiment performs so-called dual-phase lock-in detection.

Figure 18:
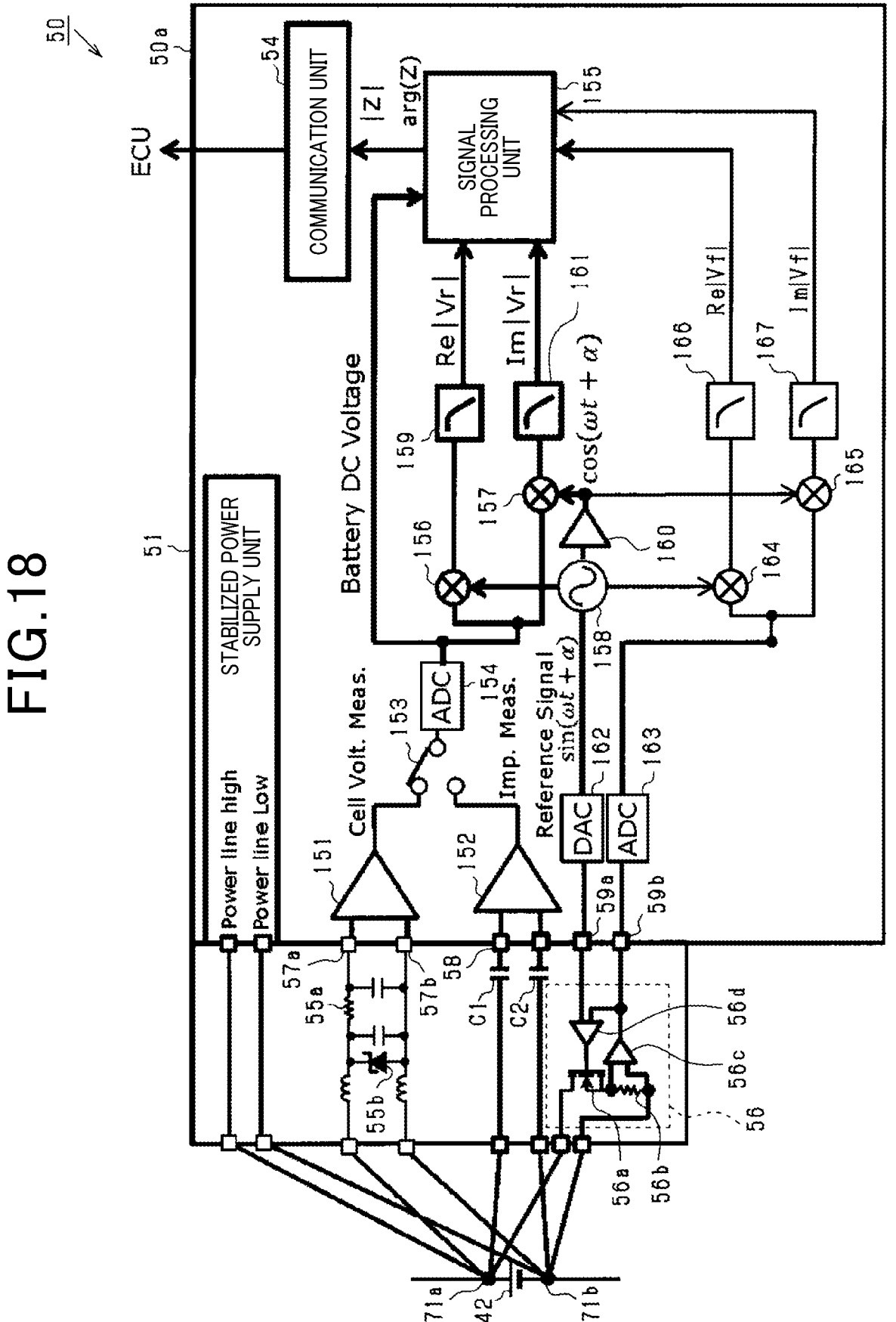
FIG. 18 is a configuration diagram illustrating a battery measurement apparatus according to a tenth embodiment.

As shown in FIG. 18, a differential amplifier 151 that measures a direct-current voltage across the terminals of the battery cell 42 is provided in the ASIC unit 50a of the battery measurement apparatus 50. The differential amplifier 151 is connected to the positive-electrode-side terminal 57a and the negative-electrode-side terminal 57b of the direct-current voltage input terminal 57, and is configured to measure the direct-current voltage and output the result.

In addition, a preamplifier 152 that serves as an amplifier that inputs the voltage variation of the battery cell 42 during output of the sine-wave signal through the response signal input terminal 58 is provided in the ASIC unit 50a of the battery measurement apparatus 50. The preamplifier 152 amplifies the voltage variation that is inputted through the response signal input terminal 58 and outputs the voltage variation as the response signal. That is, because an amplitude of the response signal is a weaker signal than the voltage of the battery cell 42, the preamplifier 152 is provided to improve the detection accuracy regarding the response signal. Here, according to the tenth embodiment, the preamplifier 152 is a single stage but may be multiple stages.

Furthermore, as shown in FIG. 18, a capacitor C1 for cutting a direct-current component is provided between the positive-electrode-side power supply terminal 71a of the battery cell 42 and the response signal input terminal 58 on the positive electrode side (positive-electrode-side terminal side of the preamplifier 152). As a result, of the voltage variation of the battery cell 42, the direct-current component (a portion that is not related to the internal complex impedance information) can be excluded. Detection accuracy regarding the response signal can be improved. A capacitor C2 is also similarly provided in the negative-electrode-side power supply terminal 72b of the battery cell 42.

In addition, a signal switching unit 153 that switches between the direct-current voltage that is outputted from the differential amplifier 151 and the response signal that is outputted from the preamplifier 152 is provide in the ASIC unit 50a. An AD converter 154 is connected to the signal switching unit 153 and configured such that the signal to which switching is performed (an analog signal) is converted to a digital signal and outputted.

The AD converter 154 is connected to a signal processing unit 155 that serves as a calculating unit according to the tenth embodiment and is configured to input the direct-current voltage. In addition, the AD converter 154 is connected to a first multiplier 156 and a second multiplier 157, and is configured to input each response signal.

An oscillating circuit 158, described hereafter, is connected to the first multiplier 156, and a first reference signal is inputted. The first multiplier 156 multiplies the first reference signal and the response signal, calculates a value that is proportional to the real part of the response signal, and outputs the value that is proportional to the real part of the response signal to the signal processing unit 155 through a low-pass filter 159. Here, in FIG. 18, the real part of the response signal is expressed by Re|Vr|.

The oscillating circuit 158 is connected to the second multiplier 157 with a phase shift circuit 160 therebetween, and a second reference signal is inputted. The second reference signal is a signal in which a phase of the first reference signal is advanced by 90 degrees ($\omega/2$). The phase shift circuit 160 advances a phase of a sine-wave signal (first reference signal) that is inputted from the oscillating circuit 158 and outputs the signal as the second reference signal.

The second multiplier 157 multiplies the second reference signal and the response signal, calculates a value that is proportional to an imaginary part of the response signal, and outputs the value that is proportional to the imaginary part of the response signal to the signal processing unit 155 through a low-pass filter 161. Here, in FIG. 18, the imaginary part of the response signal is expressed by Im|Vr|.

The oscillating circuit 158 is a circuit that outputs the sine-wave signal that is set and functions as a waveform indicating unit. As described above, the oscillating circuit 158 outputs the sine-wave signal as the first reference signal to the first multiplier 156 and the phase shift circuit 160. In addition, the oscillating circuit 158 is connected to the instruction signal output terminal 59a with a DA converter 162 therebetween, and outputs the sine-wave signal as the instruction signal.

The feedback signal input terminal 59b is connected to an AD converter 163. The feedback signal input terminal 59b is connected to the signal processing unit 155 through the AD converter 163. The signal processing unit 155 inputs the feedback signal from the feedback signal input terminal 59b through the AD converter 163.

Furthermore, the AD converter 163 is connected to a third multiplier 164 and a fourth multiplier 165, and is configured to input each feedback signal (detection signal). The third multiplier 164 is connected to the oscillating circuit 158 and the first reference signal is inputted. The third multiplier 164 multiplies the first reference signal and the feedback signal, calculates a value that is proportional with the real part of the feedback signal, and outputs the value that is proportional to the real part of the feedback signal to the signal processing unit 155 through a low-pass filter 166. Here, in FIG. 18, the real part of the feedback signal is expressed by Re|Vf|.

The fourth multiplier 165 is connected to the oscillating circuit 158 with the phase shift circuit 160 therebetween, and the second reference signal is inputted. The fourth multiplier 165 multiplies the second reference signal and the feedback signal, calculates a value that is proportional to the imaginary part of the feedback signal, and outputs the value that is proportional to the imaginary part of the feedback signal to the signal processing unit 155 through a low-pass filter 167. Here, in FIG. 18, the imaginary part of the feedback signal is expressed by Im|Vf|. That is, lock-in detection of the feedback signal is performed.

The signal processing unit 155 inputs the value that is proportional to the real part of the response signal and the value that is proportional to the imaginary part of the response signal, and based on these values, calculates the real part and the imaginary part of the complex impedance. At this time, the signal processing unit 155 calculates (corrects) the real part and the imaginary part of the complex impedance using the inputted real part and imaginary part of the feedback signal, and taking into consideration the amplitude of the signal that actually flows, and the phase shift from the reference signal.

Furthermore, the signal processing unit 155 calculates the absolute value and the phase of the complex impedance. Specifically, through dual-phase lock-in detection, the real part and the imaginary part of the response signal are known. Therefore, when the phase of the response signal is θv, an expression such as Vr|eˆjθv is possible on a polar coordinate display of a complex plane. In a similar manner, the current can be expressed as shown in |I|eˆjθi. When the polar coordinate display of the complex impedance is |Z|eˆjθz from the foregoing, an expression such as numeric expression (2) is possible from V=ZI. In addition, "j" is an imaginary unit that satisfies jˆ2=−1.

$$|Z|e^{j\theta_z} = \frac{|Vr|e^{j\theta_v}}{|I|e^{j\theta_i}} \qquad (2)$$

Therefore, the absolute value of the complex impedance can be determined from |Z|=|Vr|/|I| and the phase can be determined from θv-θi. In addition, the signal processing unit 155 outputs a calculation result to the ECU 60 through the communication unit 54. Here, in FIG. 18, the absolute value of the complex impedance is expressed by |Z| and the phase thereof is expressed by arg(Z).

Figure 19:
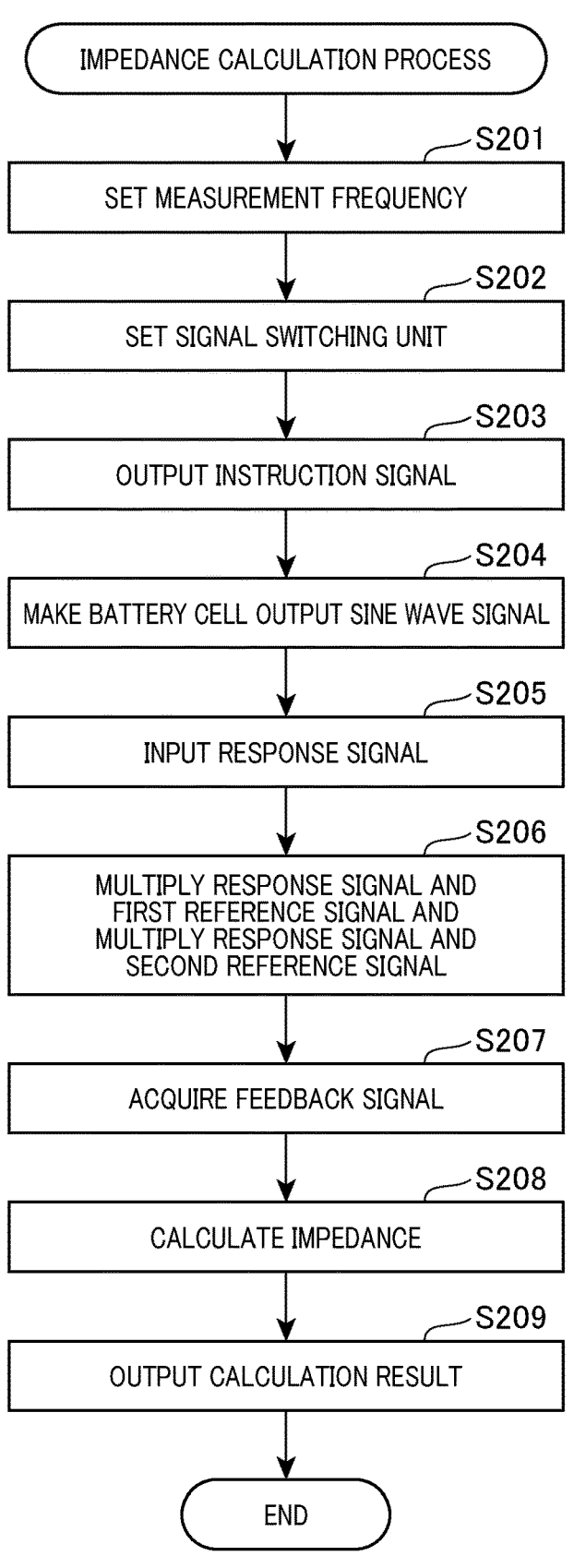
FIG. 19 is a flowchart illustrating an impedance calculation process according to the tenth embodiment.

Next, a complex impedance calculation process according to the tenth embodiment will be described with reference to FIG. 19. The complex impedance calculation process is performed by the battery measurement apparatus 50 at every predetermined cycle.

In the complex impedance calculation process, first, the oscillating circuit 158 sets the measurement frequency of the complex impedance (step S201). The measurement frequency is set among frequencies that are within a measurement range that is determined in advance. According to the tenth embodiment, for example, the measurement frequency may be determined by the signal processing unit 155.

Next, the signal switching unit 153 performs switching such that the response signal from the preamplifier 152 is outputted (step S202). For example, an instruction for switching may be provided by the signal processing unit 155.

Next, the oscillating circuit 158 determines the frequency of the sine-wave signal (predetermined alternating-current signal) based on the measurement frequency, and outputs an instruction signal that instructs output of the sine-wave signal to the current modulation circuit 56 from the instruction signal output terminal 59a, through the DA converter 162 (step S203). Here, for example, the output instruction for the instruction signal may be performed by the signal processing unit 155. When conversion to the analog signal is performed by the DA converter 162, an appropriate offset value (direct-current bias) is set taking into consideration the voltage of the battery cell 42 and the conversion is performed. For example, the setting of the offset signal (direct-current bias) may be performed by the signal processing unit 155. The setting of the offset value (direct-current bias) is preferably performed based on the direct-current voltage of the battery cell 42. Here, the direct-current voltage of the battery cell 42 may be measured by the differential amplifier 151.

The current modulation circuit 56 causes the battery cell 42 to output the sine-wave signal (alternating-current signal I) as a power supply, based on the instruction signal (step S204). As a result, the sine-wave signal (alternating-current signal I) is outputted from the battery cell 42.

When the battery cell 42 is made to output the sine-wave signal, a voltage variation that reflects the internal complex impedance information of the battery cell 42 is generated between the terminals of the battery cell 42. The preamplifier 152 inputs the voltage variation through the response signal input terminal 58 and outputs the voltage variation as the response signal (step S205).

Here, during input to the response signal input terminal 58, the direct-current component of the voltage variation is cut by the capacitors C1 and C2, and only a characteristic portion of the voltage variation is extracted. In addition, the preamplifier 152 amplifies the weak voltage variation from which the direct-current component has been removed and outputs the amplified voltage variation as the response signal. At this time, the AD converter 154 converts the response signal that is inputted through the signal switching unit 153 to a digital signal and outputs the digital signal. A magnitude of the direct-current component that is cut by the capacitors C1 and C2 is preferably adjusted based on the direct-current voltage of the battery cell 42. In a similar manner, an extent to which the voltage variation is amplified is preferably adjusted based on the direct-current voltage of the battery cell 42.

The first multiplier 156 multiplies the response signal that is inputted from the AD converter 154 with the sine-wave signal that is inputted from the oscillating circuit 158 as the first reference signal, and calculates the value that is proportional to the real part of the response signal (step S206). In a similar manner, the second multiplier 157 multiplies the second reference signal that is inputted from the phase shift circuit 160 and the response signal, and calculates the value that is proportional to the imaginary part of the response signal.

These values are inputted to the signal processing unit 155 through the low-pass filter 159 and the low-pass filter 161. Here, during passage through the low-pass filter 159 and the low-pass filter 161, signals other than the direct-current component (DC component) are attenuated and removed.

The signal processing unit 155 inputs the feedback signal (detection signal) from the feedback signal input terminal 59b (step S207). Specifically, the real part and the imaginary part of the feedback signal that have been lock-in detected is inputted.

The signal processing unit 155 calculates all or any of the real part, the imaginary part, the absolute value, and the phase of the complex impedance based on the feedback signal and the signals (proportional values of the real part and the imaginary part) that are inputted from the low-pass filters 159 and 161 (step S208). The feedback signal is used to correct a shift in amplitude or phase between the current that actually flows from the battery cell 42 (that is, the feedback signal) and a value that is proportional to the reference signal.

Subsequently, the signal processing unit 155 outputs the calculation result to the ECU 60 through the communication unit 54 (step S209). Then, the calculation process is ended.

This calculation process is repeatedly performed until the complex impedances at a plurality of frequencies within the measurement range are calculated. The ECU 60 generates a complex impedance plane plot (Cole-Cole plot) based on the calculation results and ascertains characteristics of the electrodes, the electrolyte, and the like. For example, the ECU 60 may ascertain the charging state (SOC) and the degradation state (SOH).

Here, the overall Cole-Cole plot is not necessarily required to be generated, and focus may be placed on only a section thereof. For example, the complex impedance at a certain frequency may be measured at a fixed time interval during traveling, and the changes in the SOC, the SOH, the battery temperature, and the like during traveling may be ascertained based on the changes over time in the complex impedance at the certain frequency. Alternatively, the complex impedance at a certain frequency may be measured at a time interval such as every day, every week, or every year, and the changes in the SOH and the like may be ascertained based on the changes over time in the complex impedance at the certain frequency.

In the battery measurement apparatus 50 according to the tenth embodiment, the following effects are achieved.

The signal processing unit 155 calculates the value that is proportional to the real part of the response signal based on the value that is obtained by multiplying the response signal that is inputted from the response signal input terminal 58 and the first reference signal. In addition, the signal processing unit 155 calculates the value that is proportional to the imaginary part of the response signal based on the value that is obtained by multiplying the response signal and the second reference signal, the signal in which the phase of the sine-wave signal is shifted serving as the second reference signal. Furthermore, based on these values, the complex impedance is calculated. In this manner, as a result of so-called lock-in detection being performed, only the frequency component that is the same as the frequency of the sine-wave signal that is indicated by the oscillating circuit 158 can be extracted from the response signal. Therefore, resistance to white noise and pink noise is increased, and the complex impedance can be calculated with high accuracy. Noise increases particularly in the case of use in a vehicle. Therefore, the complex impedance can be favorably calculated. In addition, because resistance to noise is increased, the current (sine-wave signal) that is outputted from the battery cell 42 can be reduced. Consequently, power consumption and temperature increase in the battery cell 42 and the semiconductor switch 56a can be suppressed.

Furthermore, the signal processing unit 155 inputs the feedback signal (detection signal) that detects the current that actually flows from the battery cell 42 by the current modulation circuit 56, and corrects the shift in amplitude and phase from the value that is proportional to the reference signal. As a result, calculation accuracy of the complex impedance can be improved.

In addition, because the shift in amplitude and the phase is corrected, even should an error occur when the instruction signal is converted to an analog signal, the error can be suppressed through the correction based on the feedback signal. Consequently, a filter circuit or the like is not required to be provided between the current modulation circuit 56 and the DA converter 162. Size reduction can be achieved.

Other Embodiments

According to the above-described embodiments, the battery measurement apparatus 50 is provided for each battery module 41. However, for example, the battery measurement apparatus 50 may be provided for each battery cell 42, for each assembled battery 40, or the like. In addition, when the battery measurement apparatus 50 is provided for a plurality of battery cells 42, a portion of the functions of the battery measurement apparatus 50 may be shared.

Figure 20:
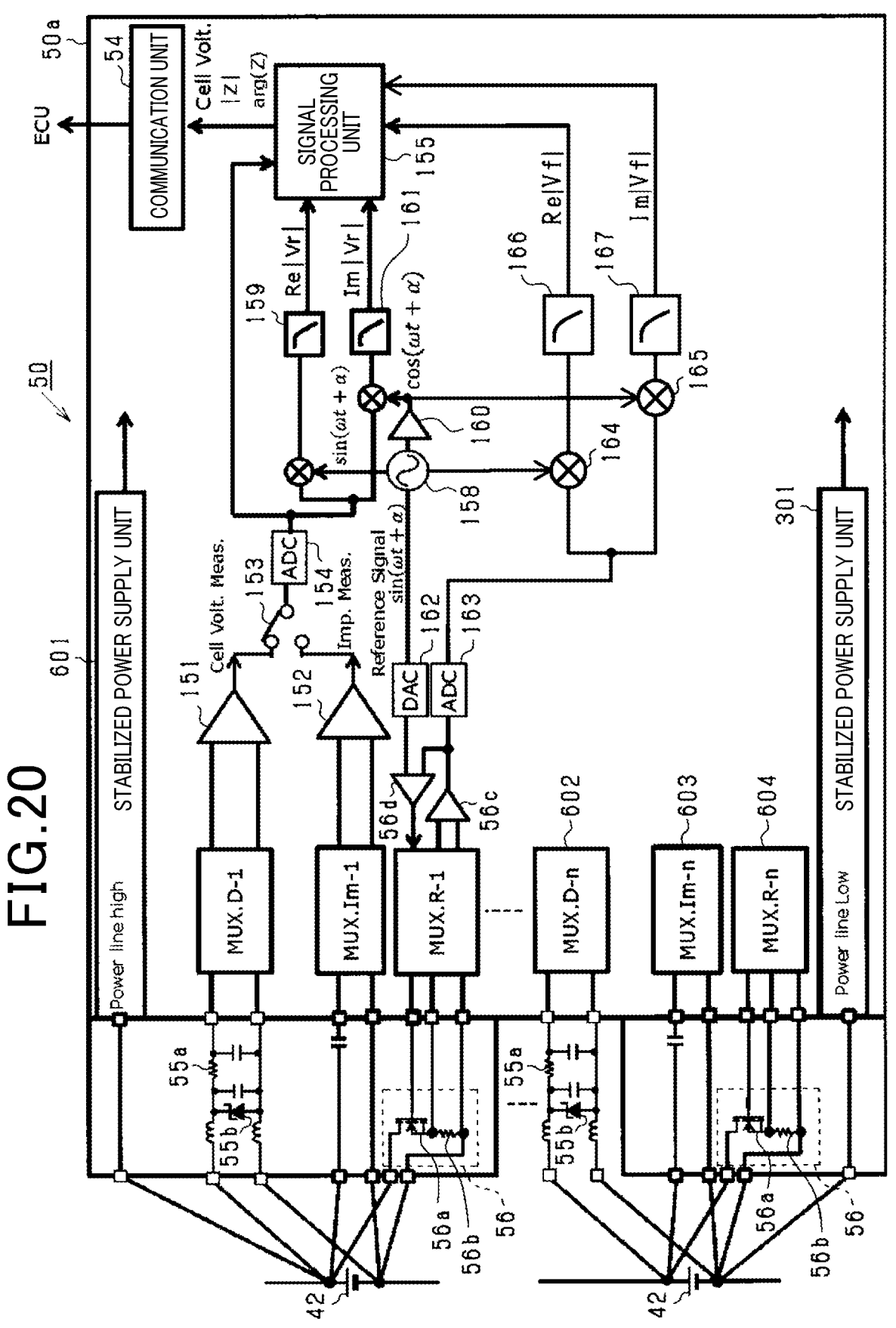
FIG. 20 is a configuration diagram illustrating the battery measurement apparatus in another example.

For example, as shown in FIG. 20, the stabilized power-supply supplying unit 601, the communication unit 54, the differential amplifier 151, the preamplifier 152, the signal switching unit 153, the AD converters 154 and 163, the signal processing unit 155, the multipliers 156, 157, 164, and 165, the low-pass filters 159, 161, 166, and 167, the oscillating circuit 158, the phase shift circuit 160, the DA converter 162, the feedback circuit 56d, the current detection amplifier 56c, and the like may be shared.

In this case, the configuration may be such that switching among various signals, such as the direct-current voltage, the response signal, and the instruction signal, can be performed by a multiplexing apparatus such as multiplexers 602 to 604. Here, in this case, an electric potential of the negative electrode may differ for each battery cell 42. Therefore, a reference potential of an electrical signal that is used to transmit information of each battery cell 42 may differ. Thus, calculation is required to be performed such that a function for inputting the electrical signals to the signal processing unit 155 taking into consideration this difference in reference potential is provided. As a means for transferring signals between differing reference potentials, there are methods that use a capacitor and a transistor, radio waves, or light.

According to the above-described embodiments, the filter unit 55 may not be configured by only an element. For example, the filter unit 55 may be configured by wiring, a connector contacting portion, or pattern wiring and between solid patterns on a printed board, or configured to include a combination of these configurations and the element.

According to the above-described embodiments, a filter circuit may be provided between the current modulation circuit 56 and the input/output unit 52 (or the DA converter 162). As a result, errors during conversion of the instruction signal to an analog signal can be suppressed.

According to the above-described embodiments, the feedback circuit 56d may not be provided. In addition, the current that flows to the resistor 56b may not be detected by the current detection amplifier 56c. Furthermore, the micro-computer unit 53 and the signal processing unit 155 may not input the feedback signal.

According to the above-described embodiments, the direct-current voltage is detected. However, the direct-current voltage may not be detected. In addition, according to the above-described embodiments, the signal switching unit 153 may not be provided. Furthermore, according to the above-described embodiments, the feedback signal may also be subject to switching by the signal switching unit 153. As a result, the AD converters 154 and 163 may be shared.

The battery measurement apparatus 50 according to the above-described embodiments may be used in a hybrid electric vehicle (HEV), an electric vehicle (EV), a plug-in hybrid vehicle (PHV), an auxiliary battery, an electric aircraft, an electric bicycle, or an electric ship, as vehicles. In addition, according to the above-described embodiments, the battery cells 42 may be connected in parallel.

According to the above-described tenth embodiment, to prevent aliasing during AD conversion, a filter circuit may be provided before or after the preamplifier 152 or immediately before the AD converter 154.

According to the above-described embodiments, the state may be measured in battery module 41 units. At this time, when the communication unit 54 is provided for each battery module 41, communication from each communication unit 54 to the ECU 60 may be isolated communication with differing potential standards. For example, isolated communication may be performed using an isolation transformer or a capacitor. In addition, the state may be measured in assembled battery 40 units.

According to the above-described embodiments, the current signal (alternating-current signal I) that is outputted from the battery cell 42 is not limited to the sine-wave signal. For example, as long as the signal is an alternating-current signal, the signal may be a rectangular-wave or a triangular-wave signal.

According to the above-described embodiments, the ECU 60 may be configured by a plurality of ECUs. For example, a plurality of ECUs may be provided for each function. Alternatively, a plurality of ECUs may be provided for each control subject. For example, the ECU may be divided into a battery ECU and an inverter control ECU.

According to the above-described embodiments, when lock-in detection is performed, the sine-wave signal that is indicated by the oscillating circuit 158 is the reference signal (first reference signal). However, the detection signal (feedback signal) may be the reference signal. In addition, when dual-phase lock-in detection is performed, the phase of the detection signal (feedback signal) may be shifted and the detection signal may be used as the second reference signal.

According to the above-described embodiments, the battery cell 42 (the battery module 41 or the assembled battery 40) may be used as a power supply for peripheral circuits when the sine-wave signal is outputted based on the instruction (during output of the response signal). Conversely, the battery cell 42 (the battery module 41 or the assembled battery 40) may be configured to not be used as a power supply for peripheral circuits when the sine-wave signal is outputted based on the instruction (during output of the response signal).

According to the above-described embodiments, when the electrical paths are wired on differing layers of the circuit board 72, the electrical paths are preferably wired so as to be shifted. Consequently, stray capacitance can be reduced.

According to the above-described embodiments, the alternating-current signal is outputted from the battery cell 42. However, the alternating-current signal may be inputted to the battery cell 42 from an external power supply and external disturbance may be applied. At this time, the alternating-current signal that is such that a charging charge amount and a discharging charge amount are equal may be inputted such that the charging state (SOC and the like) of the battery cell 42 does not change as a result of input of the alternating-current signal. Here, a difference may be set between the charging charge amount and the discharging charge amount, and the charging state of the battery cell 42 may be adjusted to be a desired value. When the battery measurement apparatus 50 is for a vehicle, the external power supply may be mounted in the vehicle or may be an apparatus outside the vehicle.

Figures 21A, 21B:
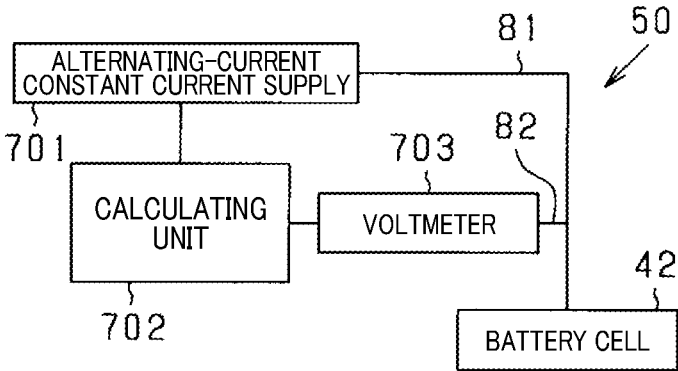
FIGS. 21A and 21B are configuration diagrams illustrating the battery measurement apparatus in another example.

For example, as shown in FIG. 21A, an alternating-current constant current supply 701 may be provided in the battery measurement apparatus 50, and an alternating-current constant current may be inputted to the battery cell 42 as the alternating-current signal. Then, a calculating unit 702 of the battery measurement apparatus 50 may input a response signal through a voltmeter 703 and calculate the impedance based on the alternating-current signal and the response signal.

In this case, as shown in FIG. 21B, an electrical path that connects the battery cell 42 and the alternating-current constant current supply 701 corresponds to the first electrical path 81. An electrical path that connects the battery cell 42 and the voltmeter 703 corresponds to the second electrical path 82. In addition, in this other example as well, as shown in FIG. 21B, wiring of the second electrical path 82 may be performed in a manner similar to that according to the above-described embodiments.

Figures 22A, 22B:
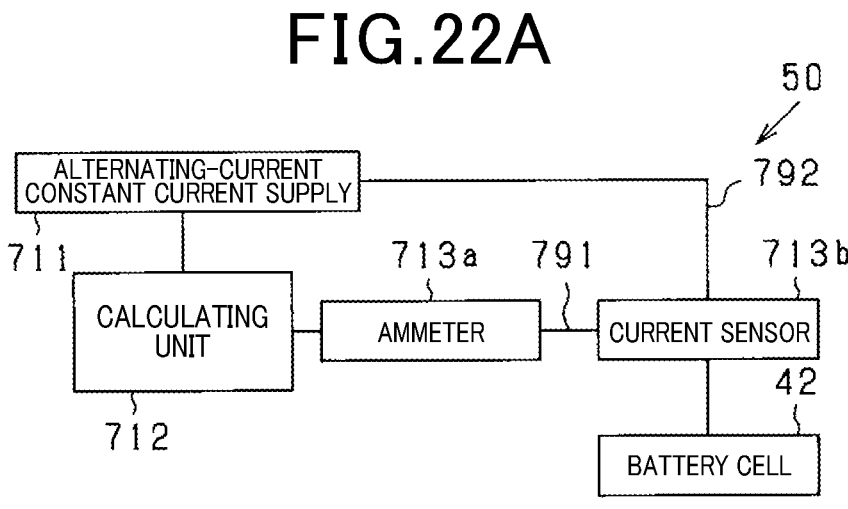
FIGS. 22A and 22B are configuration diagrams illustrating the battery measurement apparatus in another example.

Furthermore, for example, as shown in FIG. 22A, an alternating-current constant voltage supply 711 may be provided in the battery measurement apparatus 50, and an alternating-current constant voltage may be inputted to the battery cell 42 as the alternating-current signal. Then, a calculating unit 712 of the battery measurement apparatus 50 may input a response signal (voltage variation) through a voltmeter 713a and a current sensor 713b, and calculate the impedance based on the alternating-current signal and the response signal.

In this case, as shown in FIG. 22B, a voltage applying line 791 on which the current sensor 713b is provided corresponds to the first electrical path 81. A voltage sense line 792 that connects the battery cell 42 and the alternating-current constant voltage supply 711 corresponds to the second electrical path 82. In addition, in this other example as well, as shown in FIG. 22B, wiring of the voltage sense line 792 (second electrical path 82) may be performed in a manner similar to that according to the above-described embodiments. Here, all or a portion of the voltage application line 791 and the voltage sense line 792 may be covered by the same magnetic shield.

Figure 23:
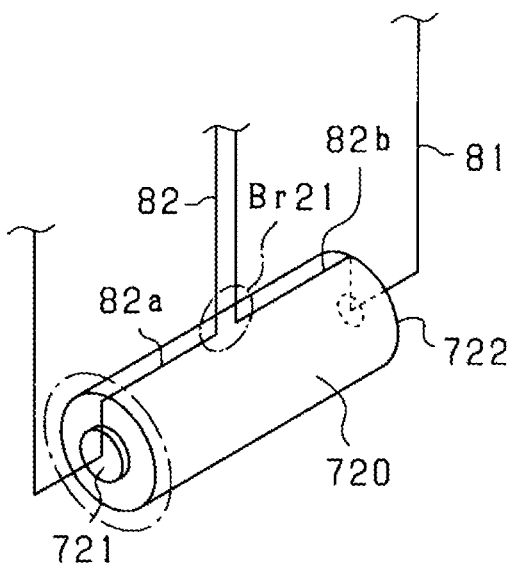
FIG. 23 is a configuration diagram illustrating the battery cell in another example.
Figure 24:
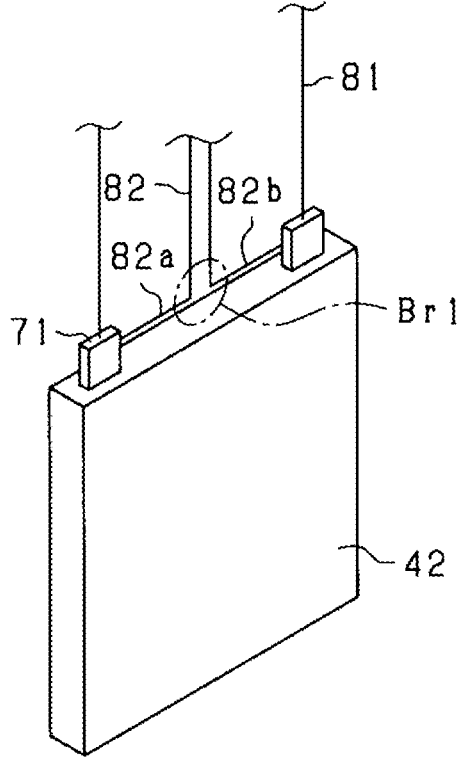
FIG. 24 is a configuration diagram illustrating the battery cell in another example.

According to the above-described embodiments, the shape of the battery cell 42 may be arbitrarily modified. For example, as shown in FIG. 23, application to a storage battery 720 that is configured to have a circular columnar shape and is provided with power supply terminals 721 and 722 on an upper surface and a lower surface is possible. In this case, as shown in FIG. 23, a branch point Br21 of the second electrical path 82 may be set on an outer circumferential surface of the storage battery 720, and wiring may be performed along the storage battery 720 from the branch point Br21. As shown in FIG. 24, this can be similarly applied to the battery cell 42 on a laminate side.

According to the above-described embodiments, in each battery cell 42, a magnetic shield that surrounds a periphery of the power supply terminal 71 may be provided on the set-up surface of the power supply terminal 71. The magnetic shield that is provided on the set-up surface of the power supply terminal 71 of the battery cell 42 is merely required to be provided in a wall shape so as to surround the power supply terminal 71, in a portion other than an inner side in the longitudinal direction of the battery cell 42 (that is, the side on which the circuit board 72 is arranged). In addition, a height of the magnetic shield is preferably equal to or less than the height of the power supply terminal 71 so as not to interfere with the bus bar 73. Furthermore, a magnetic shield that surrounds the periphery of the power supply terminal 71 may be provided on the circuit board 72. The magnetic shield that is provided on the circuit board 72 is merely required to be provided so as to surround the power supply terminal 71 from the inner side in the longitudinal direction of the battery cell 42.

According to the above-described embodiments, the electrical paths 81 and 82 may be fixed by a fixing member such as resin molding. As a result of fixing, the size of the magnetic flux passage area S10 changing can be suppressed. In addition, the relative positions of the electrical paths 81 and 82 changing can be suppressed. Consequently, the induced electromotive force can be suppressed from changing.

According to the above-described second embodiment, when the first magnetic flux passage area S11 and the second magnetic flux passage area S12 are divided, in either of the first magnetic flux passage area S11 and the second magnetic flux passage area S12, a member of which magnetic permeability differs from that of air may be arranged, and adjustment may be made such that a difference in the magnetic fluxes that pass is small.

According to the above-described second embodiment, the magnetic flux passage area S10 may be divided into three or more. In this case, the second electrical path 82 is made to intersect a plurality of times.

According to the above-described embodiments, when the first electrical path 81 can be freely arranged, the relative positions of the first electrical path 81 and the magnetic flux passage area S10 are preferably set such that the induced electromotive force is within the electromotive-force allowable value range.

According to the above-described first to third embodiments, the second-A electrical path 82a and the second-B electrical path 82b may be configured to be twisted until branching.

As a result, the induced electromotive forces are canceled out, and the induced electromotive force can be suppressed.

Figure 25:
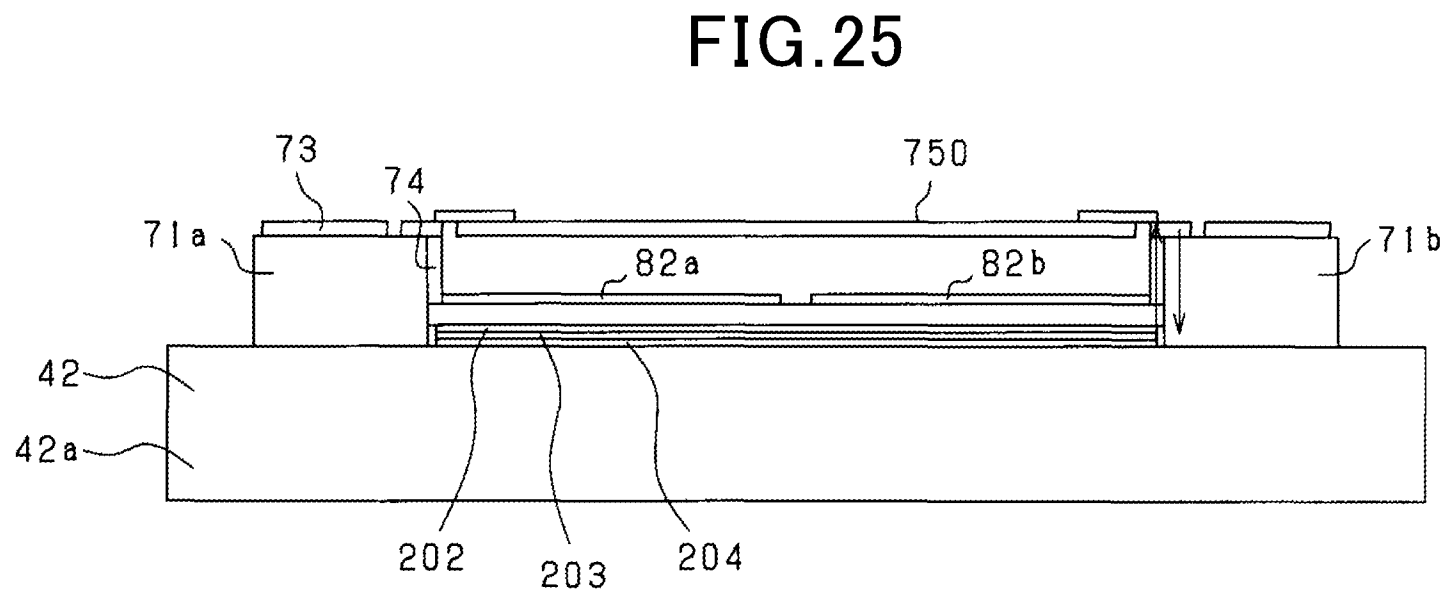

According to the above-described sixth embodiment, as shown in FIG. 25, a magnetic shield 750 that covers an upper surface of the circuit board 72 (a surface on a side opposite a lower surface that opposes the housing case 42a) may be provided.

According to the above-described ninth embodiment, a battery case that houses a plurality of battery cells 42 may be provided. In addition, the cylindrical portion 501 may be integrated in an end portion of the battery case. Furthermore, when a number of battery cells 42 is many, the cylindrical portions 501 may be arranged between the laminated battery cells 42.

According to the above-described embodiments, the battery measurement apparatus 50 may measure a state of a storage battery other than the onboard assembled battery 40.

According to the above-described fourth embodiment, the circuit board 72 may be arbitrarily bent.

According to the above-described ninth embodiment, a through hole may be formed in an arbitrary portion other than the bottom portion 502 of the cylindrical portion 501. For example, a through hole may be formed in a side surface of the cylindrical portion 501. In addition, a gap may be formed between the cylindrical portion 501 and the housing case 42a. As a result, cooling performance can be improved. Furthermore, the opening portion of the cylindrical portion 501 may be covered by a magnetic shield in which a through hole is formed. As a result, effects of noise can be suppressed.

According to the above-described embodiments, the method for measuring and calculating the amplitude, the phase, and the like of the complex impedance at a certain frequency is not limited to lock-in detection, and heterodyne detection, Fourier transform, and the like may be used.

According to the above-described embodiments, the calculating unit such as the microcomputer unit 53 is not required to calculate the absolute value and the phase of the complex impedance. The information related to the complex impedance may be calculated based on the response signal and the current signal, and outputted to an external apparatus such as the ECU 60. Here, for example, the information related to the complex impedance refers to interim status (such as only the real parts and the imaginary parts of the current and the voltage) that is required to calculate the absolute value, the phase difference, and the like of the complex impedance. Then, the external apparatus may calculate a final result, that is, the absolute value, the phase difference, and the like of the complex impedance.

According to the above-described second embodiment, the position of the branch point Br2 may be arranged between the power supply terminals 71 in the longitudinal direction and the lateral direction of the battery cell 42, and between the tip end positions of the power supply terminals 71 and the housing case 42a in the protruding direction.

Figure 26:
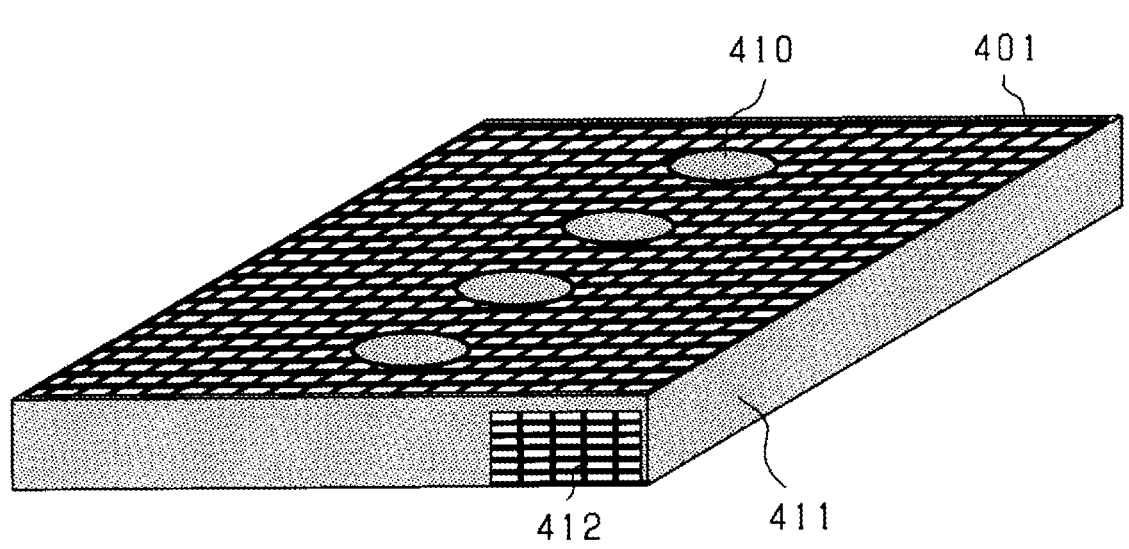
FIG. 26 is a perspective view of a configuration of the shield member in another example.

According to the above-described eighth embodiment, as shown in FIG. 26, a protective plate 410 that covers directly above the explosion-proof valve 301 may be provided in the bottom portion of the shield member 401 (the portion in which the circuit board 72 is set). As a result, even should the explosion-proof valve 301 open and gas be emitted, the damage to the circuit board 72 can be reliably prevented by the protective plate 410. A side surface of the shield member 401 may be configured by a side wall 411 that has no holes aside from in a portion in which a gas pipe is connected. In addition, a through hole 412 may be provided in the side wall 411 in a position that corresponds to a gas pipe (not shown). As a result, the gas that is emitted from the explosion-proof valve 301 can be guided to the gas pipe through the through hole 412.

Figure 37A:
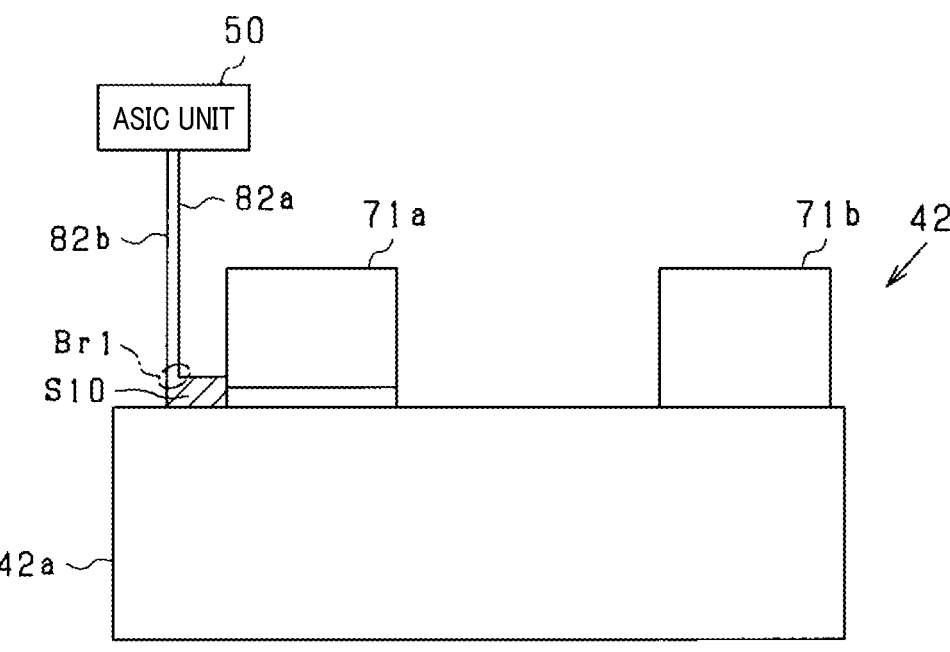
FIG. 37A and FIG. 37B are configuration diagrams illustrating the battery measurement apparatus in another example.
Figure 37B:
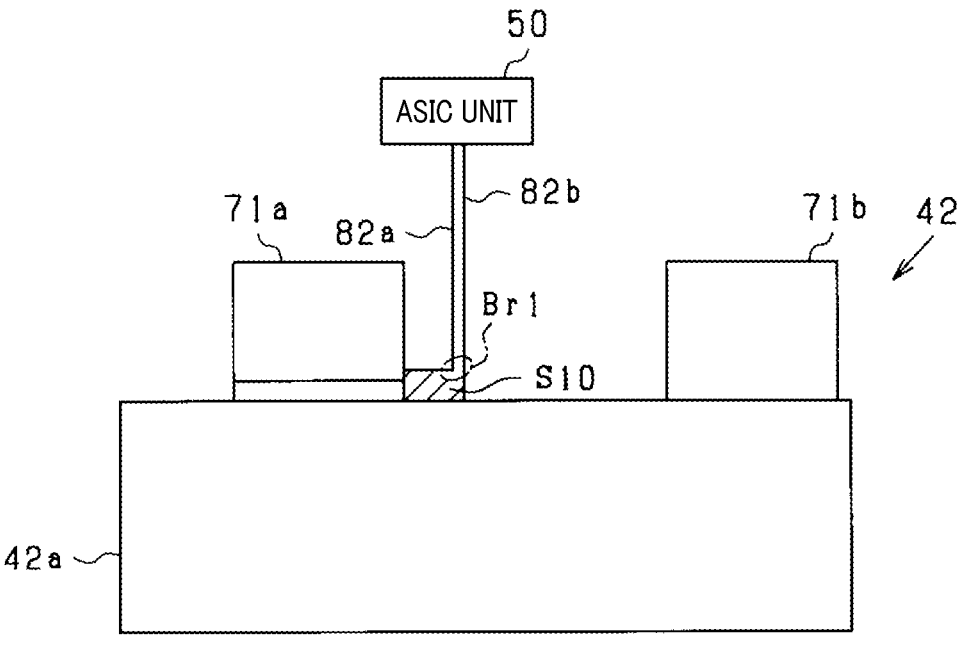

According to the above-described embodiments, the housing case 42a may be connected to the negative-electrode-side power supply terminal 71b. In this case, the negative-electrode-side power supply terminal 71b may not be formed in a protruding manner. In addition, the second-B electrical path 82b that serves as the negative-electrode-side detection line may be wired towards the housing case 42a from the branch points Br1, Br2, Br3, or Br21, and connected to the housing case 42a. Specifically, as shown in FIG. 37, the second-B electrical path 82b may be linearly wired towards the housing case 42a from the branch points Br1, Br2, Br3, or Br21. In this case, the positive-electrode-side power supply terminal 71a is insulated from the housing case 42a.

At this time, it goes without saying that the magnetic flux passage area S10 is set such that the induced electromotive force that is generated in the second electrical path 82 based on the alternating-current signal that flows to the first electrical path 81 is within the electromotive-force allowable value range that includes zero. In addition, as long as this condition is met, the branch points Br1, Br2, Br3, and Br21 may be set in arbitrary locations.

According to the above-described embodiments, as long as the magnetic flux passage area S10 is set such that the induced electromotive force that is generated in the second electrical path 82 based on the alternating-current signal that flows to the first electrical path 81 is within the electromotive-force allowable value range that includes zero, a size and a shape of an area of the branch point Br 1 of the second electrical path 82 may be arbitrarily modified.

For example, according to the first embodiment, the branch point Br1 of the second electrical path 82 may be arranged on a side opposite the housing case 42a from the tip end positions of the positive-electrode-side power supply terminal 71a and the negative-electrode-side power supply terminal 71b in the protruding direction of the power supply terminals 71. That is, the branch point Br1 may be farther from the housing case 42a than the tip end positions of the positive-electrode-side power supply terminal 71a and the negative-electrode-side power supply terminal 71b are.

In addition, the branch point Br1 of the second electrical path 82 may not be arranged between the positive-electrodeside power supply terminal 71*a* and the negative-electrode-side power supply terminal 71*b* in an opposing direction (left/right direction in FIG. 5) of the positive-electrode-side power supply terminal 71*a* and the negative-electrode-side power supply terminal 71*b*. That is, the branch point Br1 may be arranged on the outer side of the battery cell 42 (housing case 42*a*) in the left/right direction. In a similar manner, the branching portion Br1 of the second electrical path 82 may be arranged on the outer side of the battery cell 42 (housing case 42*a*) in a thickness direction (lateral direction) of the housing case 42*a*.

According to the above-described embodiments, the magnetic flux passage area S10 is an area that is surrounded by the second electrical path 82, the power supply terminals 71, and the housing case 42*a*, but corresponds to an area that is surrounded by the second electrical path 82 and the battery cell 42. The magnetic flux passage area S10 may be an area that is surrounded by the positive electrode and the negative electrode of the battery cell 42, an electrode group that is housed in the housing case 42*a*, and the second electrical path 82.

According to the above-described embodiments, the size and the shape of the magnetic flux passage area S10 may be arbitrarily modified as long as an error between the actual complex impedance of the battery cell 42 and the complex impedance that is calculated by the microcomputer unit 53 is within a range of ±1 mΩ.

Here, a more preferable range will be described. FIG. 27 shows a relationship between a battery capacity (Ah) of the battery cell 42 and a required impedance value measurement accuracy. The required impedance value measurement accuracy refers to accuracy that is required to determine a zero-cross point. Here, as shown in FIG. 27A to FIG. 27D, the required impedance value measurement accuracy clearly changes depending on a battery temperature (° C.) of the battery cell 42. Therefore, with reference to FIG. 27, when the battery capacity is from 25 to 800 Ah and the battery temperature is from −10° C. to 65° C., the size of the magnetic flux passage area S10 may be arbitrarily modified as long as the error between the actual complex impedance of the battery cell 42 and the complex impedance that is calculated by the microcomputer unit 53 is set to be within a range of ±170 μΩ.

Here, the actual complex impedance of the battery cell 42 is a value that is calculated when the magnetic flux passage area S10 takes a value that is zero or as close to zero as possible, or a value that is obtained by an error that is based on the magnetic flux passage area S10 (an effect of the induced electromotive force based on wiring shape) being quantified by a predetermined numeric expression and corrected. In addition, a four-terminal method or a four-terminal-pair method may be used. Furthermore, the error in the complex impedance may refer to an error in any of the absolute value, the real part, and the imaginary part of complex impedance.

First Modification

Next, a first modification in which a portion of the configurations according to the above-described embodiments is modified will be described. Hereafter, sections among the embodiments and modifications that are identical or equivalent are given the same reference numbers. Descriptions of sections having the same reference numbers are applicable therebetween. In addition, in this modification, as a basic configuration, the basic configuration according to the first embodiment will be described as an example.

Figure 28A:
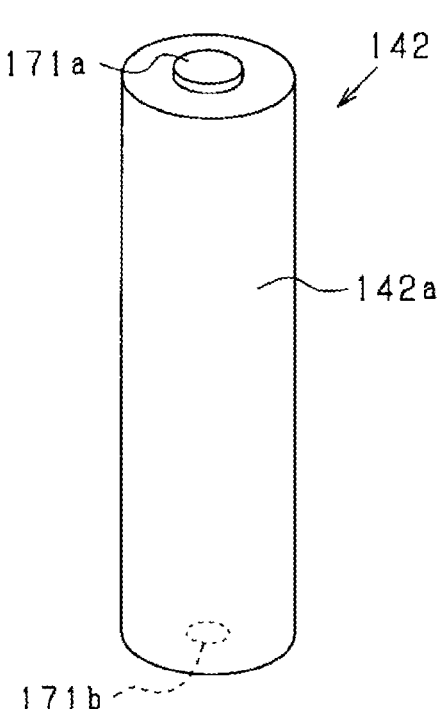
FIG. 28A is a perspective view of the battery cell in a first modification and FIG. 28B is a perspective view of the assembled battery in the first modification.

In a power supply system of the first modification, in a manner similar to that according to the first embodiment, the motor 20 that serves as a rotating electric machine, the inverter 30 that serves as a power converter that supplies a three-phase current to the motor 20, an assembled battery 140 that is capable of being charged and discharged, the battery measurement apparatus 50 that measures a state of the assembled battery 140, and the electronic control unit (ECU) 60 that controls the motor 20 and the like are included As shown in FIG. 28, the assembled battery 140 in the first modification is configured by a plurality of battery cells 142 being connected in series. As shown in FIG. 28A, the battery cell 142, and more specifically a housing case 142*a* thereof, is formed into a narrow, elongated circular cylindrical shape. In the battery cell 142, a positive-electrode-side power supply terminal 171*a* is provided in one end portion (upper surface in FIG. 28) in the longitudinal direction (axial direction) and a negative-electrode-side power supply terminal 171*b* is provided in the other end portion (lower surface in FIG. 28). That is, the battery cell 142 according to the present embodiment is configured such that a circular columnar wound body or the like that is configured by an electrode group 142*b* being wound is housed in the housing case 142*a*, in a manner similar to a nickel-hydrogen battery or a nickel-cadmium battery. The positive-electrode-side power supply terminal 171*a* protrudes in the axial direction from the housing case 142*a*.

Figure 28B:
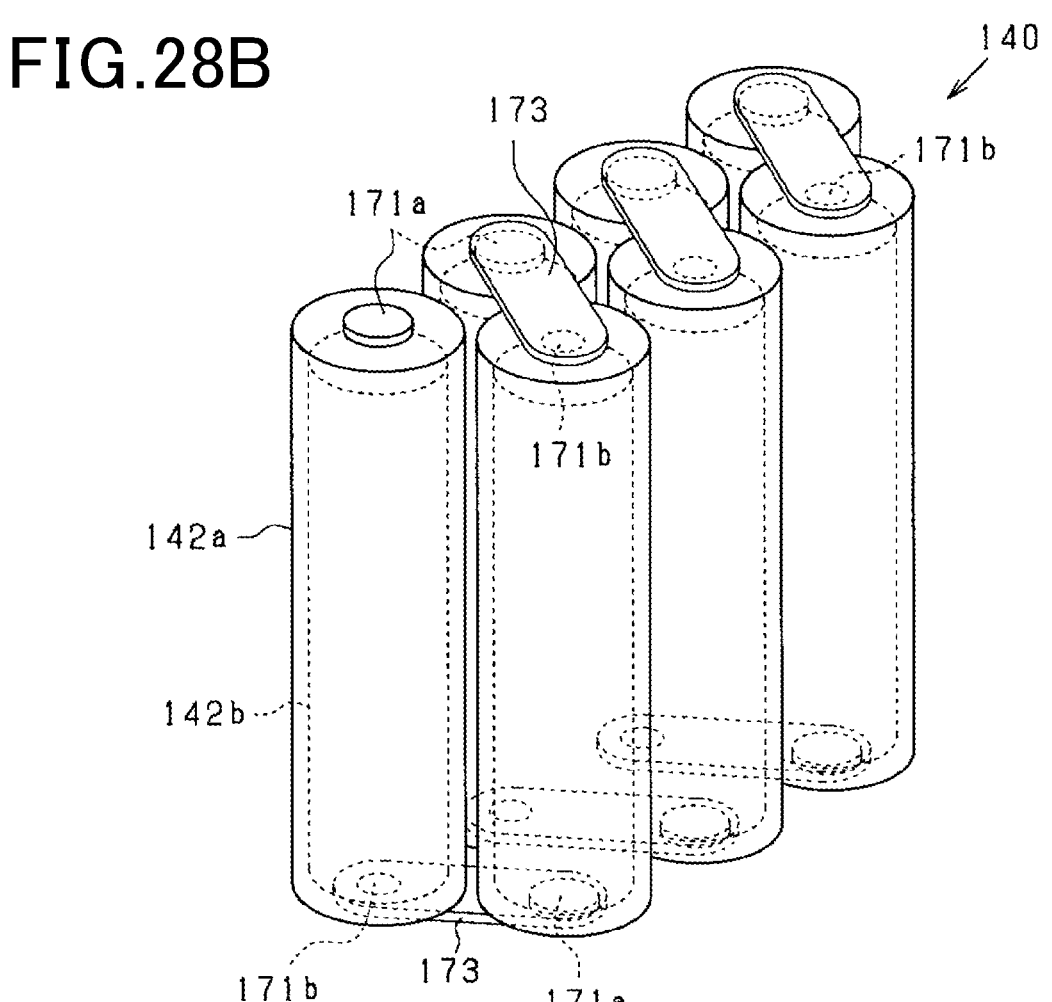

In addition, as shown in FIG. 28B, the battery cells 142 are arranged so as to be arrayed in a single row or a plurality of rows. In the first modification, the battery cells 142 are arrayed in two rows. At this time, the positive-electrode-side power supply terminals 171*a* and the negative-electrode-side power supply terminals 171*b* are arranged so as to alternate between adjacent front and back rows. Here, in FIG. 28B, the positive-electrode-side power supply terminals 171*a* in a first row (a row of four battery cells 142 on a back side) are arranged on an upper side in the drawing. The positive-electrode-side power supply terminals 171*a* in a second row (a row of three battery cells 142 on a front side) are arranged on a lower side in the drawing.

Here, in FIG. 28B, placement is vertical such that the longitudinal direction (axial direction) is in the up/down direction. However, the arrangement method is arbitrary, and horizontal placement such that a horizontal plane and the long direction are parallel is also possible.

Furthermore, as shown in FIG. 28B, the positive-electrode-side power supply terminal 171*a* of the battery cell 142 is connected to the negative-electrode-side power supply terminal 171*b* of the battery cell 142 in the adjacent row by a bus bar 173 such that the battery cells 142 are connected in series. In addition, the negative-electrode-side power supply terminal 171*b* of the battery cell 142 is connected to the positive-electrode-side power supply terminal 171*a* of the battery cell 142 in the adjacent row by the bus bar 173. The bus bar 173 is composed of a conductive material and is formed into a thin plate shape that has a length that is sufficient to reach the adjacent power supply terminal 171.

Furthermore, in a manner similar to the above-described embodiments, the battery cells 142 are to be measured by the battery measurement apparatus 50. That is, the second-A electrical path 82*a* that serves as the positive-electrode-side detection line of the ASIC unit 50*a* is connected to the positive-electrode-side power supply terminal 171*a* of each battery cell 142 and the second-B electrical path 82*b* that serves as the negative-electrode-side detection line of the ASIC unit 50*a* is connected to the negative-electrode-side power supply terminal 171*b*. In addition, the first electrical path 81 is connected to each of the positive-electrode-side power supply terminal 171*a* and the negative-electrode-side power supply terminal 171*b* of the battery cell 142. More specifically, a first-A electrical path 81*a* of the first electrical path 81 that serves as a positive-electrode-side modulation line is connected to the positive-electrode-side power supply terminal 171*a* of each battery cell 142, and a first-B electrical path 81*b* of the first electrical path 81 that serves as a negative-electrode-side modulation line is connected to the negative-electrode-side power supply terminal 171*b*. Here, the first electrical path 81 is connected to the current modulation circuit 56.

Here, as shown in FIG. 28, the battery cell 142 is structurally required to have the positive electrode and the negative electrode (that is, the positive-electrode-side power supply terminal 171*a* and the negative-electrode-side power supply terminal 171*b*) be provided so as to be separated from each other. Therefore, in a manner similar to that according to the first embodiment, the second-A electrical path 82*a* and the second-B electrical path 82*b* are required to be branched midway. Therefore, in the first modification as well, a magnetic flux passage area S110 that is surrounded by the battery cell 142 and the second electrical path 82 is formed. More specifically, the magnetic flux passage area S110 that is surrounded by the housing case 142*a*, the second electrical path 82, the positive-electrode-side power supply terminal 171*a*, and the negative-electrode-side power supply terminal 171*b* is formed.

Figure 29:
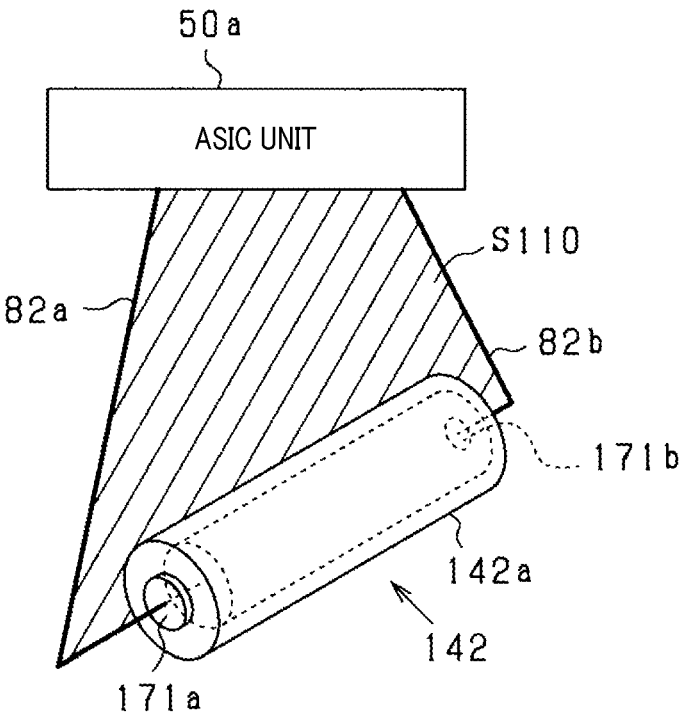
FIG. 29 is a perspective view schematically illustrating a connection mode of the battery measurement apparatus in a comparison example.

At this time, when wiring is performed as shown in FIG. 29, the magnetic flux passage area S110 becomes large and, for a reason similar to that according to the first embodiment, measurement error of the impedance may increase. Therefore, in the first modification as well, the size of the magnetic flux passage area S110 is preferably minimized. More specifically, the size of the magnetic flux passage area S10 is preferably set such that the error between the actual complex impedance of the battery cell 142 and the complex impedance that is calculated by the microcomputer unit 53 is within a range of ±1 mΩ. In the first modification, when the battery capacity is from 25 to 800 Ah and the battery temperature is from −10° C. to 65° C., the size of the magnetic flux passage area S110 is set such that the error between the actual complex impedance of the battery cell 142 and the complex impedance that is calculated by the microcomputer unit 53 is set to be within a range of ±170 μΩ to calculate the zero-cross point.

Here, the actual complex impedance of the battery cell 142 is a value that is calculated when the magnetic flux passage area S110 takes a value that is zero or as close to zero as possible, or a value that is obtained by an error that is based on the magnetic flux passage area S110 (an effect of the induced electromotive force based on wiring shape) being quantified by a predetermined numeric expression and corrected. In addition, the four-terminal method or the four-terminal-pair method may be used. Furthermore, the error in the complex impedance refers to an error in any of the absolute value, the real part, and the imaginary part of the complex impedance.

Furthermore, in the first modification as well, the size of the magnetic flux passage area S110 is set such that the induced electromotive force that is generated in the second electrical path 82 based on the alternating-current signal I that flows to the first electrical path 81 is within the electromotive-force allowable value range that includes zero. That is, the size of the magnetic flux passage area S110 and relative positions of the first electrical path 81 and the magnetic flux passage area S110 are set such that the induced electromotive force is within the electromotive-force allowable value range.

Figure 30:
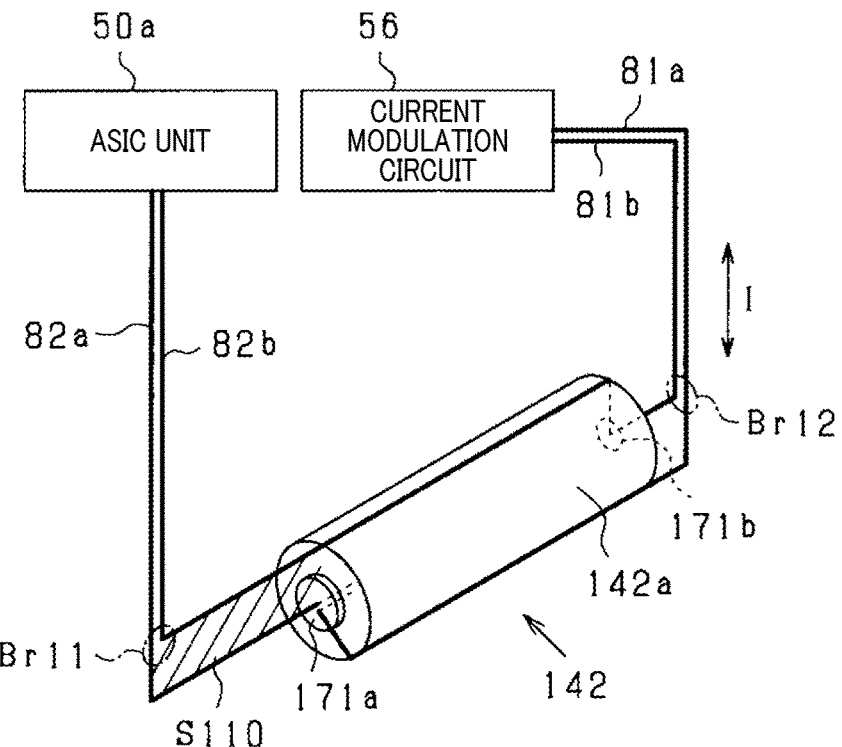
FIG. 30 is a perspective view schematically illustrating a connection mode of the battery measurement apparatus in the first modification.

At this time, in the first modification, wiring is performed as shown in FIG. 30. As shown in FIG. 30, the second-A electrical path 82*a* and the second-B electrical path 82*b* that are connected to the ASIC unit 50*a* are wired along each other to a branch point Br11 that is determined in advance. That is, the second-A electrical path 82*a* and the second-B electrical path 82*b* are wired in parallel so as to have as little a gap as possible. Here, as long as the second-A electrical path 82*a* and the second-B electrical path 82*b* are wired to follow each other, any manner of wiring is possible. In addition, the second-A electrical path 82*a* and the second-B electrical path 82*b* may be wired so as to be twisted together once or a plurality of times from the ASIC unit 50*a* to the branch point Br11.

A position of the branch point Br11 is arranged further towards the outer side than a tip end of the positive-electrode-side power supply terminal 171*a* in the longitudinal direction of the battery cell 142 is. In addition, while the second-A electrical path 82*a* is wired from the branch point Br11 towards the positive-electrode-side power supply terminal 171*a*, the second-B electrical path 82*b* is wired from the branch point Br11 towards the negative-electrode-side power supply terminal 171*b*.

More specifically, the second-A electrical path 82*a* linearly extends from the branch point Br11 to directly above the positive-electrode-side power supply terminal 171*a* in the longitudinal direction and then bends so as to extend towards the positive-electrode-side power supply terminal 171*a* along the longitudinal direction.

Meanwhile, the second-B electrical path 82*b* is formed so as to extend in the longitudinal direction along the outer circumferential surface of the housing case 142*a* from the branch point Br11, bend in an end portion of the battery cell 142 (an end portion on the negative-electrode-side power supply terminal 171*b* side), and be connected to the negative-electrode-side power supply terminal 171*b*. The second-B electrical path 82*b* is preferably wired so as to come into contact with the housing case 142*a*. Here, it goes without saying that the second-B electrical path 82*b* and the housing case 142*a* are insulated.

In addition, the first-A electrical path 81*a* and the first-B electrical path 81*b* that are connected to the current modulation circuit 56 are wired to follow each other to a branch point Br12 that serves as a modulation line branch point that is determined in advance. That is, the first-A electrical path 81*a* and the first-B electrical path 81*b* are wired in parallel so as to have as little a gap as possible. Here, as long as the first-A electrical path 81*a* and the first-B electrical path 81*b* are wired along each other, any manner of wiring is possible.

A position of the branch point Br12 is arranged further towards the outer side than the negative-electrode-side power supply terminal 171*b* (an end portion on the negative-electrode-side power supply terminal 171*b* side of the battery cell 142) in the longitudinal direction of the battery cell 142 is. In addition, while the first-A electrical path 81*a* is wired from the branch point Br12 towards the positive-electrode-side power supply terminal 171*a*, the first-B electrical path 81*b* is wired from the branch point Br12 towards the negative-electrode-side power supply terminal 171*b*.

More specifically, the first-A electrical path 81*a* is formed so as to extend in the longitudinal direction along the outer circumferential surface of the housing case 142*a* from the branch point Br12, bend in the end portion of the battery cell 142, and be connected to the positive-electrode-side power supply terminal 171*a*. Here, it goes without saying that the first-A electrical path 81*a* and the housing case 142*a* are insulated. The first-B electrical path 81*b* is bent so as to extend along the longitudinal direction from the branch point Br12 to the negative-electrode-side power supply terminal 171*b*.

Here, the wiring of the first electrical path 81 and the second electrical path 82 is fixed. That is, the size of the magnetic flux passage area S110 and the relative positions of the first electrical path 81 and the magnetic flux passage area S10 are set (fixed) such that the error between the actual complex impedance of the battery cell 142 and the complex impedance that is calculated by the microcomputer unit 53 is within a range of ±1 mΩ (more preferably ±170 μΩ).

Here, in the first modification, a distance between the branch point Br11 and the tip end of the positive-electrode-side power supply terminal 171*a* can be arbitrarily set as long as the error between the actual complex impedance of the battery cell 142 and the complex impedance that is calculated by the microcomputer unit 53 is set to be within a range of ±1 mΩ (more preferably ±170 μΩ).

In addition, a distance between the branch point Br12 and the tip end of the negative-electrode-side power supply terminal 171*b* can be arbitrarily set as long as the error between the actual complex impedance of the battery cell 142 and the complex impedance that is calculated by the microcomputer unit 53 is set to be within a range of ±1 mΩ (more preferably ±170 μΩ).

As a result of the first modification, following effects can be achieved.

The size of the magnetic flux passage area S110 is set such that the error between the actual complex impedance of the battery cell 142 and the complex impedance that is calculated by the microcomputer unit 53 is within a range of ±1 mΩ. In the first modification, when the battery capacity is from 25 to 800 Ah and the battery temperature is from −10° C. to 65° C., the size of the magnetic flux passage area S110 is set such that the error between the actual complex impedance of the battery cell 142 and the complex impedance that is calculated by the microcomputer unit 53 is set to be within a range of ±170 μΩ. Consequently, measurement error of the complex impedance can be suppressed.

In addition, the branch point Br11 of the second electrical path 82 is arranged further towards the outer side than the tip end of the positive-electrode-side power supply terminal 171*a* in the longitudinal direction is. In addition, while the second-A electrical path 82*a* is wired from the branch point Br11 towards the positive-electrode-side power supply terminal 171*a*, the second-B electrical path 82*b* is wired from the branch point Br11 towards the negative-electrode-side power supply terminal 171*b*. More specifically, the second-A electrical path 82*a* linearly extends from the branch point Br11 to directly above the positive-electrode-side power supply terminal 171*a* in the longitudinal direction, and then bends so as to extend to the positive-electrode-side power supply terminal 171*a* along the longitudinal direction. Meanwhile, the second-B electrical path 82*b* is formed so as to extend in the longitudinal direction along the outer circumferential surface of the housing case 142*a* from the branch point Br11, bend in the end portion of the battery cell 142 (the end portion on the negative-electrode-side power supply terminal 171*b* side), and be connected to the negative-electrode-side power supply terminal 171*b*. Consequently, the size of the magnetic flux passage area S110 can be easily set as described above.

Furthermore, the position of the branch point Br12 of the first electrical path 81 is arranged further towards the outer side than the negative-electrode-side power supply terminal 171*b* (the end portion on the negative-electrode-side power supply terminal 171*b* side of the battery cell 142) in the longitudinal direction of the battery cell 142 is. That is, the branch point Br12 is arranged on a side opposite the branch point Br11. As a result, a distance between the modulation line through which the alternating-current signal I flows and the magnetic flux passage area S110 can be increased. Consequently, induced electromagnetic force can be reduced and measurement error can be suppressed.

Moreover, from the ASIC unit 50*a* to the branch point Br11, the second-A electrical path 82*a* and the second-B electrical path 82*b* are wired to follow each other so as to have as little a gap as possible. Consequently, measurement error of the complex impedance can be suppressed. Here, as a result of the second-A electrical path 82*a* and the second-B electrical path 82*b* being twisted once or a plurality of times from the ASIC unit 50*a* to the branch point Br11, errors can be further reduced.

Second Modification

Figure 31:
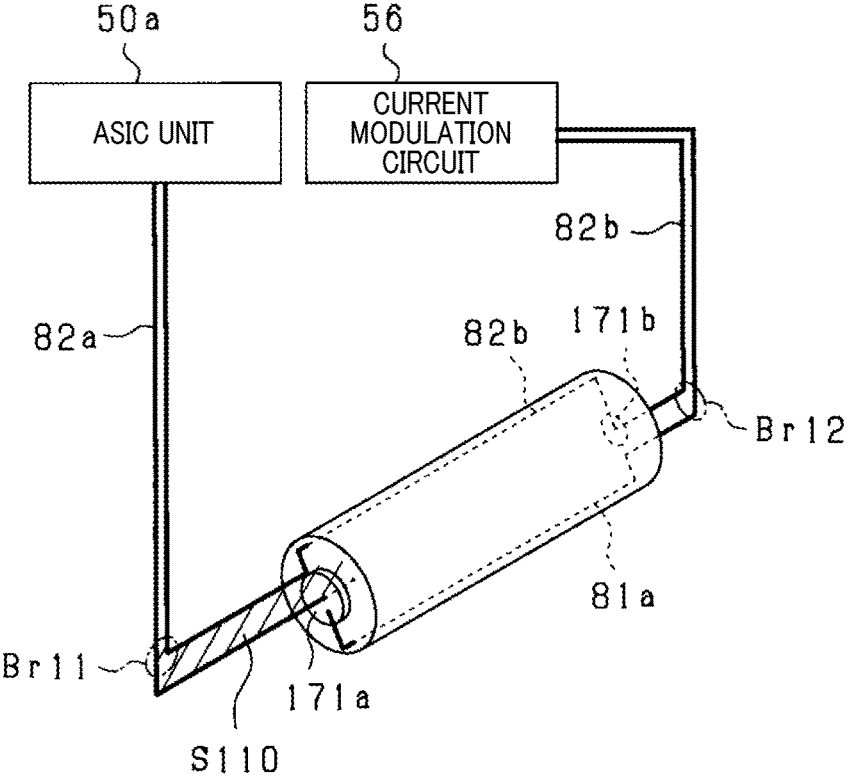
FIG. 31 is a perspective view schematically illustrating a connection mode of the battery measurement apparatus in a second modification.

As shown in FIG. 31, a portion of the configuration of the above-described first modification may be modified in a following manner. That is, as indicated by a broken line in FIG. 31, the second-B electrical path 81*b* is formed so as to pass through an inner side of the housing case 142*a* from the branch point Br11 and extend from an end portion to an end portion of the housing case 142*a* in the longitudinal direction. In addition, the second-B electrical path 82*b* bends in the end portion of the battery cell 142 (the end portion on the negative-electrode-side power supply terminal 171*b* side) and is connected to the negative-electrode-side power supply terminal 171*b*. Here, it goes without saying that the second-B electrical path 82*b* is covered by an insulating film or the like and insulated from the housing case 142*a* and the like.

In a similar manner, as indicated by the broken line in FIG. 31, the first-A electrical path 81*a* is formed so as to pass through the inner side of the housing case 142*a* from the branch point Br12 and extend from the end portion to the end portion of the housing case 142*a* in the longitudinal direction. In addition, the first-A electrical path 81*a* bends in the end portion of the battery cell 142 (the end portion on the positive-electrode-side power supply terminal 171*a* side) and is connected to the positive-electrode-side power supply terminal 171*a*. Here, it goes without saying that the first-A electrical path 81*a* is covered by an insulating film or the like and insulated from the housing case 142*a* and the like.

Consequently, the magnetic flux passage area S110 that is surrounded by the battery cell 142 and the second electrical path 82 can be easily decreased. In addition, a portion of the wiring is wired inside the housing case 142*a*. Therefore, the wiring becoming an obstruction can be suppressed.

Third Modification

Figure 32:
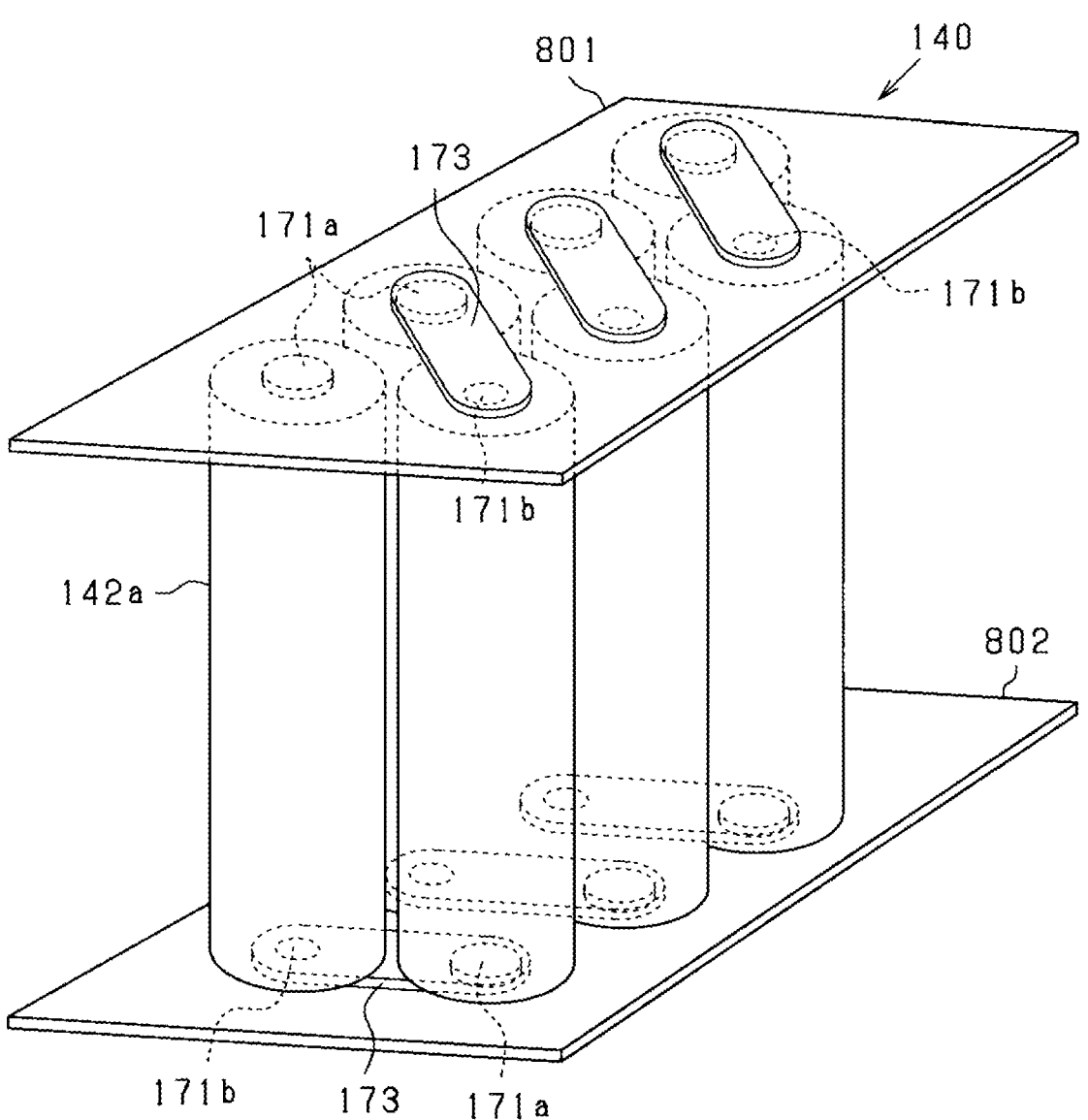
FIG. 32 is a perspective view schematically illustrating the assembled battery and the circuit board in a third modification.

As shown in FIG. 32 to FIG. 35, a portion of the configuration of the above-described first modification may be modified in a following manner. That is, circuit boards 801 and 802 are respectively arranged on both ends in the longitudinal direction of the assembled battery 140. The circuit board 801 is arranged so as to be in contact with an upper surface of the battery cell 142 as shown in FIG. 32. Specifically, the circuit board 801 is arranged such that the positive-electrode-side power supply terminals 171*a* of the battery cells 142 in the first row (the row with four battery cells 142) come into contact with the circuit board 801. In addition, as shown in FIG. 33A and FIG. 34A, the positive-electrode-side power supply terminals 171*a* of the battery cells 142 in the first row are connected to the second-A electrical path 82*a* that is wired on the circuit board 801. Here, FIG. 34A is a plan view of a portion of the circuit board 801. FIG. 34B is a side view of a portion of the battery cells 142 in the first row.

Figure 33A:
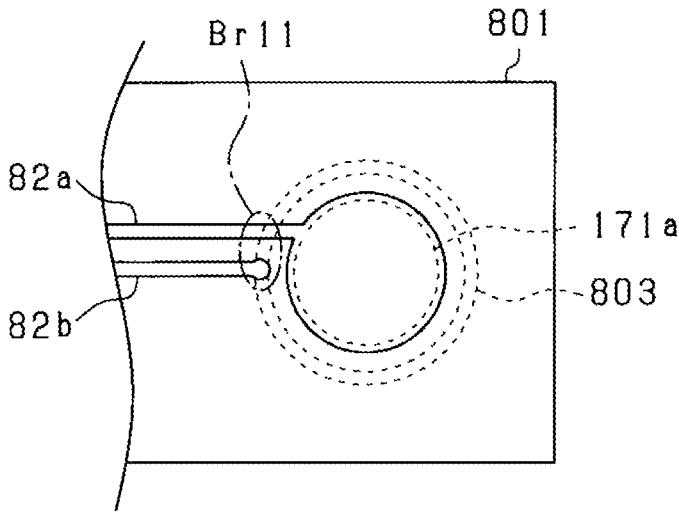
FIG. 33A is a plan view of a portion of the circuit board in the third modification and FIG. 33B is a side view of the battery cell and the circuit board in the third modification.
Figure 33B:
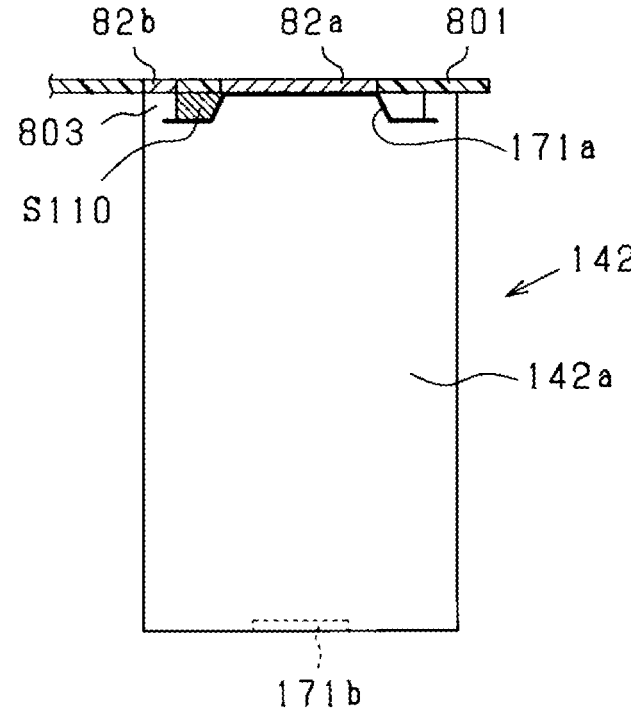

Here, as shown in FIG. 33B, the housing case 142*a* is formed such that an outer edge protrudes in the longitudinal direction (that is, the protruding direction of the positive-electrode-side power supply terminal 171*a*) in the end portion on the positive-electrode-side power supply terminal 171*a* side of the battery cell 142. That is, as shown in FIG. 33A, in the housing case 142*a*, a protruding portion 803 is formed in a circular annular shape so as to surround the positive-electrode-side power supply terminal 171*a*. That is, in the longitudinal direction, the protruding portion 803 that is the end portion on the positive-electrode-side power supply terminal 171*a* side of the housing case 142*a* is formed to be in about the same position (height) as the tip end of the positive-electrode-side power supply terminal 171*a*. Here, the housing case 142*a* and the positive-electrode-side power supply terminal 171*a* are insulated by an insulating member. The protruding portion 803 is formed so as to protrude to the same extent as the positive-electrode-side power supply terminal 171*a* and comes into contact with the circuit board 801.

Furthermore, the housing case 142*a* is connected to (integrated with, in this modification) the negative-electrode-side power supply terminal 171*b*. As shown in FIG. 33B and FIG. 34B, the protruding portion 803 is in contact with the circuit board 801 and the second-B electrical path 82*b* that is wired on the circuit board 801 is connected to the negative-electrode-side power supply terminal 171*b* with the protruding portion 803 and the housing case 142*a* therebetween.

In addition, the circuit board 801 is arranged so as to come into contact with an upper surface side in the longitudinal direction of the battery cells 142 in the second row (the row with three battery cells 142) that are arranged on the front side. At this time, the negative-electrode-side power supply terminals 171*b* of the battery cells 142 in the second row are in contact with the circuit board 801.

Meanwhile, as shown in FIG. 32, the circuit board 802 is arranged so as to come into contact with a lower surface of the battery cell 142. The configuration of the circuit board 802 is similar to that of the circuit board 801. Therefore, a detailed description is omitted. Here, FIG. 34C is a side view of the battery cells 142 in the second row. FIG. 34D is a plan view of a portion of the circuit board 802.

The ASIC unit 50*a* (not shown) is arranged on the circuit boards 801 and 802. As shown in FIG. 33A, FIG. 34A, and FIG. 34D, the second-A electrical path 82*a* and the second-B electrical path 82*b* are wired to follow each other from the ASIC unit 50*a* to the branch point Br11. That is, the second-A electrical path 82*a* and the second-B electrical path 82*b* are wired in parallel so as to have as little a gap as possible. Here, the second-A electrical path 82*a* and the second-B electrical path 82*b* may be wired to intersect each other and be twisted once or a plurality of times from the ASIC unit 50*a* to the branch point Br11.

In addition, as a result of the second-B electrical path 82*b* being connected to the protruding portion 803 directly above the protruding portion 803, wiring is completed. Meanwhile, the second-A electrical path 82*a* continues straight ahead and is connected to the positive-electrode-side power supply terminal 171*a* directly above the positive-electrode-side power supply terminal 171*a*. The wiring is thereby completed.

As a result, as shown in FIG. 33A, FIG. 34A, and FIG. 34D, the branch point Br11 in the third modification is near a terminal end (a connection portion with the protruding portion 803) of the second-B electrical path 82*b*. Therefore, the magnetic flux passage area S110 that is surrounded by the battery cell 142 and the second electrical path 82 is as shown in FIG. 33B. The magnetic flux passage area S110 is set such that the error between the actual complex impedance of the battery cell 142 and the complex impedance that is calculated by the microcomputer unit 53 is within a range of ±1 m$\Omega$ (more preferably ±170 $\mu\Omega$).

Here, in a manner similar to that in the first modification, the branch point Br11 is arranged further towards the outer side than the tip end of the positive-electrode-side power supply terminal 171*a* in the longitudinal direction is. In addition, the second-A electrical path 82*a* is wired from the branch point Br11 towards the positive-electrode-side power supply terminal 171*a*.

Figure 35A:
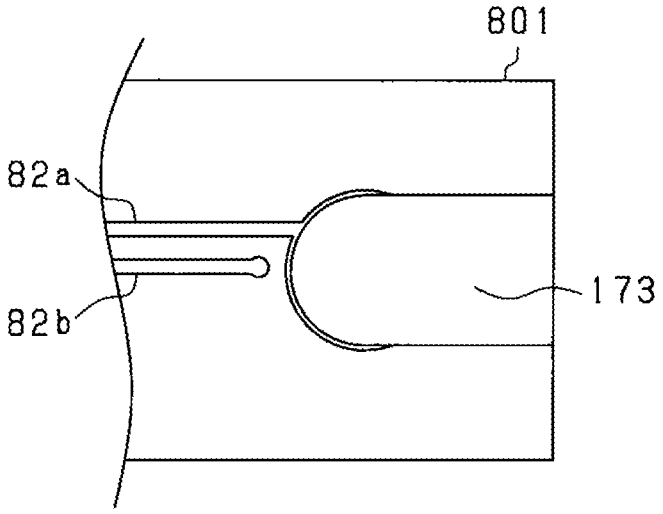
FIG. 35A is a plan view of a bus bar in the third modification and FIG. 35B is a side view of bus bars in the third modification.
Figure 35B:
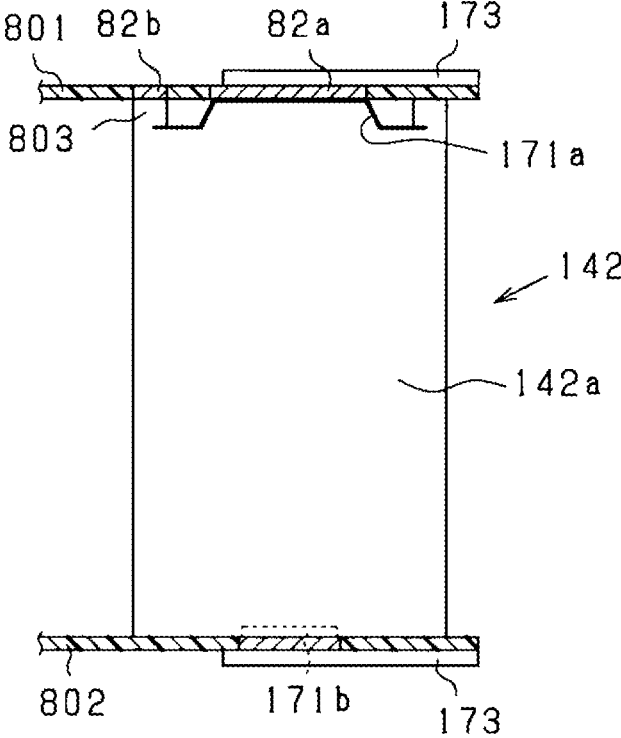

Furthermore, as shown in FIG. 32 and FIG. 35, the bus bar 173 connects the positive-electrode-side power supply terminal 171*a* and the negative-electrode-side power supply terminal 171*b* of adjacent rows with the circuit board 801 or 802 therebetween to connect the battery cells 142 in series. The bus bars 173 are arranged on the circuit boards 801 and 802 on the sides opposite the battery cells 142. Here, the bus bars 173 may be wired to the circuit boards 801 and 802. In addition, although not shown, the first electrical path 81 may also be similarly wired to the circuit boards 801 and 802.

As a result of the third modification, because the second electrical path 82 is wired to the circuit boards 801 and 802, the magnetic flux passage area S110 that is surrounded by the second electrical path 82 and the battery cells 142 can be more easily set to a fixed area. Consequently, errors in impedance can be suppressed, as designed.

In addition, when the first electrical path 81 is wired to the circuit boards 801 and 802, a positional relationship between the modulation line through which the alternating-current signal I flows and the magnetic flux passage area S110 can be fixed. Consequently, errors in impedance can be suppressed, as designed. Furthermore, wiring and assembly can be easily performed as a result of wiring to the circuit boards 801 and 802.

Figure 36A:
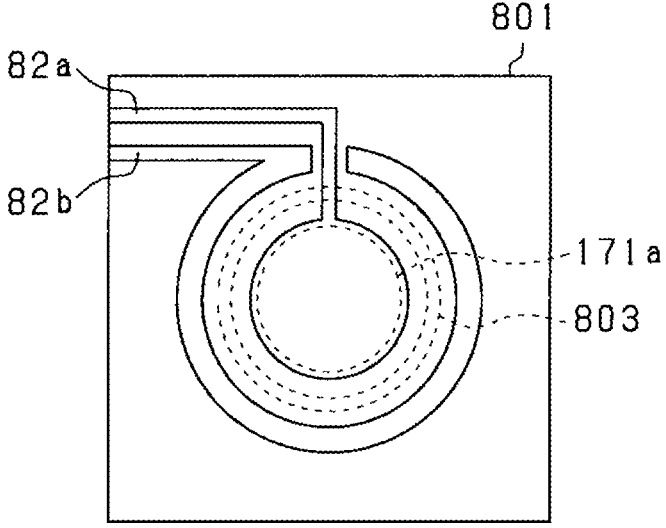
FIG. 36A is a plan view of a portion of the circuit board in another example of the third modification and FIG. 36B is a plan view of the bus bar in the other example of the third modification.
Figure 36B:
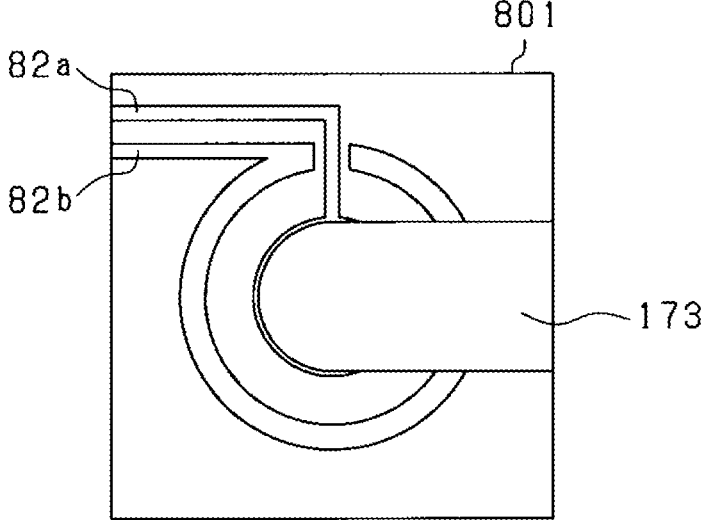

Here, in the third modification, a wiring pattern of the second electrical path 82 may be arbitrarily modified. For example, as shown in FIG. 36A, a wiring pattern of a circular annular second-B electrical path 82*b* may be provided along the protruding portion 803. As a result, connection between the second-B electrical path 82*b* and the protruding portion 803 is facilitated. At this time, the bus bar 173 may be provided as shown in FIG. 36B.

Other Examples of the Modifications

In the above-described first to third modifications, the positive electrode and the negative electrode of the battery cell 142 may be interchanged. In this case, in the second modification, a portion of the second-A electrical path 82*a* is wired inside the housing case 142*a*.

In the above-described first and second modifications, the negative electrode may be connected to the housing case 142*a*, and the second-B electrical path 82*b* may be connected to the negative electrode of the battery cell 42 with the housing case 142*a* therebetween.

In the above-described first to third modifications, the first embodiment serves as the basic configuration. However, any of the above-described second to tenth embodiments or other embodiments may serve as the basic configuration. That is, the above-described embodiments and the above-described modifications may be combined.

According to the above-described embodiments and in the modifications, the magnetic-flux allowable value range may be arbitrarily set taking into consideration the calculation accuracy that is required for measurement, the magnitudes of the response signal and the noise signal, and the like. In addition, the electromotive-force allowable value range may be arbitrarily set taking into consideration the calculation accuracy that is required for measurement, the magnitudes of the response signal and the noise signal, and the like. For example, the electromotive-force allowable value range may be within a range of 200 V with zero at the center.

In the above-described modifications, the positive-electrode-side power supply terminal 171a may not be protruding. In this case, the positive-electrode-side power supply terminal 171a is insulated from the housing case 142a. In addition, in the third modification, when the battery cell 142 in which the positive-electrode-side power supply terminal 171a is not protruding is used, the end portion on the positive-electrode-side power supply terminal 171a side of the housing case 142a may be formed so as to be in a position that is about the same as the positive-electrode-side power supply terminal in the longitudinal direction. As a result, the circuit boards 801 and 802 can be arranged so as to come into contact with the positive-electrode-side power supply terminal 171a and the positive-electrode-side power supply terminal side of the housing case 142a.

According to the above-described embodiments and in the modifications, the battery measurement apparatus 50 may measure the impedance of the battery cells 42 or 142 that are connected in parallel (battery module). That is, a plurality of battery cells 42 or 142 may collectively form a single unit (battery module) by parallel connection to increase battery capacity. In this case, for impedance measurement of the overall battery module that is a single unit that is connected in parallel, as the ranges for the battery capacity and the numeric value of the impedance error, the ranges described in the present disclosure are applied to the single unit (battery module). That is, the magnetic flux passage area S10 or S110 may be set such that the error in the impedance of the overall battery module that is a single unit that is connected in parallel is within a range of ±1 mΩ. In addition, when the battery capacity of the battery module that is a single unit that is connected in parallel is from 25 to 800 Ah and the battery temperature is from −10° C. to 65° C., the magnetic flux passage area S10 or S110 is more preferably set such that the error in impedance is within a range of ±170 μΩ.

In a similar manner, the battery measurement apparatus 50 may measure the impedance of the battery cells 42 or 142 that are connected in series (battery module). That is, a plurality of battery cells 42 or 142 may collectively form a single unit (battery module) by serial connection. In this case, when impedance measurement of the overall battery module that is a single unit that is connected in series is performed, the range related to battery capacity is applied to each of the battery cells 42 or 142 that are connected in series, and the range of the numeric value of the impedance error is applied by being integrated by the number of battery cells 42 or 142 that are connected in series.

For example, when a battery module in which five battery cells 42 or 142 are connected in series is considered to be a single unit and the impedance is measured, when the battery capacity of each of the battery cells 42 or 142 that configure the battery module is from 25 to 800 Ah, the magnetic flux passage area S10 or S110 is preferably set such that the error in impedance is within a range of ±170 μΩ×5=±850 μΩ.

Here, in the case of serial connection, a single battery cell 42 or 142 that configures the battery module may be replaced by a plurality of battery cells 42 or 142 that are connected in parallel.

The disclosure of the present specification is not limited to the embodiments given as examples. The disclosure includes the embodiments given as examples, as well as modifications by a person skilled in the art based on the embodiments. For example, the disclosure is not limited to the combinations of components and/or elements described according to the embodiments. The disclosure can be carried out using various combinations. The disclosure may have additional sections that can be added to the embodiments. The disclosure includes that in which a component and/or element according to an embodiment has been omitted. The disclosure includes replacements and combinations of components and/or elements between one embodiment and another embodiment. The technical scope that is disclosed is not limited to the descriptions according to the embodiments. Several technical scopes that are disclosed are cited in the scope of claims. Furthermore, the technical scopes should be understood to include all modifications within the meaning and scope of equivalency of the scope of claims.

The control unit and the method thereof described in the present disclosure may be actualized by a dedicated computer that is provided so as to be configured by a processor and a memory, the processor being programmed to provide one or a plurality of functions that are realized by a computer program. Alternatively, the control unit and the method thereof described in the present disclosure may be actualized by a dedicated computer that is provided by a processor being configured by a single dedicated hardware logic circuit or more. Still alternatively, the control unit and the method thereof described in the present disclosure may be actualized by a single dedicated computer or more. The dedicated computer may be configured by a combination of a processor that is programmed to provide one or a plurality of functions, a memory, and a processor that is configured by a single hardware logic circuit or more. In addition, the computer program may be stored in a non-transitory computer-readable storage medium that can be read by a computer as instructions performed by the computer.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

What is claimed is:

1. A battery measurement apparatus that measures a state of a storage battery that includes an electrolyte, a plurality of electrodes, and a housing case that houses the electrolyte and the plurality of electrodes, the battery measurement apparatus comprising:

a circuit configured to act as a signal control unit that is provided on a first electrical path that connects a positive-electrode-side power supply terminal and a negative-electrode-side power supply terminal of the storage battery, and causes the storage battery to output a predetermined alternating-current signal or inputs a predetermined alternating-current signal to the storage battery;

a response signal input unit having a voltage input terminal and a response signal input terminal, the response signal unit provided on a second electrical path that connects between the positive-electrode-side power supply terminal and the negative-electrode-side power supply terminal, and inputs a response signal of the storage battery in response to the alternating-current signal through the second electrical path; and a microcomputer configured to act as a calculating unit that calculates information related to a complex impedance of the storage battery based on the response signal, wherein a magnetic flux passage area that is an area surrounded by the housing case, the second electrical path, the positive-electrode-side power supply terminal, and the negative-electrode-side power supply terminal and through which a magnetic flux that is based on the alternating-current signal that flows to the first electrical path passes is formed, a size of the magnetic flux passage area is set such that induced electromotive force that is generated in the second electrical path based on the alternating-current signal that flows to the first electrical path is within an electromotive-force allowable value range that includes zero, a circuit board that fixes the first electrical path and the second electrical path is provided, the circuit board is fixed with respect to the storage battery, the second electrical path has a positive-electrode-side detection line that connects the positive-electrode-side power supply terminal and the response signal input unit, and a negative-electrode-side detection line that connects the negative-electrode-side power supply terminal and the response signal input unit;

the positive-electrode-side detection line is wired along the negative-electrode-side detection line up to a branch point that is determined in advance;

the branch point is provided in a position that is between the positive-electrode-side power supply terminal and the negative-electrode-side power supply terminal, and comes into contact with the housing case;

the positive-electrode-side detection line is wired along an outer circumferential surface of the housing case from the branch point towards the positive-electrode-side power supply terminal, and the negative-electrode-side detection line is wired along the outer circumferential surface of the housing case from the branch point towards the negative-electrode-side power supply terminal.

2. The battery measurement apparatus according to claim 1, wherein:

the second electrical path has a positive-electrode-side detection line that connects the positive-electrode-side power supply terminal and the response signal input unit, and a negative-electrode-side detection line that connects the negative-electrode-side power supply terminal and the response signal input unit;

the positive-electrode-side detection line is wired along the negative-electrode-side detection line up to a branch point that is determined in advance, and the positive-electrode-side detection line is wired so as to branch from the negative-electrode-side detection line at the branch point;

the positive-electrode-side detection line is wired so as to intersect the negative-electrode-side detection line once or a plurality of times from the branch point to the positive-electrode-side power supply terminal;

the magnetic flux passage area includes a first area that is surrounded by the positive-electrode-side detection line that is arranged further towards a side of the positive-electrode-side power supply terminal than the negative-electrode-side detection line is and the negative-electrode-side detection line that is arranged further towards a side of the negative-electrode-side power supply terminal than the positive-electrode-side detection line is, and a second area that is surrounded by the positive-electrode-side detection line that is arranged further towards the side of the negative-electrode-side power supply terminal than the negative-electrode-side detection line is and the negative-electrode-side detection line that is arranged further towards the side of the positive-electrode-side power supply terminal than the positive-electrode-side detection line is, and a size of the second area is set based on a size of the first area such that a difference between a first magnetic flux that is based on an alternating-current signal that passes through the first area and a second magnetic flux that is based on an alternating-current signal that passes through the second area is within a magnetic-flux allowable value range that includes zero.

3. The battery measurement apparatus according to claim 1, wherein:

a first magnetic shield that covers at least a portion of the first electrical path is provided.

4. The battery measurement apparatus according to claim 1, wherein:

a second magnetic shield that covers at least a portion of the magnetic flux passage area is provided.

5. The battery measurement apparatus according to claim 1, wherein:

a plate-shaped circuit board to which the first electrical path and the second electrical path are wired is provided;

the positive-electrode-side power supply terminal and the negative-electrode-side power supply terminal protrude in a same direction from the housing case; and the circuit board is arranged between the positive-electrode-side power supply terminal and the negative-electrode-side power supply terminal of the storage battery, further towards a side of the housing case than tip ends of the positive-electrode-side power supply terminal and the negative-electrode-side power supply terminal are.

6. The battery measurement apparatus according to claim 5, wherein:

a magnetic shield that covers at least a portion of the magnetic flux passage area of the circuit board is provided between the circuit board and the housing case.

7. The battery measurement apparatus according to claim 5, wherein:

the circuit board has a first board on which the signal control unit is set, and a second board on which the response signal input unit and the calculating unit are set;

the storage battery is formed into a flattened, rectangular parallelopiped shape, and the positive-electrode-side power supply terminal and the negative-electrode-side power supply terminal are provided on a same plane;

the first board is arranged between the positive-electrode-side power supply terminal and the negative-electrode-side power supply terminal so as to oppose a set-up surface of the positive-electrode-side power supply terminal and the negative-electrode-side power supply terminal; and the second board is arranged so as to be surrounded by the shield member, oppose a side surface of the storage battery, and be perpendicular in relation to the first board.

8. The battery measurement apparatus according to claim 5, wherein:

the storage battery is provided with an explosion-proof valve; and circuit elements and the electrical paths are provided so as to avoid an area of the circuit board that opposes the explosion-proof valve, in a state in which the circuit board is arranged in a predetermined position in relation to the storage battery.

9. The battery measurement apparatus according to claim 1, wherein:

the housing case is connected to the negative-electrode-side power supply terminal; and the positive-electrode-side detection line is wired from the branch point towards the positive-electrode-side power supply terminal, and the negative-electrode-side detection line is wired from the branch point towards the housing case and connected to the housing case.

10. The battery measurement apparatus according to claim 1, wherein:

the storage battery is formed into a circular columnar shape, a positive-electrode-side power supply terminal of the storage battery is provided in one end portion in a longitudinal direction of the storage battery and a negative-electrode-side power supply terminal of the storage battery is provided in the other end portion;

the second electrical path has a positive-electrode-side detection line that connects the positive-electrode-side power supply terminal and the response signal input unit, and a negative-electrode-side detection line that connects the negative-electrode-side power supply terminal and the response signal input unit;

the positive-electrode-side detection line and the negative-electrode-side detection line are wired to follow each other from the response signal input unit to a branch point that is determined in advance;

at least either of the positive-electrode-side detection line and the negative-electrode-side detection line is wired from the branch point towards the positive-electrode-side power supply terminal or the negative-electrode-side power supply terminal; and a position of the branch point is arranged further towards an outer side than a tip end of the positive-electrode-side power supply terminal is or the negative-electrode-side power supply terminal in the longitudinal direction of the storage battery is.

11. The battery measurement apparatus according to claim 10, wherein:

at least either of the positive-electrode-side detection line and the negative-electrode-side detection line is wired from the branch point towards the positive-electrode-side power supply terminal of the storage battery or the negative-electrode-side power supply terminal of the storage battery, and the other is wired so as to extend in the longitudinal direction along an outer circumferential surface of the housing case from the branch point.

12. The battery measurement apparatus according to claim 10, wherein:

at least either detection line of the positive-electrode-side detection line and the negative-electrode-side detection line is wired from the branch point towards the positive-electrode-side power supply terminal or the negative-electrode-side power supply terminal, and the other detection line is wired so as to extend in the longitudinal direction from the branch point, and the other detection line passes through an inner portion of the housing case from an end portion to an end portion of the housing case in the longitudinal direction.

13. The battery measurement apparatus according to claim 10, wherein:

the housing case is connected to the negative-electrode-side power supply terminal; and the positive-electrode-side detection line is wired from the branch point towards the positive-electrode-side power supply terminal, and the negative-electrode-side detection line is wired from the branch point towards the housing case and connected to the housing case.

14. The battery measurement apparatus according to claim 13, wherein:

an end portion on the positive-electrode-side power supply terminal side of the housing case is formed in about a same position as the positive-electrode-side power supply terminal in the longitudinal direction;

the positive-electrode-side detection line and the negative-electrode-side detection line are wired on a circuit board;

the circuit board is arranged so as to come into contact with the positive-electrode-side power supply terminal and an end portion of the housing case on the positive-electrode-side power supply terminal side; and the negative-electrode-side detection line is connected to the end portion of the housing case.

15. The battery measurement apparatus according to claim 10, wherein:

the positive-electrode-side detection line and the negative-electrode-side detection line are twisted once or a plurality of times from the response signal input unit to a branch point that is determined in advance.

16. The battery measurement apparatus according to claim 10, wherein:

the first electrical path has a positive-electrode-side modulation line that is connects the positive-electrode-side power supply terminal and the signal control unit, and a negative-electrode-side modulation line that connects the negative-electrode-side power supply terminal and the signal control unit;

the positive-electrode-side modulation line and the negative-electrode-side modulation line are wired to follow each other from the signal control unit to a modulation line branch point that is determined in advance;

at least either of the positive-electrode-side modulation line and the negative-electrode-side modulation line is wired from the modulation line branch point to the positive-electrode-side power supply terminal or the negative-electrode-side power supply terminal; and the modulation line branch point is arranged on a side opposite the branch point of the positive-electrode-side detection line and the negative-electrode-side detection line in the longitudinal direction of the storage battery with the storage battery as a center.

* * * * *